(12) United States Patent
Ozawa et al.

(10) Patent No.: US 8,736,390 B2
(45) Date of Patent: May 27, 2014

(54) CRYSTAL OSCILLATION DEVICE AND SEMICONDUCTOR DEVICE

(75) Inventors: Osamu Ozawa, Kanagawa (JP); Masashi Horiguchi, Kanagawa (JP); Yuichi Okuda, Kanagawa (JP); Akihito Anzai, Kanagawa (JP)

(73) Assignee: Rensas Electronics Corporation, Kawasakishi (JP)

( * ) Notice: Subject to any disclaimer, the term of this patent is extended or adjusted under 35 U.S.C. 154(b) by 47 days.

(21) Appl. No.: 13/316,473

(22) Filed: Dec. 10, 2011

(65) Prior Publication Data

US 2012/0161889 A1 Jun. 28, 2012

(30) Foreign Application Priority Data

| Dec. 24, 2010 | (JP) | 2010-287421 |
| Feb. 17, 2011 | (JP) | 2011-31677 |
| Sep. 29, 2011 | (JP) | 2011-213865 |

(51) Int. Cl.
 *H03B 5/32* (2006.01)
(52) U.S. Cl.
 USPC .................. 331/158; 331/116 R; 331/108 D
(58) Field of Classification Search
 USPC ......... 331/116 R, 116 FE, 158, 108 D, 108 C
 See application file for complete search history.

(56) References Cited

U.S. PATENT DOCUMENTS 5,229,640 A * 7/1993 Pak ............................... 257/666

FOREIGN PATENT DOCUMENTS

| JP | 10-22734 A | 1/1998 |
| JP | 2001-274627 A | 10/2001 |
| JP | 2006-135739 A | 5/2006 |

OTHER PUBLICATIONS

STMicroelectronics, "AN2867 Application Note: Oscillator design guide for ST Microcontrollers", Rev.1, Jan. 20, 2009, pp. 1-20.*
Maxim, "Application Note 617: Real-Time-Clock Selection and Optimization", Jun. 1, 2001, pp. 1-7.*
NXP Semiconductors, "AN10897: A guide to designing for ESD and EMC", Rev.2, Jan. 19, 2010, pp. 1-30.*

* cited by examiner

*Primary Examiner* — Ryan Johnson
(74) *Attorney, Agent, or Firm* — Miles & Stockbridge P.C.

(57) ABSTRACT

A wiring pattern for oscillation input signal and a wiring pattern for oscillation output signal are provided on a printed circuit board, and a wiring pattern for ground power source voltage is arranged in a region therebetween. A quartz crystal unit is connected between the wiring pattern for oscillation input signal and the wiring pattern for oscillation output signal and one ends of capacitors serving as load capacitors thereof are connected to the wiring pattern for ground power source voltage. Further, a wiring pattern for VSS is arranged so as to enclose these wiring patterns, and a wiring pattern for VSS is arranged also in a lower layer in addition thereto. By this means, reduction of a parasitic capacitance between an XIN node and an XOUT node, improvement in noise tolerance of these nodes and others can be achieved.

14 Claims, 49 Drawing Sheets

CRYSTAL OSCILLATION DEVICE AND SEMICONDUCTOR DEVICE

CROSS-REFERENCE TO RELATED APPLICATIONS

The present application claims priority from Japanese Patent Application No. 2010-287421 filed on Dec. 24, 2010, Japanese Patent Application No. 2011-31677 filed on Feb. 17, 2011 and Japanese Patent Application No. 2011-213865 filed on Sep. 29, 2011, the contents of which are hereby incorporated by reference into this application.

TECHNICAL FIELD

The present invention relates to a crystal oscillation device and a semiconductor device connected to a crystal oscillator, and in particular to a technique effectively applied to a crystal oscillation device for a low frequency typified by 32 kHz and a semiconductor device connected to a crystal oscillator.

BACKGROUND

For example, Japanese Unexamined Patent Application Publication No. 2001-274627 (Patent Document 1) discloses a configuration in which, in order to achieve low power consumption, a current flowing in an inverter circuit in a crystal oscillation circuit is controlled by current sources inserted on a power source voltage side and a ground power source voltage side of the inverter circuit, respectively. Further, Japanese Unexamined Patent Application Publication No. 2006-135739 (Patent Document 2) discloses a configuration in which a variable capacitor is applied to a load capacitor and further a power source voltage of an inverter circuit is set to be variable via a voltage conversion circuit, thereby expanding a variable range of an oscillation frequency in a crystal oscillation circuit. Furthermore, Japanese Unexamined Patent Application Publication No. 10-22734 (Patent Document 3) discloses a configuration in which, in a crystal oscillator including a load capacitor, a quartz crystal unit and others mounted on a multilayer board, an inner layer portion facing a mounting region of the load capacitor, the quartz crystal unit and others is made hollow. By this means, influence of an electrostatic capacitance between patterns or the like is significantly reduced, and it is possible to prevent an oscillation frequency or the like from being largely deviated from a design value.

SUMMARY

For example, various electric equipments typified by a micro-computer (MC) are generally mounted with a crystal oscillation device for realizing a clock function. Since the crystal oscillation device is in many cases operated by a battery such as an electric cell, reduction in power consumption is required in addition to high accuracy. In order to achieve low power consumption in the crystal oscillation device, it is effective to use a low CL value-adapted quartz crystal unit which is adapted to a small load capacitance value (CL value). FIG. 30 is a circuit diagram showing a configuration example of a general crystal oscillation device. FIG. 31 is a schematic diagram showing an arrangement example of an oscillation circuit section examined as the premise of the present invention.

A crystal oscillation device shown in FIG. 30 is made up of a semiconductor package PKGx and a quartz crystal unit XTAL, capacitors Cd and Cg, a resistor Rd for restriction and others which are external components attached to the semiconductor package PKGx. The resistor Rd may be omitted. An oscillation circuit section OSCBK including an inverter circuit (inverting logical circuit or negative resistance generating circuit) IV and a high-resistance feedback resistor Rf connected between an input (XIN) and an output (XOUT) thereof is formed on a semiconductor chip in PKGx. XTAL is connected between XIN and XOUT, Cg is connected between XIN and a ground power source voltage GND, and Cd is connected between XOUT and GND. With such a configuration, an oscillation signal having an oscillation frequency of, for example, 32 kHz is generated at XOUT.

Further, as shown in FIG. 31, for example, the oscillation circuit section OSCBK in the semiconductor package PKGx is arranged in the vicinity of power source terminals (VCC, VSS) of PKGx so as not to cause a difference between GND (VSS) in OSCBK and GND of the above-described external component. In low-end microcomputers used in the so-called white goods, only a pair of power sources (VCC and VSS) is provided in many cases because it has a small number of external terminals. In such a case, the power source pair is disposed at the center of a side in order to minimize voltage drop IR_Drop due to wiring resistance. As a result, OSCBK is also disposed near the center of the side.

Here, the above-described load capacitance value (CL value) means an equivalent capacitance value viewed from the quartz crystal unit XTAL. In the case shown in FIG. 30, when various parasitic capacitances are disregarded, the CL value corresponds to a capacitance value of series connection of Cg and Cd. The CL value of a generally-widespread quartz crystal unit is 12.5 pF (referred to as "standard CL value") or the like, and in this case, Cd and Cg which have a value of 10 to 20 pF obtained by adding an actual parasitic capacitance are used. On the other hand, in recent years, XTAL adapted to a low CL value of 3 to 7 pF has been developed, and in this case, Cd and Cg which have a value of 2 to 8 pF are required. When such XTAL adapted to low CL value is used, charging/discharging current to Cd, Cg and the like can be reduced in a state where an oscillation margin is sufficiently secured, and therefore, the reduction in power consumption can be achieved. On the other hand, however, it has been found from comparison with the case of using the standard CL value that sufficient attention should be paid in view of (1) a parasitic capacitance of a chip or a printed circuit board, (2) noise tolerance, and the like.

First of all, regarding the item (1) a parasitic capacitance of a chip or a printed circuit board, for example, when the parasitic capacitance becomes large, load capacitors (Cd, Cg) having capacitance value reduced correspondingly are required, and there is a possibility that an external load capacitor having such a small capacitance value cannot be actually obtained. Especially, in the low-end microcomputer described in FIG. 31 or the like, since the number of external terminals is small and the degree of freedom of signal allocation thereto is low, a parasitic capacitance between external terminals may result in a problem. Further, as the CL value becomes lower, the frequency sensitivity when the capacitance value fluctuates becomes higher. Therefore, there is a possibility that malfunction occurs in oscillation operation due to the variation in the parasitic capacitance. Incidentally, when the standard CL value is used, even if a parasitic capacitance of, for example, about 1 to 3 pF exists, the parasitic capacitance can be sufficiently compensated by adjusting the values of Cd and Cg, and even if accuracy of each capacitance value is slightly low, a large problem does not occur because the frequency sensitivity is low.

Next, regarding the item (2) noise tolerance, since a current for performing charging/discharging of the load capacitors (Cd, Cg) becomes low with the reduction in power consumption, the whole crystal oscillation device becomes more sensitive to noise. Further, measures of EMC (Electromagnetic Compatibility) in the external terminals (XIN, XOUT) shown in FIG. 30 becomes more important. Furthermore, regarding the power source noise, as described in FIG. 31, particularly when only one power source pair is provided, there is a possibility that fluctuation of the power source inside the chip or on the printed circuit board influences the oscillation circuit section OSCBK nearby. Therefore, it is desirable to take sufficient measures against noise by optimization of, for example, terminal arrangement, a printed circuit board pattern, layout in a chip, and others.

FIG. 32 is a schematic diagram showing a layout configuration example of a printed circuit board in the crystal oscillation device examined as the premise of the present invention. In FIG. 32, a semiconductor package PKGx, a quartz crystal unit XTAL, capacitors Cg and Cd, and a resistor Rd are mounted on a printed circuit board PCBx, and they are properly connected on PCBx. PKGx is provided with a plurality of external terminals PN including ones for an oscillation input signal XIN, ones for an oscillation output signal XOUT, ones for a ground power source voltage VSS, and ones for predetermined signals XX. Here, PN(XIN) and PN(XOUT) are arranged adjacent to each other. PN(XIN) is connected to a wiring pattern LN_XIN on PCBx, and PN(XOUT) is connected to a wiring pattern LN_XOUT on PCBx via Rd. LN_XIN and LN_XOUT extend at a distance so that they do not impart noise to each other. Further, a wiring pattern LN_XX from PN(XX) adjacent to PN(XIN) extends toward a direction perpendicular to the extending direction of the LN_XIN so that it does not run in parallel with LN_XIN as far as possible.

XTAL is connected between LN_XIN and LN_XOUT, one end of Cg is connected to LN_XIN, and one end of Cd is connected to LN_XOUT. PN(VSS) is connected to a wiring pattern LN_VSS1a on PCBx, and LN_VSS1a is arranged in an approximately-loop shape so as to enclose a formation region or a mounting region of the above-described XTAL, Cg, Cd, LN_XIN and LN_XOUT. However, a terminal end of LN_VSS1a is put in an opened state so as not to form a loop completely. The other ends of Cg and Cd are connected to this LN_VSS1a, respectively. By using such a loop-shaped LN_VSS1a, it becomes possible to suppress the transmission of noise between the region of the above-described XTAL, Cg, Cd, LN_XIN and LN_XOUT and the outside thereof. Further, a lower layer (intermediate layer) portion positioned below the region is hollow. This is especially in order to reduce a parasitic capacitance between LN_XIN, LN_XOUT and the lower layer (intermediate layer) or the like.

In the layout configuration example shown in FIG. 32, a certain amount of attention is paid in view of the above-described parasitic capacitance and noise. However, especially when a low CL value-adapted quartz crystal unit is used, it cannot be said that the layout configuration example shown in FIG. 32 is sufficient, and it has been found that further ingenuity is required. The present invention has been made in view of these circumstances, and one of the objects thereof is to provide a crystal oscillation device in which a quartz crystal unit adapted to a low load capacitance value can be sufficiently applied.

Further, the inventors of the present invention have conducted a study from a viewpoint of a circuit in addition to the viewpoint of the above-described layout. FIG. 50 is a circuit diagram showing a configuration example of a general crystal oscillation device. The crystal oscillation device shown in FIG. 50 is made up of a semiconductor package PKGx, a quartz crystal unit XTAL, capacitors Cd and Cg, and a resistor Rd for restriction which are external components of the semiconductor package, and others. Rd may be omitted. An oscillation circuit section OSCBK including an inverter circuit (inverting logical circuit or negative resistance generating circuit) IVo and a feedback resistor Rf with high resistance (for example, 10 MΩ) connected between an input (XIN) and an output (XOUT) of the inverter circuit IVo is formed on a semiconductor chip in PKGx. XTAL is connected between XIN and XOUT, Cg is connected between XIN and a ground power source voltage GND, and Cd is connected between XOUT and GND, respectively. With the configuration like this, an oscillation signal having a frequency of, for example, 32 kHz is generated at XOUT.

The crystal oscillation device like this is in many cases operated by a battery such as an electric cell, and it is especially required to reduce power consumption. In order to achieve low power consumption in the crystal oscillation device, it is beneficial to use a quartz crystal unit XTAL having a small load capacitance value (CL value). The CL value means an equivalent capacitance value viewed from XTAL, and it corresponds to a capacitance value of series connection of Cg and Cd in the example shown in FIG. 50. In general, XTAL adapted to a CL value of, for example, 12.5 pF (which is referred to as "standard CL value") is widely used, but in recent years, XTAL adapted to a CL value of, for example, 3 to 7 pF (which is referred to as "low CL value") has been developed, and it is beneficial to use such a low CL value-adapted XTAL. However, when low power consumption is to be achieved by using the low CL value-adapted XTAL like this, it has been found by the inventors of the present invention that the following cases (1) to (4) may occur.

(1) There is a possibility of being incapable of sufficiently adapting to a wide range of power source voltage (in particular, a low power source voltage). Since the crystal oscillation device is used in various electronic equipments, it is desirable that it can adapt to a wide range of power source voltage (for example, 1.62 V to 5.5 V). In particular, it is beneficial that the crystal oscillation device can adapt to a low power source voltage according to a trend of reduction in power consumption (namely, reduction in power source voltage) of the electric equipments. In such a circumstance, for example, when the technique disclosed in Patent Document 1 is used, the number of transistor stages connected in series between a power source voltage and a ground power source voltage in the inverter circuit IVo shown in FIG. 50 is increased, and there is a possibility of being incapable of adapting to a low power source voltage. Further, for example, when the technique disclosed in Patent Document 2 is used, increase of the number of transistor stages is concerned like the technique of Patent Document 1, and there may be a case where a voltage conversion circuit cannot adapt to a low power source voltage.

(2) There is a possibility that an oscillation start time increases. In order to achieve reduction in power consumption, it is beneficial to reduce consumption current in the inverter circuit IVo shown in FIG. 50. At the start of oscillation, after the external capacitors Cg and Cd (for example, 5 to 20 pF) are charged by output current of the inverter circuit IVo and a voltage is raised up to near an operating point (after voltages at both terminals of the quartz crystal unit XTAL become approximately equal to each other), fine oscillations due to noise grow to reach a stable oscillation operation.

Therefore, when a current in IVo is made small, there is a possibility that the oscillation start time becomes a large value such as, for example, 2 seconds or more.

(3) There is a possibility that the noise tolerance lowers. When an oscillation operation is being performed with a relatively large current like the conventional technique, a current for charging/discharging the external capacitors Cg and Cd is large and amplitude of an oscillation signal (amplitude in XOUT shown in FIG. 50) becomes amplitude approximately equal to a power source voltage level. However, when the oscillation operation is performed with a small current in order to reduce power to be consumed, a current for charging/discharging the external capacitors Cg and Cd becomes small, and amplitude of an oscillation signal (amplitude in XOUT shown in FIG. 50) may reach, for example, about 100 to 300 mV. Therefore, the crystal oscillation device is easily influenced by external noise, and degradation of noise tolerance significantly appears because the recovery from the influence is slow.

(4) There is a possibility that the options of the quartz crystal unit XTAL are limited, which results in impossibility of satisfying the various demands from a market (namely, lowering in versatility). When the crystal oscillation device of FIG. 50 is designed especially for a low CL value-adapted quartz crystal unit XTAL, it becomes difficult to apply a standard CL value-adapted XTAL to the crystal oscillation device. However, since the low CL value-adapted XTAL is higher in cost than the standard CL value-adapted XTAL, it is desirable that an option for selecting the low CL value-adapted XTAL or the standard CL value-adapted XTAL is provided to a user.

The present invention has been made in view of these circumstances, and an object thereof is to provide a crystal oscillation device which can contribute to the achievement of reduction in power consumption. The above and other objects and novel characteristics of the present invention will be apparent from the description of the present specification and the accompanying drawings.

The following is a brief description of an outline of the typical embodiment of the invention disclosed in the present application.

A crystal oscillation device according to the embodiment includes a semiconductor package and a quartz crystal unit mounted on a printed circuit board. The semiconductor package is provided with first and second external terminals for connection of the quartz crystal unit. A first wiring pattern extending from the first external terminal and connected to one end of the quartz crystal unit and a second wiring pattern extending from the second external terminal in approximately the same direction as the first wiring pattern and connected to the other end of the quartz crystal unit are formed on the printed circuit board. Here, a third wiring pattern arranged in a region between the first wiring pattern and the second wiring pattern and electrically connected to a ground power source voltage is further formed on the printed circuit board.

By using the configuration example described above, a parasitic capacitance between pins positioned between the first external terminal and the second external terminal can be reduced and coupling noise between the pins can be reduced. As a result, in a low load capacitance value-adapted quartz crystal unit in which reduction of a parasitic capacitance and improvement in noise tolerance are particularly demanded, the demand can be sufficiently satisfied.

Further, the crystal oscillation device according to the embodiment is configured such that, even if the above-described first external terminal and second external terminal are arranged adjacent to each other, a space is secured between a first pad for the first external terminal and a second pad for the second external terminal in the semiconductor chip in the semiconductor package and power source wirings are arranged between the first pad and the second pad. Also by this means, reduction of a parasitic capacitance between the pins and reduction of coupling noise therebetween can be achieved.

Further, a semiconductor device according to the embodiment is provided with a reference current generating circuit which generates a reference current, a current source to one end of which a power source voltage is supplied and which generates a first current by means of current mirror of the reference current, an oscillation MIS transistor which is supplied with the first current and serves as a source ground, and a comparator circuit block which has a drain (first node) of the oscillation MIS transistor as an input. Further, the semiconductor device is provided with a feedback resistor inserted between a gate (second node) and the drain (first node) of the oscillation MIS transistor. Outside the semiconductor device, capacitors are connected between the first node and a ground power source voltage node and between the second node and the ground power source voltage node, respectively, and the quartz crystal unit is connected between the first node and the second node. Here, the comparator circuit block makes determination whether a first oscillation signal with first amplitude generated at the first node is larger or smaller than a first comparison voltage serving as a reference to generate a second oscillation signal with second amplitude larger than the first amplitude.

By configuring the inverting logical circuit of the crystal oscillation section from a source-ground amplifying circuit made up of the current source and the oscillation MIS transistor in the above-described manner, it becomes possible to achieve particularly the reduction in power source voltage (in other words, reduction in power consumption) in the semiconductor device (crystal oscillation section). Further, by setting the first current to be small in accordance with the low load capacitance value (low CL value)-adapted quartz crystal unit and using the circuit topology for compensating for the reduction of the first amplitude due to the setting by the comparator circuit block, it is possible to achieve the reduction in power consumption of the semiconductor device (crystal oscillation section).

Further, in the above-described semiconductor device, the current source of the inverting logical circuit of the crystal oscillation section is configured as a variable current source which can variably set the current value of the first current to a first current value or a second current value in accordance with the CL value of the quartz crystal unit. By this means, the quartz crystal unit adapted to a low CL value and that adapted to a standard CL value can be given as the options of the quartz crystal unit selected by a user. At this time, it is desirable that the oscillation MIS transistor is operated in a sub-threshold region and the current value of the first current is set so that, when a value of "standard CL value/low CL value" is "M", a value of "second current value/first current value" is square of "M". By this means, since an oscillation margin can be kept constant regardless of the CL value, margin design becomes unnecessary and the current value of the first current can be set to be correspondingly smaller. Further, it is desirable that the current value of the first current is increased in proportion to a temperature by configuring the reference current generating circuit from a PTAT circuit or the like. Also by this means, since the oscillation margin is kept constant, the current value of the first current can be set to be correspondingly smaller.

Further, it is desirable that the above-described comparator circuit block is configured to generate the first comparison voltage by a replica circuit reflecting a circuit configuration of the inverting logical circuit of the crystal oscillation section. By this means, since PVT variation in the inverting logical circuit is reflected also on the first comparison voltage, the voltage level of the first comparison voltage can be set properly and the waveform quality (for example, duty characteristics) of the second oscillation signal can be improved.

The effects obtained by typical embodiments of the invention disclosed in the present application will be briefly described below. It is possible to realize a crystal oscillation device to which a low load capacitance value-adapted quartz crystal unit can be sufficiently applied. Further, it is possible to realize a crystal oscillation device which can contribute to the reduction in power consumption.

BRIEF DESCRIPTION OF THE DRAWINGS

FIG. 46A is a circuit diagram showing a detailed configuration example around a reference current generating circuit in the control circuit block shown in FIG. 34 and the like;

FIG. 46B is a circuit diagram showing another detailed configuration example around a reference current generating circuit in the control circuit block shown in FIG. 34 and the like;

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Further, circuit elements constituting respective function blocks of the embodiment are not specifically limited, but they are formed on a semiconductor substrate made of, for example, single crystal silicon by a well-known integrated-circuit technology for a CMOS (complementary MOS transistor) or the like. Incidentally, in the embodiment, a MOSFET (Metal Oxide Semiconductor Field Effect Transistor) (abbreviated as "MOS transistor") is used as one example of a MISFET (Metal Insulator Semiconductor Field Effect Transistor) (abbreviated as "MIS transistor"), but this does not exclude the use of a non-oxide film as a gate insulating film. In the figures, a p-channel MOS transistor (PMOS transistor) is distinguished from an n-channel MOS transistor (NMOS transistor) by providing an arrow symbol to a gate of the p-channel MOS transistor. The connection of the substrate potential of the MOS transistor is not specifically described in the figures, but a connecting method is not specifically limited as long as the MOS transistor is put in a normally operable state.

Hereinafter, embodiments of the present invention will be described in detail with reference to the accompanying drawings. Note that components having the same function are denoted by the same reference symbols throughout the drawings for describing the embodiments, and the repetitive description thereof will be omitted.

<<Representative Embodiment of Whole Crystal Oscillation Device [1A]>>

Figure 1A:
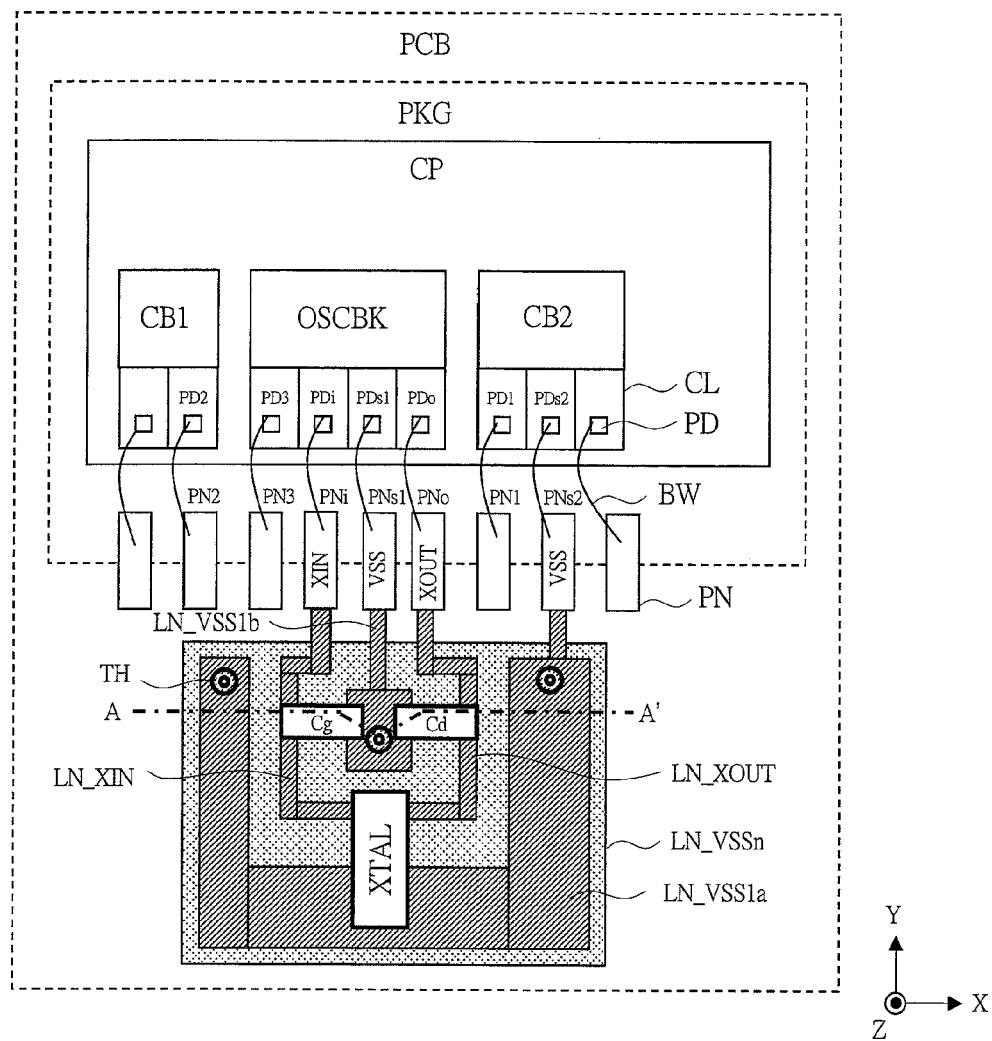
FIG. 1A is a plan view showing a schematic configuration example of a whole crystal oscillation device according to an embodiment of the present invention.
Figure 1B:
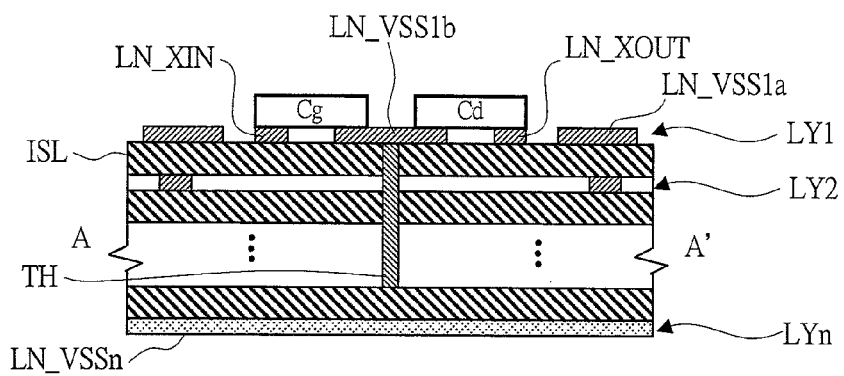
FIG. 1B is a sectional view of the configuration example of the crystal oscillation device taken along line A-A' in FIG. 1A.

FIG. 1 shows a schematic configuration example of a whole crystal oscillation device according to an embodiment of the present invention. FIG. 1A is a plan view of the crystal oscillation device and FIG. 1B is a sectional view of the crystal oscillation device taken along line A-A' in FIG. 1A. The crystal oscillation device shown in FIG. 1A is made up of a printed circuit board PCB, a semiconductor package PKG and various external components mounted on PCB, and various wiring patterns on PCB. PKG is provided with a semiconductor chip CP, a plurality of external terminals (external leads) PN including ones for an oscillation input signal XIN, ones for an oscillation output signal XOUT, and ones for a ground power source voltage VSS, and bonding wires BW for connecting CP and PN properly. Here, external terminals PN2 for a circuit block CB1, external terminals PN3, PNi, PNs1, and PNo for OSCBK, external terminals PN1 and PNs2 for a circuit block CB2 are sequentially arranged toward one direction (in an X-axis direction).

Figure 30:
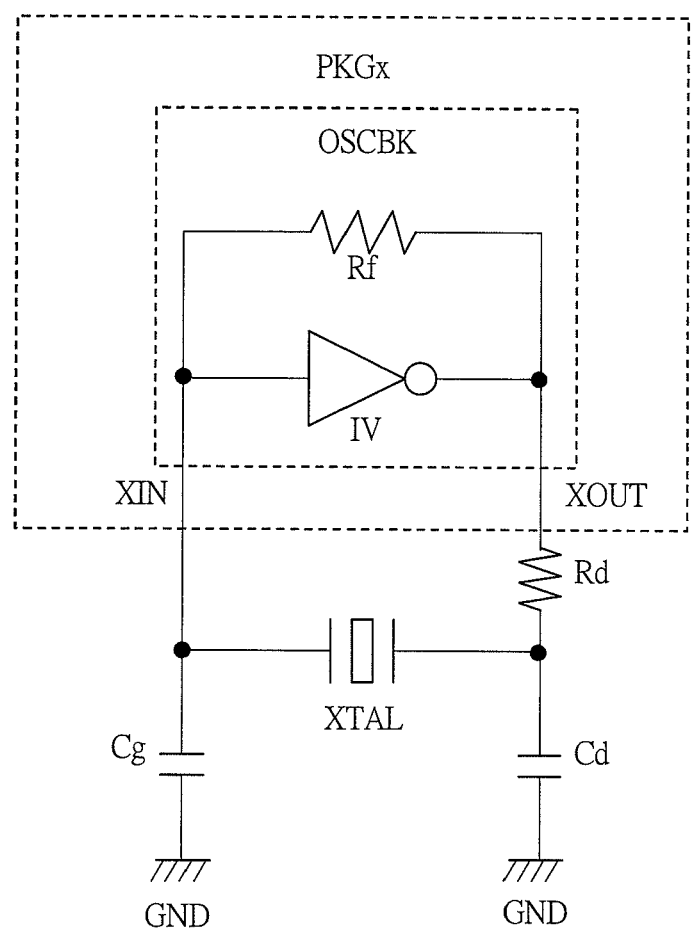
FIG. 30 is a circuit diagram showing a configuration example of a general crystal oscillation device.
Figure 31:
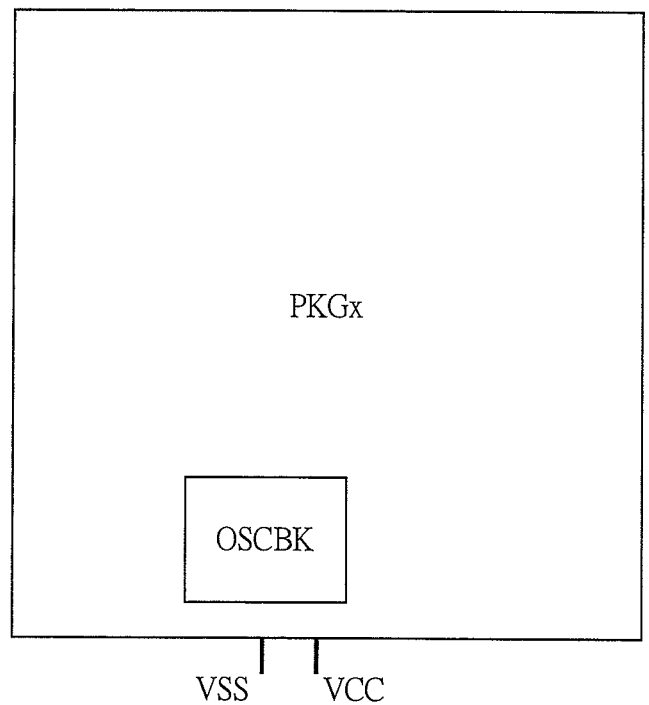
FIG. 31 is a schematic diagram showing an arrangement example of an oscillation circuit section examined as the premise of the present invention.

The semiconductor chip CP is provided with the oscillation circuit section OSCBK, circuit blocks CB1 and CB2, and a plurality of cells CL. The plurality of cells CL are sequentially arranged along one side of CP (in the X-axis direction). OSCBK is provided with an inverter circuit IV and a feedback resistor Rf like those shown in FIG. 30 and others, and four cells CL for OSCBK are arranged between OSCBK and one side of CP. In the four cells CL, a pad PD3, a pad PDi for XIN, a pad PDs1 for VSS, and a pad PDo for XOUT are arranged, respectively. PDi and PDo are connected to an input and an output of the inverter circuit IV as shown in FIG. 30, and PDs1 is connected to a ground power source voltage node of the IV. PD3, PDi, PDs1, and PDo are sequentially arranged along one side of CP1 at equal intervals, and they are connected to PN3, PNi, PNs1, and PNo via bonding wires BW, respectively. Incidentally, PD3 and PN3 are, for example, for power source voltage VCC and the like, but they may be omitted in some situations.

A plurality of (here, two or more) cells CL for CB2 are arranged between the circuit block CB2 and one side of the semiconductor chip CP. One of two cells CL includes a pad PD1, and the other thereof includes a pad PDs2 for VSS. PD1 and PDs2 are sequentially arranged along one side of CP (in the X-axis direction), and the above-described pad PDo for XOUT is arranged adjacent to PD1. However, respective cells CL are arranged so that a distance between PD1 and PDo is larger than a distance between PDs1 and PDo. PD1 and PDs2 are connected to PN1 and PNs2 via bonding wires BW, respectively. At least one cell CL for CB1 including the pad PD2 is arranged between the circuit block CB1 and one side of CP. The above-described PD3 for OSCBK is arranged adjacent to PD2. However, respective cells CL are arranged so that a distance between PD2 and PD3 is larger than a distance between PD1 and PD3. PD2 is connected to PN2 via a bonding wire BW.

Capacitors Cg and Cd and a quartz crystal unit XTAL as external components are mounted on the printed circuit board PCB. Further, as shown in FIGS. 1A and 1B, wiring patterns LN_XIN, LN_XOUT, LN_VSS1a, and LN_VSS1b are formed in a first wiring layer (for example, the uppermost layer to be a component mounting surface) LY1 on PCB. LN_XIN has one end connected to the external terminal PNi, extends approximately in a Y-axis direction, and has the other end connected to one end of XTAL. LN_XOUT has one end connected to the external terminal PNo, extends approximately in the Y-axis direction, and has the other end connected to the other end of XTAL. LN_VSS1b has one end connected to the external terminal PNs1, extends on a region between LN_XIN and LN_XOUT approximately in the Y-axis direction, and has the other end in the vicinity of which one ends of Cg and Cs are connected. The other end of Cg is connected to LN_XIN and the other end of Cd is connected to LN_XOUT. LN_VSS1a has one end connected to the external terminal PNs2 and is arranged approximately in a loop shape so as to enclose a formation region or a mounting region of the above-described XTAL, Cg, Cd, LN_XIN, LN_XOUT, and LN_SS1b.

Further, in PCB, as shown in FIGS. 1A and 1B, a planar wiring pattern LN_VSSn for VSS is formed in an n-th wiring layer LYn to be a lower layer portion (in a Z-axis direction) below respective wiring patterns (LN_XIN, LN_XOUT, LN_VSS1a, and LN_VSS1b) in the above-described first wiring layer LY1 via an insulating layer (dielectric layer) ISL.

In other words, the respective wiring patterns in LY1 have portions facing the LN_VSSn in the Z-axis direction. LYn is desirably the lowermost layer, but it is not necessarily limited to this, and it may be an inner layer positioned between the uppermost layer and the lowermost layer. A portion in the vicinity of the other end of the above-described LN_VSS1b is connected to LN_VSSn via a through hole TH and a portion in the vicinity of one end of LN_VSS1a and a portion in the vicinity of the other thereof are connected to LN_VSSn via through holes TH.

In the configuration example described above, the main features thereof lie in the following points. A first feature lies in the point that the external terminal PNs1 for VSS (pad PDs1) is arranged between the external terminal PNi for XIN (pad PDi) and the external terminal PNo for XOUT (pad PDo). A second feature lies in the point that the wiring pattern LN_VSS1b for VSS is arranged between the wiring pattern LN_XIN for XIN and the wiring pattern LN_XOUT for XOUT like the first feature. A third feature lies in the point that one ends of the capacitors Cg and Cd are connected to this LN_VSS1b. A fourth feature lies in the point that the wiring pattern LN_VSSn for VSS is provided in a lower layer of the respective wiring patterns in the first wiring layer LY1. A fifth feature lies in the point that a certain distance is secured between the respective pads for OSCBK and the respective pads for CB1 and CB2.

Figure 3:
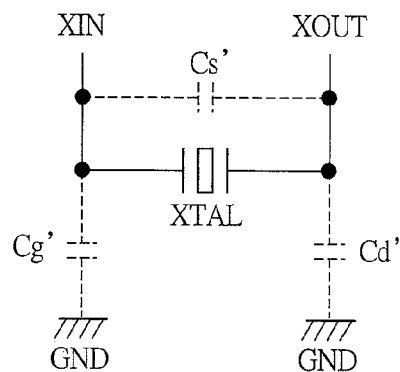
FIG. 3 is a circuit diagram showing one example of a parasitic capacitance generated between an XIN node and an XOUT node.

According to the first and second features, first of all, a direct parasitic capacitance (parasitic capacitance between pins) existing between the XIN node and the XOUT node can be reduced. As a result, coupling noise between the XIN node and the XOUT node that oscillate with oscillation signals having polarities reverse to each other can be reduced, and a parasitic capacitance that influences a load capacitance value (CL value) of XTAL can be reduced in some cases. FIG. 3 is a circuit diagram showing one example of a parasitic capacitance generated between the XIN node and the XOUT node. As shown in FIG. 3, a direct parasitic capacitance (parasitic capacitance between pins) Cs' exists between the XIN node and the XOUT node, and parasitic capacitances Cg' and Cd' exist between the XIN node and the ground power source voltage GND and between the XOUT node and GND, respectively. In this case, a value of a load capacitance (parasitic capacitance) CL' viewed from the side of the quartz crystal unit XTAL is a value obtained by connecting Cs' in parallel with a combined capacitance associated with the series connection of Cg' and Cd' as expressed by Equation (1).

$$CL' = (Cg' \cdot Cd')/(Cg' + Cd') + Cs' \quad (1)$$

Figure 32:
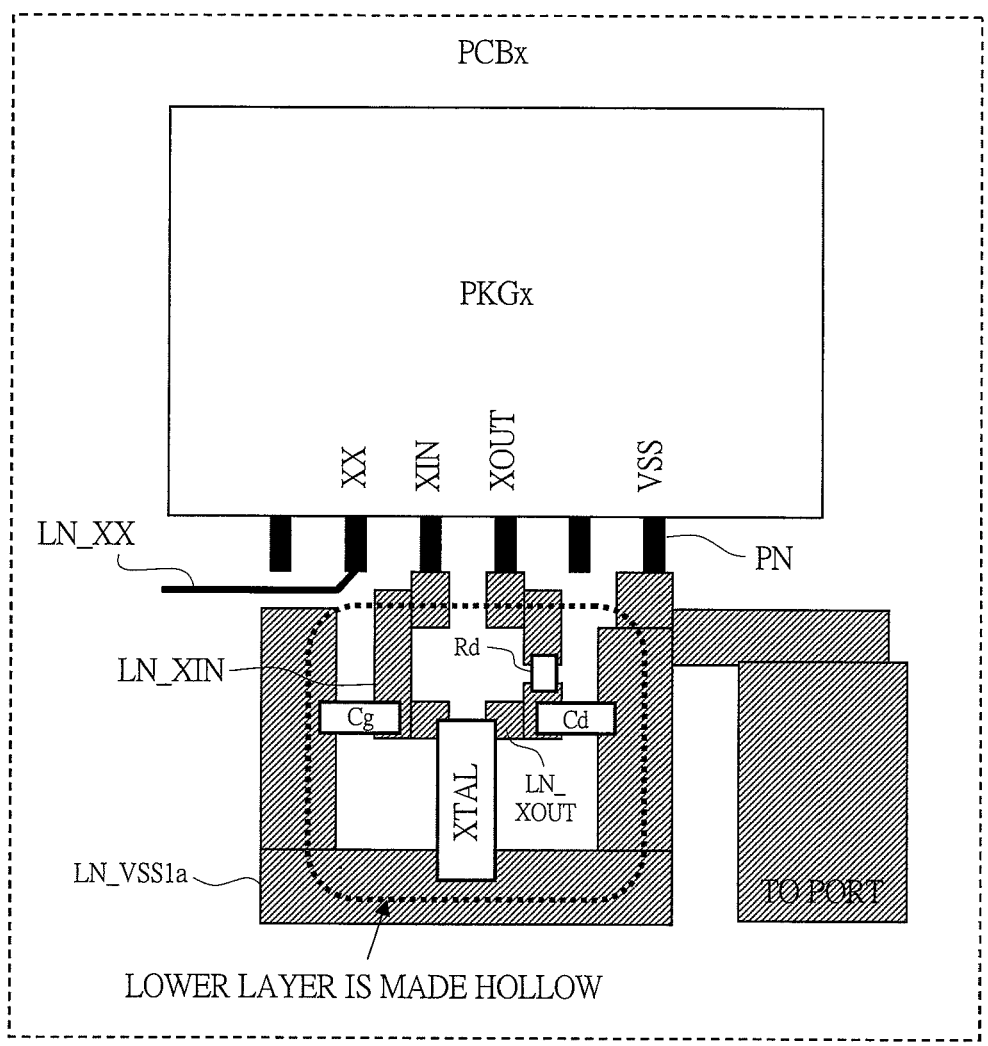
FIG. 32 is a schematic diagram showing a layout configuration example of a printed circuit board in the crystal oscillation device examined as the premise of the present invention.

Here, for example, in order to reduce the parasitic capacitance in the above-described representative configuration example shown in FIG. 32, reduction of a value of Cg' or Cd' is generally regarded as important, but there is a case where it is more effective to reduce the value of Cs' even if the value of Cg' or Cd' is increased. For example, in the case of Cg'=Cd'=1 pF and Cs'=3 pF, CL'=3.5 pF is obtained, in the case of Cg'=Cd'=2 pF and Cs'=2 pF, CL'=3.0 pF is obtained, and in the case of Cg'=Cd'=3 pF and Cs'=1 pF, CL'=2.5 pF is obtained. From these, it is understood that Cs' more greatly influences the load capacitance value (CL value) of XTAL as compared with Cg' and Cd', and even if Cg' or Cd' slightly increases, the parasitic capacitance (CL') that influences the CL value can be reduced when Cs' is reduced.

In the configuration example shown in FIGS. 1A and 1B, since the VSS (GND) nodes (PSs1, BW, PNs1, LN_VSS1b) are provided between the XIN nodes (PDi, BW, PNi, LN_XIN) and the XOUT nodes (PDo, BW, PNo, LN_X-

OUT), the values of Cg' and Cd' slightly increase. However, the value of Cs' can be regarded as approximately zero because of the interposition of the VSS node. Incidentally, in the case shown in FIG. 32 as a comparative example, a certain inter-pin capacitance exists between the XIN node and the XOUT node in accordance with the distance therebetween. When Cs' can be reduced, the parasitic capacitance (CL') can be reduced as described above, and further the coupling noise between the XIN node and the XOUT node can be reduced.

Next, according to the third feature, improvement in noise tolerance (EMC) can be realized. Oscillation signals having reversed polarities generated at LN_XIN and LN_XOUT are coupled at one ends of Cg and Cd (on the side of LN_VSS1b), but since these oscillation signals have reversed polarities, the oscillation signals are cancelled by connecting one end of Cg and one end of Cd at a short distance, and the potential level of the LN_VSS1b can be kept constant. As a result, the GND noise can be reduced, and improvement in noise tolerance is achieved. On the other hand, in the case shown in FIG. 32 as the comparative example, since one end of Cg and one end of Cd are connected to each other at a long distance via LN_VSS1a, there may be the case where the potential level at the one end of Cg and the potential level at the one end of Cd are not consistent with each other. The inconsistency in the potential level may be the source of noise generation.

Subsequently, according to the fourth feature, improvement in noise tolerance (EMC) can be realized. As shown in FIG. 1A, by providing an approximately loop-shaped LN_VSS1a, it becomes possible to reduce transmission of noise between the formation region or mounting region of XTAL, Cg, Cd, LN_XIN, LN_XOUT, and LN_VSS1b and the region outside it. However, on the contrary, there is a possibility that the approximately loop-shaped LN_VSS1a functions as an antenna and turns to be the source of noise generation. Therefore, passage of electromagnetic wave in the loop of this LN_VSS1a is blocked by providing LN_VSSn, thereby suppressing the effect of LN_VSS1a as an antenna. Incidentally, there is a possibility that the parasitic capacitances Cg' and Cd' shown in FIG. 3 are increased by providing LN_VSSn, but since the parasitic capacitance between pins is dominant as the parasitic capacitance as described above, the increase does not cause an especially large problem. However, since excessive increase of Cg' and Cd' causes a problem, it is desirable from this viewpoint that LN_VSSn is located in the lowermost layer furthest from LN_XIN and LN_XOUT as described in FIG. 1B.

Next, according to the fifth feature, it becomes possible to reduce the parasitic capacitance between OSCBK and CB1 and between OSCBK and CB2, and transmission of noise can be reduced. As a result, especially, improvement in noise tolerance in the XIN node and the XOUT node can be achieved. When viewed from CB1 and CB2, OSCBK becomes a source of noise generation in terms of its function, and on the contrary, it causes malfunction relatively easily when it receives noises from CB1 and CB2. Therefore, transmission of noise is suppressed by enlarging the distance between respective cells CL for OSCBK and respective cells CL for CB1 and the distance between respective cells CL for OSCBK and respective cells CL for CB2.

Since the features as described above are provided, it is possible to easily realize a crystal oscillation device using a low CL value (for example, the CL value=3 to 7 pF)—adapted quartz crystal unit XTAL. Especially, in the low CL value-adapted crystal oscillation device, reduction of the parasitic capacitance (CL') and reduction of noise are required as described above, but these requirements can be satisfied by using the configuration example shown in FIGS. 1A and 1B.

Also, by using the low CL value-adapted crystal oscillation device, the reduction in power consumption can be achieved. In the crystal oscillation device, it is generally necessary to maintain an index called "oscillation margin (Rm/Re)" and expressed by Equation (2) at a specified value or more. A symbol $\omega$ is an oscillation frequency (angular velocity) and gm is a mutual conductance of the inverter circuit IV in the oscillation circuit section OSCBK. Since the oscillation margin is inversely proportional to a product of the external capacitors Cd and Cg, when Cd and Cg are made small while the oscillation margin is kept constant, gm can be made small, so that a current flowing in OSCBK can also be made small.

$$(Rm/Re) = gm/(Cg \cdot Cd\omega^2) \qquad (2)$$

<<Representative Embodiment of Whole Crystal Oscillation Device [2A]>>

Figure 2:
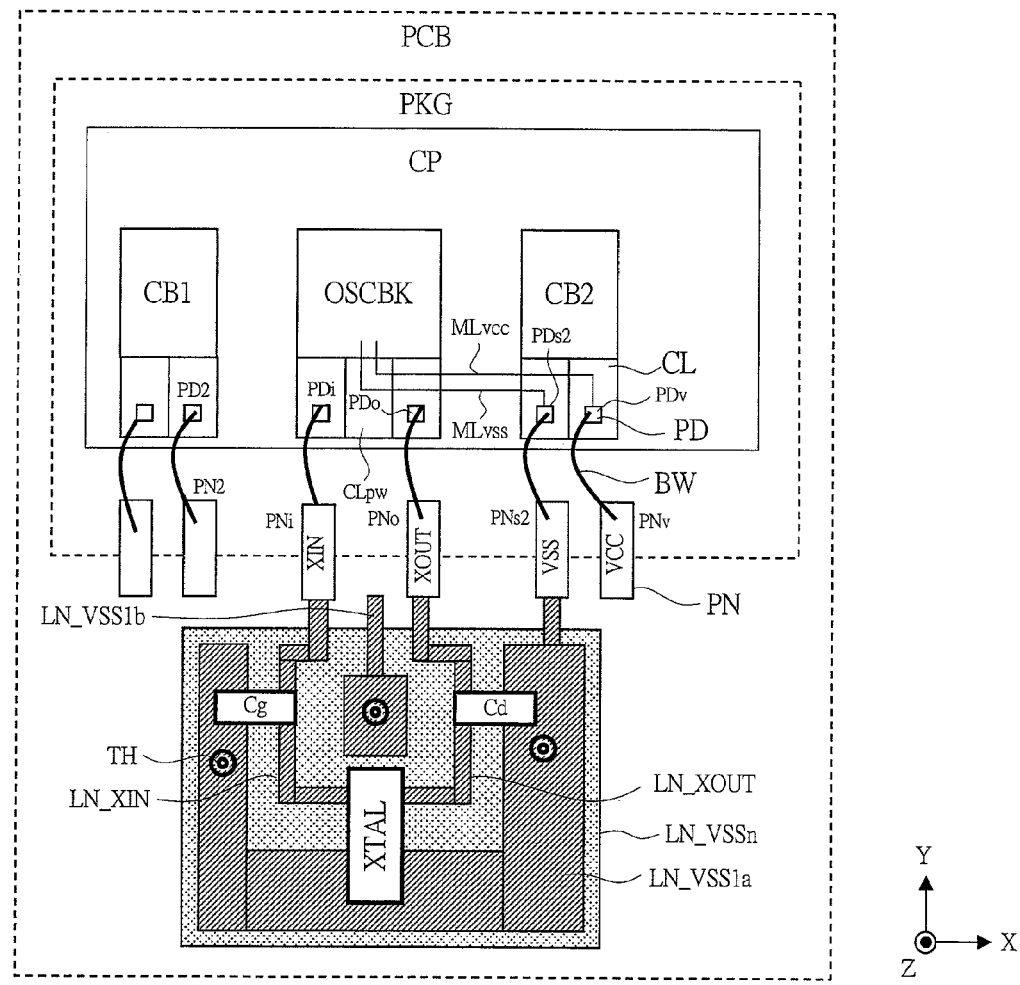
FIG. 2 is a plan view showing a whole schematic configuration example different from FIGS. 1A and 1B in a crystal oscillation device according to an embodiment of the present invention.

FIG. 2 is a plan view showing a whole schematic configuration example different from that shown in FIG. 1 in a crystal oscillation device according to an embodiment of the present invention. Here, description will be made while focusing on a difference from the configuration shown in FIG. 1. First of all, in a semiconductor package PKG shown in FIG. 2, the external terminal PNi for XIN and the external terminal PNo for XOUT are arranged adjacent to each other unlike the case shown in FIG. 1, and an external terminal PNv for a power source voltage VCC is provided as an external terminal for circuit block CB2 in addition to the external terminal PNs2 for VSS. Respective wiring patterns on PCB shown in FIG. 2 are approximately similar to those in the case shown in FIG. 1, but one end of LN_VSS1b is open due to the above-described adjacent arrangement of PNi and PNo and further one ends of the capacitors Cg and Cd are connected to LN_VSS1a. More specifically, in FIG. 2, an island for VSS (LN_VSS1b) connected to LN_VSSn by a through hole TH is provided between LN_XIN and LN_XOUT.

In the semiconductor chip CP shown in FIG. 2, three cells CL for OSCBK are arranged between the oscillation circuit section OSCBK and one side of CP. The three cells CL are sequentially arranged along the X-axis direction, and the cells CL positioned on both sides include a pad PDi for XIN and a pad PDo for XOUT, respectively, and the cell CLpw positioned therebetween functions as a cell for power source supply. PDi and PDo are connected to PNi and PNo via bonding wires BW, respectively. Further, two cells CL are sequentially arranged between the circuit block CB2 and one side of CP along the X-axis direction. The two cells CL include a pad PDs2 for VSS and a pad PDv for VCC, respectively, and PDs2 and PDv are connected to PNs2 and PNv via bonding wires BW, respectively. Here, PDv is connected to CLpw for power source supply in OSCBK via a metal wiring MLvcc in CP, and PDs2 is similarly connected to CLpw in OSCBK via a metal wiring MLvss in CP. The inverter circuit IV (FIG. 30) and the like in OSCBK are operated with the power source supplied via this CLpw.

In the configuration example like this, its main features lie in the following points. First of all, a sixth feature lies in the point that the cell CLpw for power source supply is arranged between the cell CL including PDi for XIN and the cell CL including PDo for XOUT in OSCBK. More specifically, in the configuration example shown in FIG. 2, a dedicated power source for OSCBK is not provided and a power source is supplied from a set of external terminals PNv and PNs2 for power source used commonly unlike the case shown in FIG. 1. Such a configuration example is used in, for example, a low-end microcomputer having a small number of external terminals or the like, and in this case, PNi and PNo may be arranged adjacent to each other due to limitations of the external terminals. However, even when PNi and PNo are arranged adjacent to each other in this manner, as shown in FIG. 2, the inside of the semiconductor chip CP is configured so that a space is secured between PDi and PDo by interposing the cell CLpw therebetween and further power sources (VCC, VSS) are supplied from CLpw. By this means, like the above-described first feature (PNs1 (PDs1) is arranged between PNi (PDi) and PNo (PDo)), reduction in the parasitic capacitance between pins can be achieved and reduction in coupling noise between the pins can be achieved.

Furthermore, the configuration example shown in FIG. 2 is provided with the second feature (LN_VSS1b is arranged between LN_XIN and LN_XOUT), the fourth feature (LN_VSSn is arranged in the lower layer), and the fifth feature (spaces are secured between respective pads for OSCBK and respective pads for CB1 and CB2) like the case shown in FIG. 1. An effect similar to that obtained in the case shown in FIG. 1A can be achieved by these features. Further, the configuration example shown in FIG. 2 is not provided with the above-described third feature (one ends of Cg and Cd are connected to LN_VSS1b), but it is, of course, possible to adopt the configuration provided with the feature. However, in the case shown in FIG. 2, since the external terminal PNs1 for VSS for OSCBK is not provided and a slight distance is present between the ground power source voltage node of OSCBK and LN_VSS1b unlike the case shown in FIG. 1, one ends of Cg and Cd are connected to LN_VSS1a.

The representative embodiments of the whole crystal oscillation device according to the present invention have been described above, but details of above-described respective features and further features will be individually described mainly from the viewpoint of pin arrangement, the layout of the semiconductor chip CP, and the layout of the printed circuit board PCB.

<<Detailed Pin Arrangement of Crystal Oscillation Device>>

<<Pin Arrangement (Comparative Example)>>

Figure 33:
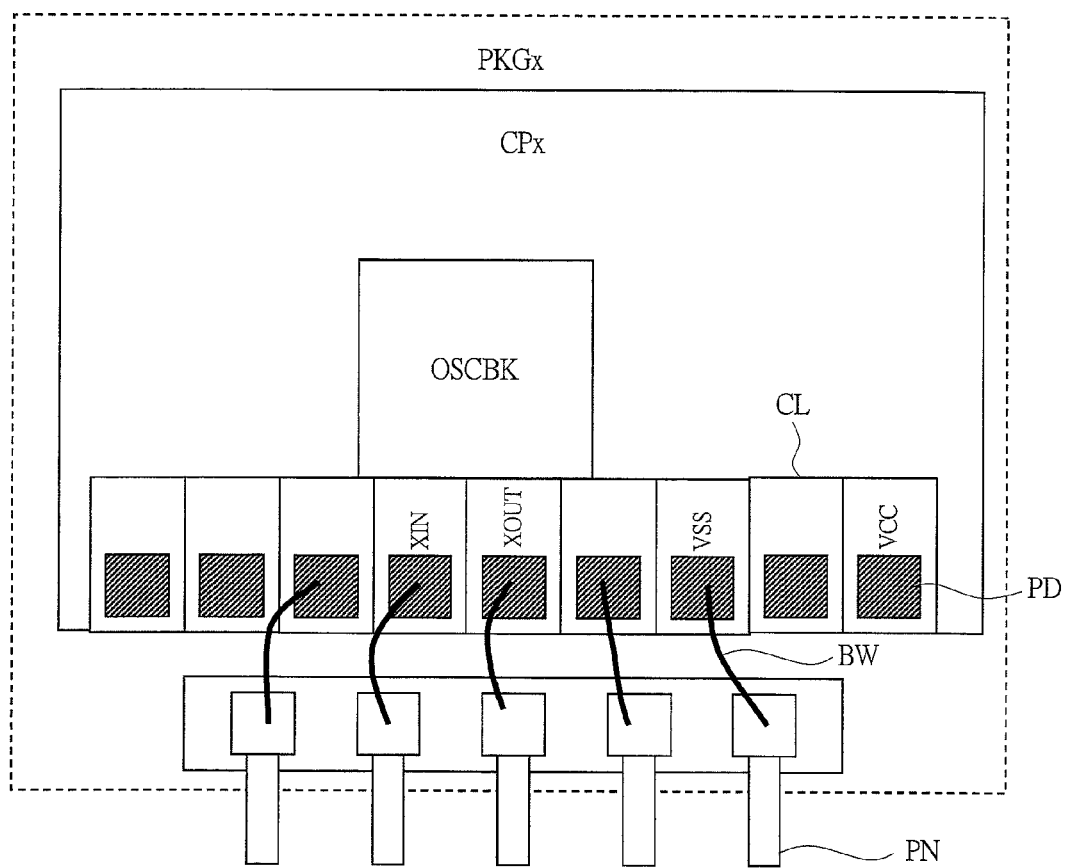
FIG. 33 is a schematic diagram showing one example of a detailed pin arrangement in the crystal oscillation device examined as the premise of the present invention.

FIG. 33 is a schematic diagram showing one example of a detailed pin arrangement in the crystal oscillation device examined as the premise of the present invention. A semiconductor package PKGx shown in FIG. 33 is provided with a semiconductor chip CPx and a plurality of external terminals PN. In CPx, an oscillation circuit section OSCBK is contained and a cell CL including a pad PDi for XIN and a cell CL including a pad PDo for XOUT are arranged adjacent to each other between OSCBK and one side of CPx along an X-axis direction. Further, a plurality of cells CL including predetermined pads PD are sequentially arranged adjacent to the cell CL for XIN and the cell CL for XOUT along the X-axis direction. The respective pads PD including PDi and PDo are arranged at equal intervals. Further, the respective pads PD are properly connected to predetermined external terminals PN via bonding wires BW. However, in the pad arrangement like this, a parasitic capacitance between pins between the XIN node and the XOUT node becomes large, and there is a possibility that noise tolerances of the XIN node and the XOUT node cannot be sufficiently secured.

<<Pin Arrangement [1]>>

Figure 4:
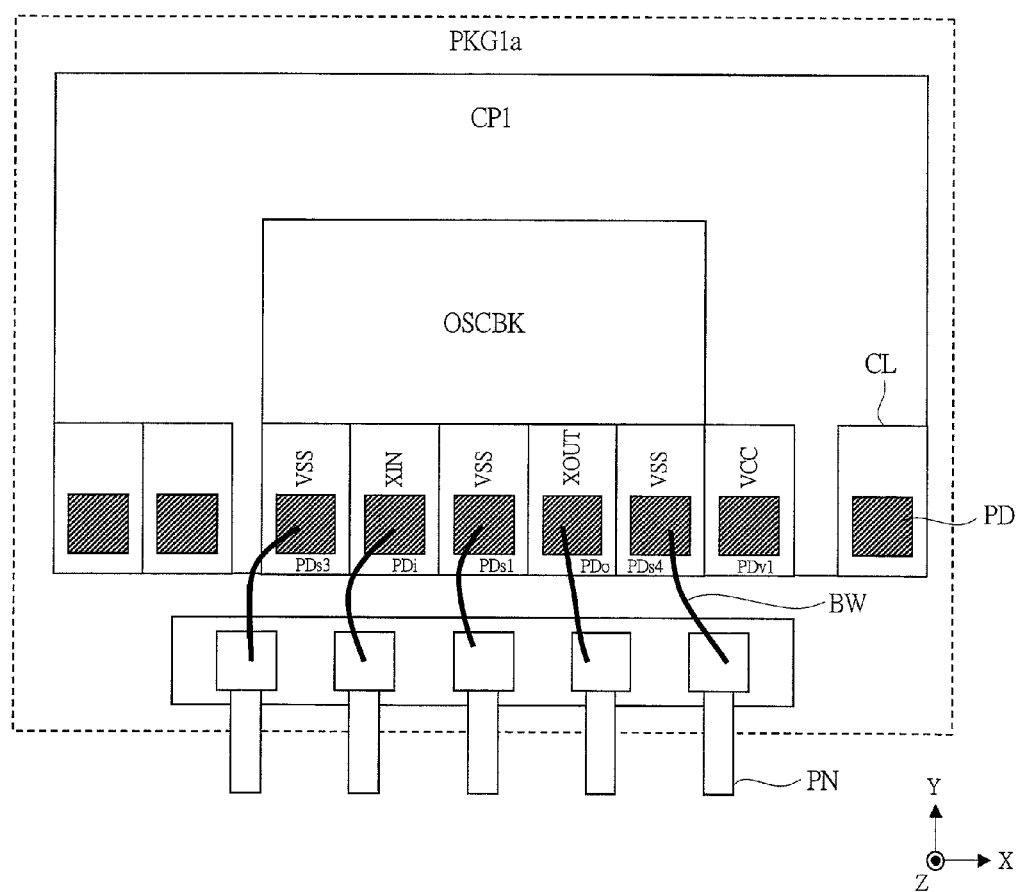
FIG. 4 is a schematic diagram showing one example of a detailed pin arrangement in a crystal oscillation device according to an embodiment of the present invention.

FIG. 4 is a schematic diagram showing one example of a detailed pin arrangement in a crystal oscillation device according to an embodiment of the present invention. A semiconductor package PKG1a shown in FIG. 4 is provided with a semiconductor chip CP1 and a plurality of external terminals PN. In CP1, an oscillation circuit section OSCBK is contained and five cells CL are sequentially arranged between OSCBK and one side of CP1 in the X-axis direction. The five cells CL include three pads PDs1, PDs3, and PDs4 for VSS, a pad PDi for XIN, and a pad PDo for XOUT, respectively. These pads are arranged in the order of PDs3, PDi, PDs1, PDo, and PDs4 along the X-axis direction. Further, the five pads are connected to five external terminals PN arranged adjacent to one another via bonding wires BW, respectively.

By adopting the configuration where each of XIN node (PDi, BW, PN) and the XOUT node (PDo, BW, PN) is sandwiched between the VSS (GND) nodes, it becomes possible to reduce the parasitic capacitance and coupling noise between pins in the XIN node and the XOUT node as described in the first feature. At this time, since the VSS (GND) nodes are arranged not only between the XIN node and the XOUT node but also outside the XIN node and the XOUT node, it is possible to significantly improve the noise tolerance at the XIN node and the XOUT node. Further, in FIG. 4, as described in the fifth feature, the respective cells CL for OSCBK are arranged so as to separate from the respective cells CL for the predetermined circuit block, whereby improvement in noise tolerance can be achieved. Incidentally, here, a pad PDv1 for VCC for OSCBK is further arranged adjacent to PDs4, and OSCBK operates with power source supplied from it.

<<Pin Arrangement [2]>>

Figure 5:
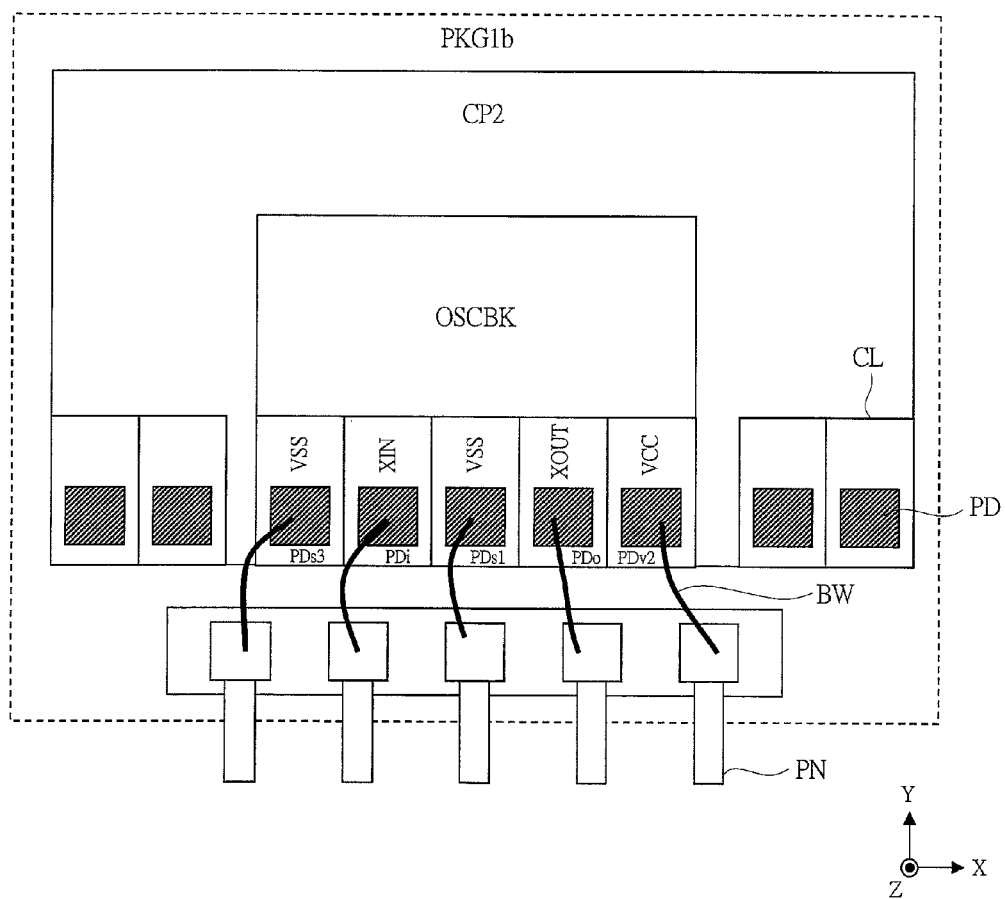
FIG. 5 is a schematic diagram showing one example of a pin arrangement obtaining by modifying the pin arrangement shown in FIG. 4.

FIG. 5 is a schematic diagram showing one example of a pin arrangement obtained by modifying the pin arrangement shown in FIG. 4. A semiconductor package PKG1b shown in FIG. 5 is provided with a semiconductor chip CP2 and a plurality of external terminals PN. In CP2, five cells CL are sequentially arranged between the oscillation circuit section OSCBK and one side of CP2 along the X-axis direction like the case shown in FIG. 4, but a cell including a pad PDv2 for VCC is arranged instead of the cell CL including the pad PDs4 for VSS unlike the case shown in FIG. 4. By this means, the number of cells (pads) for OSCBK is reduced by one as compared with the case shown in FIG. 4, and it becomes possible to reduce a circuit area (or the number of external terminals). When the configuration example like this is used, the XOUT node is sandwiched between the VSS node (GND node) and the VCC node, but reduction of the parasitic capacitance and the coupling noise between pins and improvement in noise tolerance can be sufficiently achieved even in this case. However, since the VCC node is slightly larger in noise amount than the VSS node, and the XIN node is smaller in signal amount than the XOUT node, and the XIN node is lower in noise tolerance than the XOUT node in general, the VCC node is here arranged on the side of the XOUT node instead of the side of the XIN node.

<<Pin Arrangement [3]>>

Figure 6:
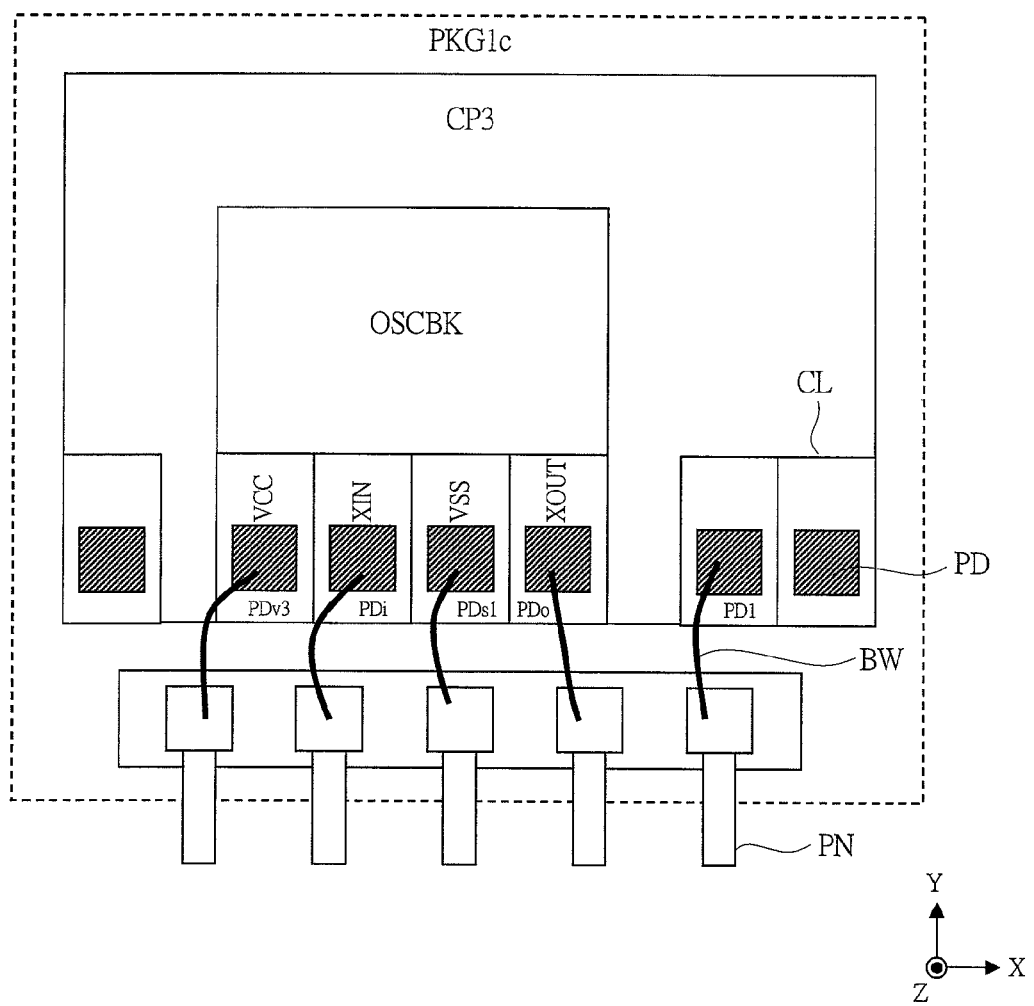
FIG. 6 is a schematic diagram showing one example of a pin arrangement obtaining by modifying the pin arrangement shown in FIG. 5.

FIG. 6 is a schematic diagram showing one example of a pin arrangement obtained by modifying the pin arrangement shown in FIG. 5. A semiconductor package PKG1c shown in FIG. 6 is provided with a semiconductor chip CP3 and a plurality of external terminals PN. In CP3, four cells CL are sequentially arranged between the oscillation circuit section OSCBK and one side of CP3 along the X-axis direction. The four cells CL include a pad PDv3 for VCC, a pad PDi for XIN, a pad PDs1 for VSS, and a pad PDo for XOUT, and these pads are arranged in the order of PDv3, PDi, PDs1, and PDo in the X-axis direction.

As described above, in the configuration example shown in FIG. 6, reduction of the circuit area (or the number of external terminals) can be achieved by further reducing one cell (pad) for OSCBK from the configuration example shown in FIG. 5. Since the XIN node is sandwiched between the VCC node and the VSS node, reduction of the parasitic capacitance and coupling noise between pins at the XIN node and the XOUT node and improvement in noise tolerance of the XIN node are sufficiently possible. Further, regarding the XOUT node, since the VSS node is arranged on one side thereof and the space as described in the fifth feature is secured on the other side thereof, reduction of the parasitic capacitance and coupling noise between pins and improvement in noise tolerance of the XOUT node are achieved. More specifically, the cells CL for the other circuit block including the pad PD1 are arranged so that a distance between PDo and Pd1 is larger than a distance between PDo and PDs1.

<<Pin Arrangement [4]>>

Figure 7:
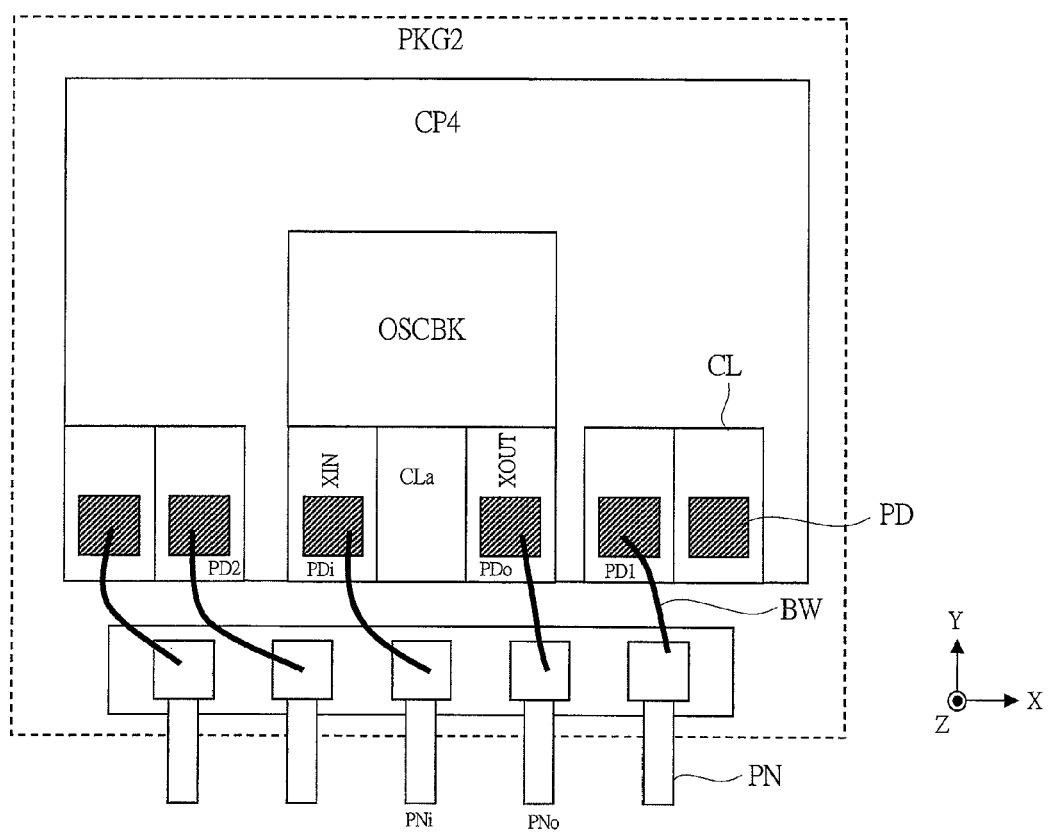
FIG. 7 is a schematic diagram showing one example of a pin arrangement obtaining by modifying the pin arrangement shown in FIG. 6.

FIG. 7 is a schematic diagram showing one example of a pin arrangement obtained by modifying the pin arrangement shown in FIG. 6. A semiconductor package PKG2 shown in FIG. 7 is provided with a semiconductor chip CP4 and a plurality of external terminals PN including external terminals PNi and PNo. In CP4, three cells CL are sequentially arranged between the oscillation circuit section OSCBK and one side of CP4 along the X-axis direction. The cells CL positioned on both sides of the three cells CL include a pad PDi for XIN and a pad PDo for XOUT, respectively. Further, the cell CLa positioned at the center of the three cells CL does not include a pad in particular. PDi and PDo are connected to PNi and PNo arranged adjacent to each other via bonding wires BW, respectively.

As described above, in the configuration example shown in FIG. 7, one cell (pad) for OSCBK is further reduced from the configuration example shown in FIG. 6. PNi and PNo are arranged adjacent to each other approximately like the above-described sixth feature, but PDi and PDo are arranged to separate from each other via a cell CLa in CP4, whereby reduction of the parasitic capacitance and the coupling noise between pins between the XIN node and the XOUT node is achieved. Further, like the fifth feature, a certain distance is secured between the cell CL including PDi and a cell CL for a predetermined circuit block which is arranged in parallel with it and includes a pad PD2, and a certain distance is similarly secured between the cell CL including PDo and a cell CL for a predetermined circuit block which is arranged in parallel with it and includes a pad PD1. Specifically, the cells are arranged so that a distance between PD1 and PD2 is larger than ½ of a distance between PDi and PDo and similarly a distance between PDo and PD1 is larger than ½ of a distance between PDi and PDo. By this means, parasitic capacitances between the XIN and the XOUT nodes and the predetermined circuit block can be reduced, and noise tolerance of the XIN node and the XOUT node can be improved.

<<Pin Arrangement [5]>>

Figure 8:
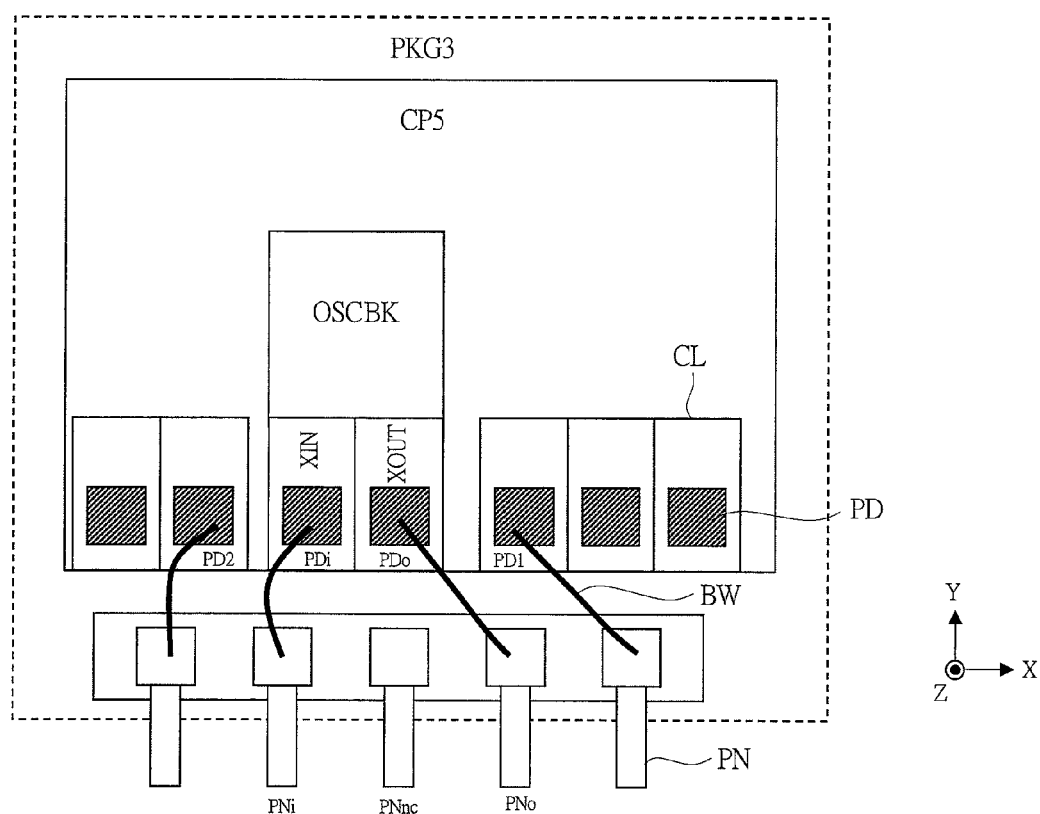
FIG. 8 is a schematic diagram showing one example of a pin arrangement obtaining by modifying the pin arrangement shown in FIG. 7.

FIG. 8 is a schematic diagram showing one example of a pin arrangement obtained by modifying the pin arrangement shown in FIG. 7. A semiconductor package PKG3 shown in FIG. 8 is provided with a semiconductor chip CP5 and a plurality of external terminals PN including external terminals PNi, PNnc, and PNo. PNnc is arranged between PNi and PNo. In CP5, two cells CL are sequentially arranged between the oscillation circuit section OSCBK and one side of CP5 along the X-axis direction. The two cells CL include a pad PDi for XIN and a pad PDo for XOUT, respectively. PDi and PDo are connected to PNi and PNo via bonding wires BW, respectively. Further, nothing is connected to PNnc in particular.

Thus, in the configuration example shown in FIG. 8, one cell for OSCBK is further reduced from the configuration example shown in FIG. 7. Here, as a seventh feature, PDi and PDo are arranged adjacent to each other, but instead, reduction of a parasitic capacitance and coupling noise between pins between the XIN node and the XOUT node is achieved by sandwiching PNnc between PNi and PNo. Further, like the case shown in FIG. 7, reduction of a parasitic capacitance and improvement of noise tolerance are achieved by securing a certain space between the pads PDi and PDo for OSCBK and the pads PD1 and PD2 for a predetermined circuit block.

<<Detailed Layout of Semiconductor Chip>>

Chip Layout [1]>>

Figure 9:
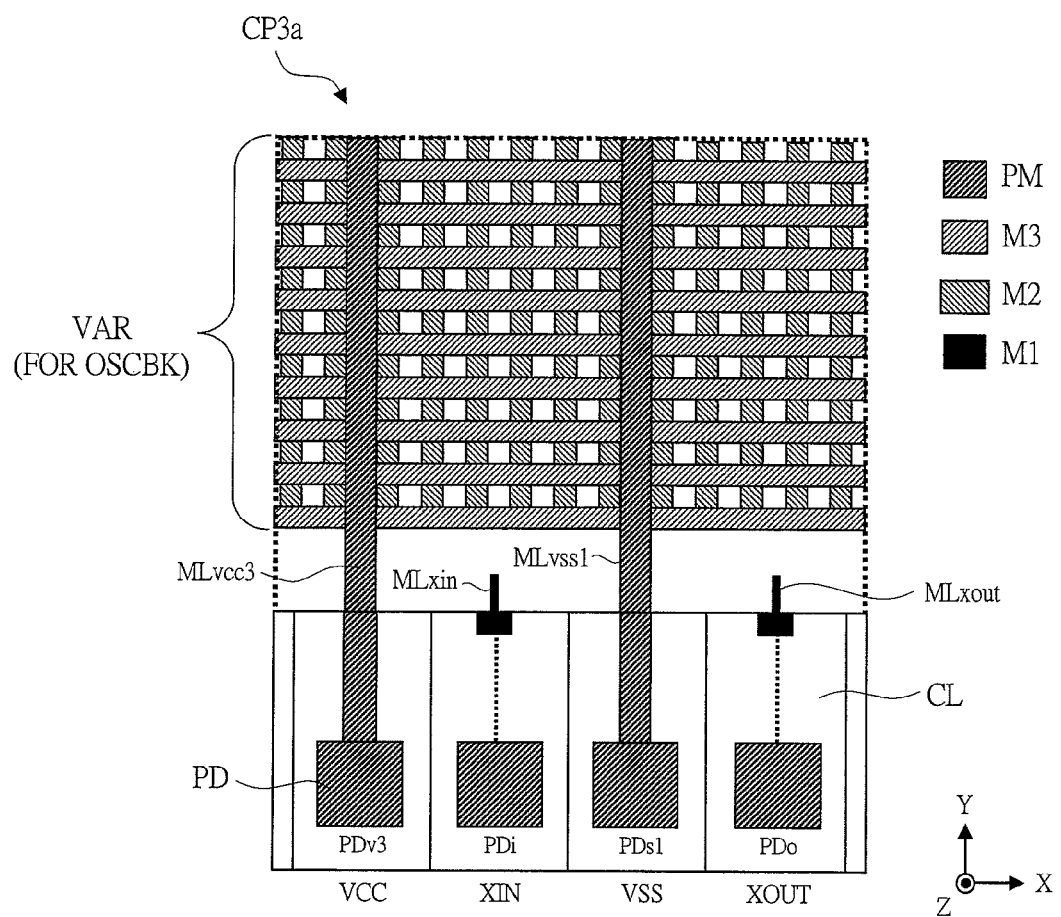
FIG. 9 is a schematic diagram showing a layout configuration example of a main section of a semiconductor chip which is a constituent element in a crystal oscillation device according to an embodiment of the present invention.

FIG. 9 is a schematic diagram showing a layout configuration example of a main section of a semiconductor chip which is a constituent element in a crystal oscillation device according to an embodiment of the present invention. A semiconductor chip CP3a shown in FIG. 9 includes four cells CL sequentially arranged along one side of CP3a (along the X-axis direction). The four cells CL are for the oscillation circuit section OSCBK and are provided with a pad PDv3 for VCC, a pad PDi for XIN, a pad PDs1 for VSS, and a pad PDo for XOUT, respectively. The respective pads are arranged in the order of PDv3, PDi, PDs1, and PDo like the case shown in FIG. 6.

A metal wiring MLvcc3 extends from PDv3 toward an inward direction of the chip (Y-axis direction), and a metal wiring MLvss1 extends from PDs1 toward the Y-axis direction. MLvcc3 and MLvss1 are formed using the metal wiring layer PM in the uppermost layer. On the other hand, a metal wiring MLxin directed in the Y-axis direction extends from PDi, and a metal wiring MLxout extends from PDo toward the Y-axis direction. MLxin and MLxout are formed using a first-layered metal wiring layer M1 positioned below PM, and they are connected to PDi and PDo positioned in the uppermost layer PM in the cell CL through contact holes, respectively, though not illustrated.

A power feeding region VAR is provided to be close to four cells CL in the Y-axis direction. In VAR, a net-like metal wiring is formed using metal wiring layers M2 and M3 corresponding to two layers positioned between M1 and PM. In the uppermost layer in VAR, the above-described MLvcc3 and MLvss1 are arranged and the MLvcc3 and MLvss1 are properly connected to the net-like metal wiring via contact holes (not shown), respectively. The oscillation circuit section OSCBK including the inverter circuit IV and others is formed on the semiconductor substrate in VAR as shown in FIG. 30, and OSCBK operates with the power source supply received from the net-like metal wiring. Further, MLxin is connected to an input of IV and MLxout is connected to an output of IV.

As described above, in the layout configuration example shown in FIG. 9, as an eighth feature, power source is supplied to the oscillation circuit section OSCBK by using the relatively upper layer portion (PM, M3, M2) and a signal is supplied by using the relatively lower layer portion (M1). Further, the net-like metal wiring is used as power source lines. By this means, a power source with reduced noise can be supplied to OSCBK, and parasitic capacitances of the XIN node and the XOUT node can be reduced. Reduction of the power source noise is obtained from the fact that wiring resistance can be reduced by using an upper metal wiring layer and reduction of IR drop and the like is possible by using the net-like metal wiring. Further, reduction of the parasitic capacitance is obtained from the fact that a signal and a power source are prevented from running in the same metal wiring layer by dropping the signal into a lower metal wiring layer M1 in the cell CL.

<<Chip Layout [2]>>

Figure 10:
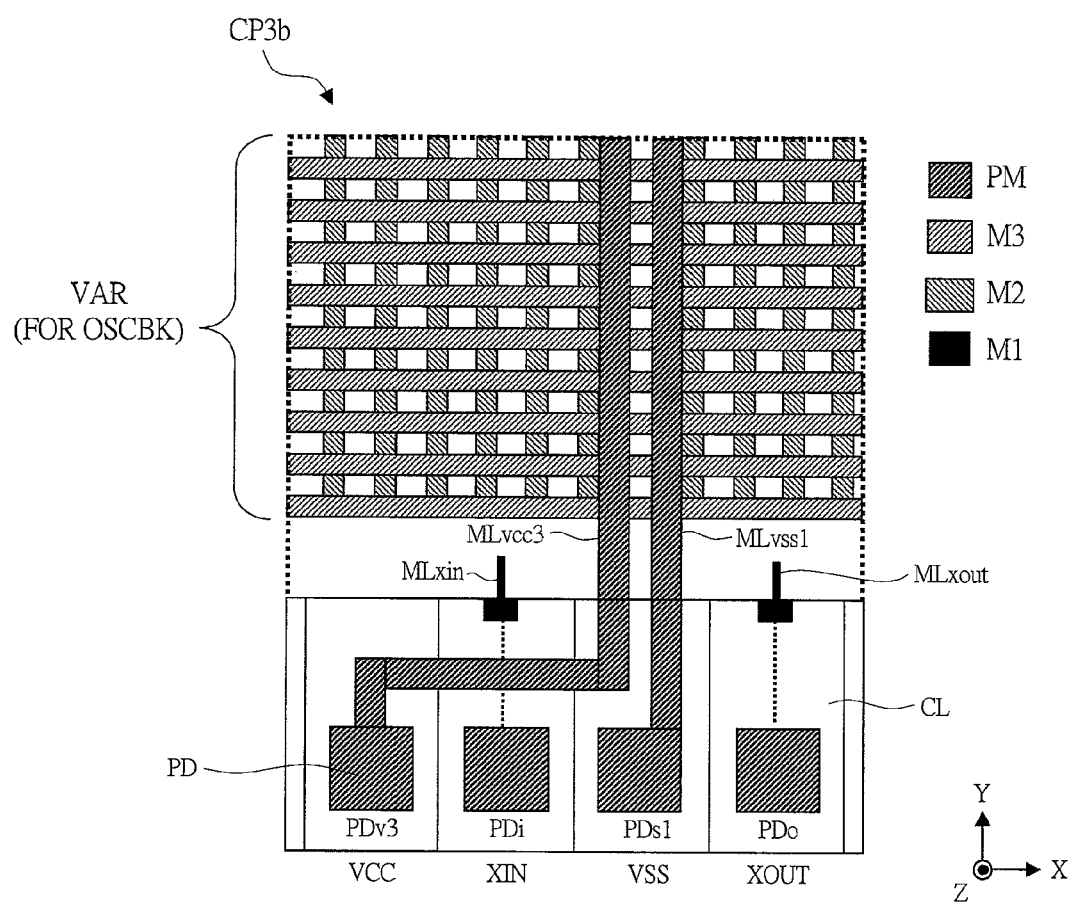
FIG. 10 is a schematic diagram showing a layout configuration example obtained by modifying the layout configuration example shown in FIG. 9.

FIG. 10 is a schematic diagram showing a layout configuration example obtained by modifying the layout configuration example shown in FIG. 9. In the configuration of a semiconductor chip CP3b shown in FIG. 10, compared with the semiconductor chip CP3a shown in FIG. 9, a metal wiring MLvcc3 for VCC and a metal wiring MLvss1 for VSS are arranged to be close to each other and extend in the Y-axis direction in parallel with each other. More specifically, MLvcc3 is configured to extend toward MLvss1 in the X-axis direction and thereafter extend in the Y-axis direction in the region of the cell CL. Also when this layout configuration example is used, an effect similar to that obtained in the layout configuration example shown in FIG. 9 can be obtained.

<<Chip Layout [3]>>

Figure 11:
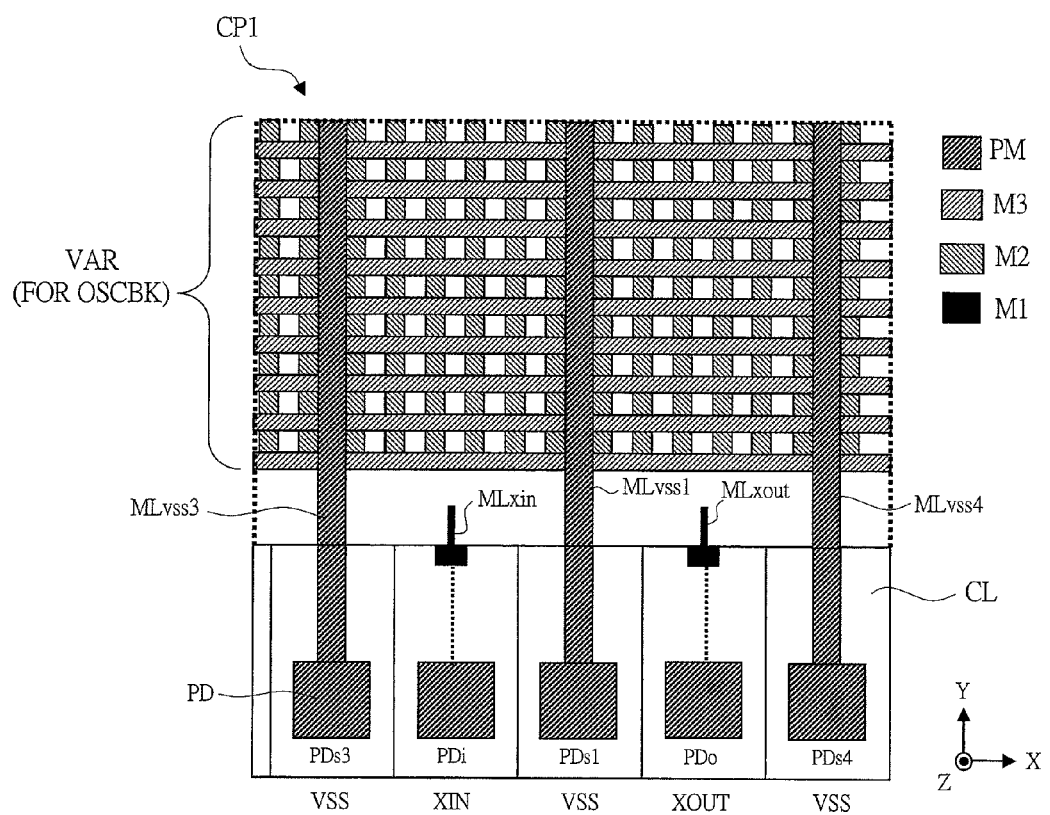
FIG. 11 is a schematic diagram showing another layout configuration example obtained by modifying the layout configuration example shown in FIG. 9.

FIG. 11 is a schematic diagram showing another layout configuration example obtained by modifying the layout configuration example shown in FIG. 9. In the configuration of a semiconductor chip CP1 shown in FIG. 11, compared with FIG. 9, the cell CL including the pad PDv3 for VCC shown in FIG. 9 is replaced with a cell CL including a pad PDs3 for VSS and a cell CL including a pad PDs4 for VSS is added adjacent to the cell CL including a pad PDo for XOUT in FIG. 9. More specifically, arrangement of the respective pads corresponds to that in the configuration example shown in FIG. 4. A metal wiring MLvss3 extends from PDs3 in an inward direction of the chip (in the Y-axis direction), and a metal wiring MLvss4 extends from PDs4 in the Y-axis direction. MLvss3 and MLvss4 are formed using the metal wiring layer PM in the uppermost layer, and they are properly connected to the net-like metal wiring in the power feeding region VAR like the case shown in FIG. 9. Also when this layout configuration is used, an effect similar to that obtained in the layout configuration shown in FIG. 9 can be obtained. Further, since there is a possibility that a parasitic capacitance between the XIN and XOUT nodes and the power source in the semiconductor chip increases as the number of power source wirings increases in this manner, it is more beneficial to use such a layout configuration example.

<<Chip Layout [4]>>

Figure 12:
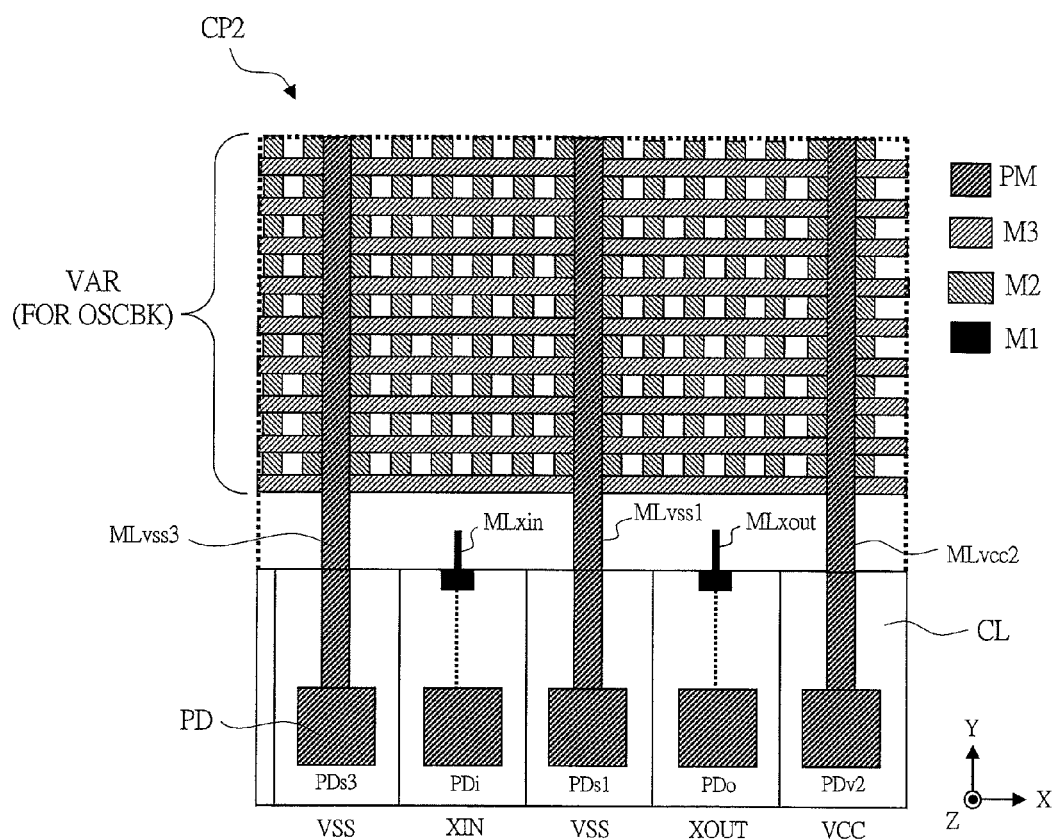
FIG. 12 is a schematic diagram showing a layout configuration example obtained by modifying the layout configuration example shown in FIG. 11.

FIG. 12 is a schematic diagram showing a layout configuration example obtained by modifying the layout configuration example shown in FIG. 11. In the configuration of a semiconductor chip CP2 shown in FIG. 12, compared with FIG. 11, the cell CL including a pad PDs4 for VSS shown in FIG. 11 is replaced with a cell CL including a pad PDv2 for VCC. More specifically, arrangement of the respective pads corresponds to that in the configuration example shown in FIG. 5. A metal wiring MLvcc2 extends from PDv2 toward the inward direction of the chip (in the Y-axis direction). MLvcc2 is formed using the metal wiring layer PM in the uppermost layer, and it is properly connected to the net-like metal wiring in the power feeding region VAR like the case shown in FIG. 11. Also when this layout configuration is used, an effect similar to that obtained in the layout configuration in FIG. 11 can be obtained.

<<Chip Layout [5]>>

Figure 13:
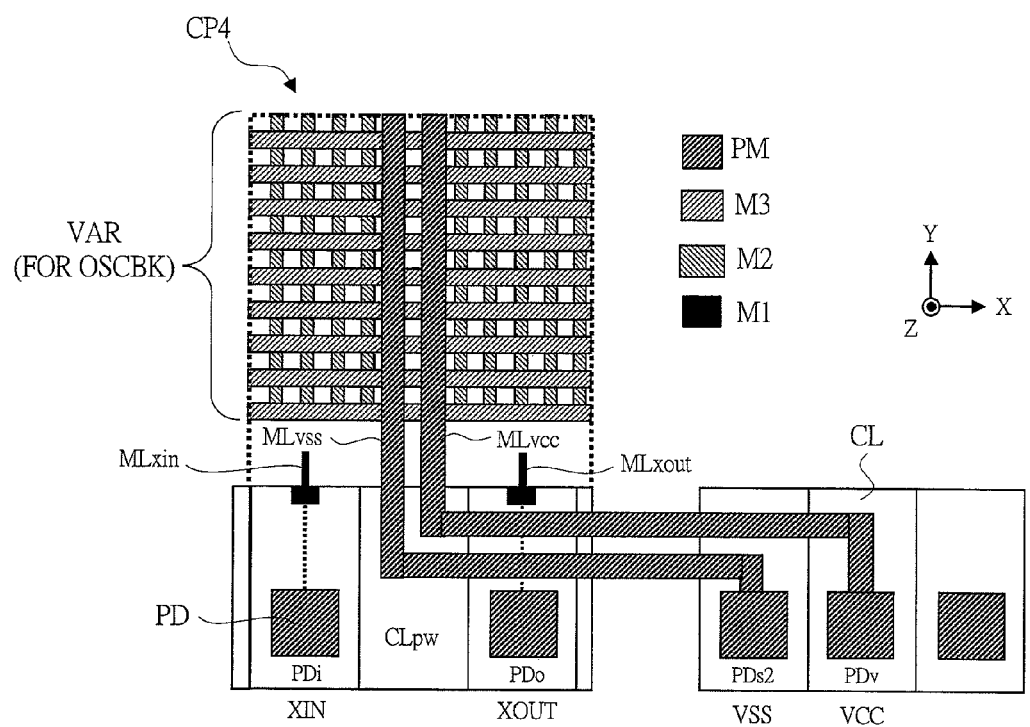
FIG. 13 is a schematic diagram showing a layout configuration example of a main section of a semiconductor chip which is different from that shown in FIG. 9 and others in a crystal oscillation device according to an embodiment of the present invention.

FIG. 13 is a schematic diagram showing a layout configuration example of a main section of a semiconductor chip which is different from that shown in FIG. 9 and others in a crystal oscillation device according to an embodiment of the present invention. A semiconductor chip CP4 shown in FIG. 13 includes three cells CL sequentially arranged along one side of CP4 (in the X-axis direction). The three cells CL are for the oscillation circuit section OSCBK, and the cells CL positioned on both sides of the three cells CL include a pad PDi for XIN and a pad PDo for XOUT, respectively, and the cell CLpw therebetween is a cell for power source supply. Further, in FIG. 13, a cell region for a predetermined circuit block is provided at a position separate from the region of the respective cells for the OSCBK by a predetermined distance. A cell CL including a pad PDs2 for VSS and a cell CL including a pad PDv for VCC are provided in the cell region. More specifically, arrangement of the respective pads corresponds to the configuration example shown in FIG. 2 or FIG. 7.

A metal wiring MLvcc extends from PDv toward CLpw for power source supply in the X-axis direction (along one side of the chip) and after reaching CLpw, it extends in an inward direction of the chip (in the Y-axis direction). Similarly, a metal wiring MLvss extends from PDs2 toward CLpw in the X-axis direction, and after reaching CLpw, it extends in the Y-axis direction in the state of being close to and in parallel with MLvcc. MLvcc and MLvss are formed using the metal wiring layer PM in the uppermost layer. MLvcc and MLvss extending in the Y-axis direction are properly connected to the net-like metal wiring in the power feeding region VAR for OSCBK like the case shown in FIG. 9 and others. Further, metal wirings MLxin and MLxout formed using the first-layered metal wiring layer M1 extend from PDi and PDo in the Y-axis direction like the case shown in FIG. 9 and others. By using the configuration example like this, even if OSCBK is not provided with a dedicated power source, a power source with reduced noise can be supplied to OSCBK and parasitic capacitances of the XIN node and the XOUT node can be reduced for a reason similar to that in the case shown in FIG. 9.

<<Chip Layout [6]>>

Figure 14:
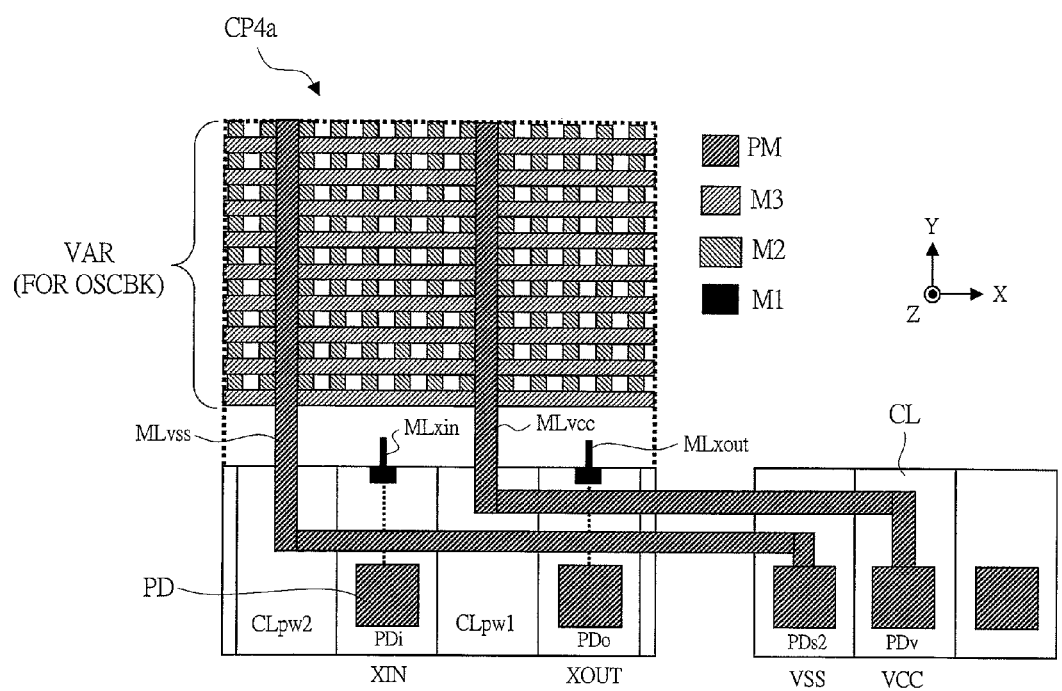
FIG. 14 is a schematic diagram showing a layout configuration example obtained by modifying the layout configuration example shown in FIG. 13.

FIG. 14 is a schematic diagram showing a layout configuration example obtained by modifying the layout configuration example shown in FIG. 13. In the configuration of a semiconductor chip CP4a shown in FIG. 14, compared with FIG. 13, a cell CLpw2 for power source supply is added adjacent to a pad PDi for XIN in addition to the cell CLpw (cell CLpw1 in FIG. 14) for power source supply shown in FIG. 13. More specifically, a cell CL including PDi is sandwiched between CLpw1 and CLpw2 in this configuration example. In FIG. 14, the metal wiring MLvcc from the pad PDv shown in FIG. 13 extends toward CLpw1 in the X-axis direction (along one side of the chip), and after reaching CLpw1, it extends in an inward direction of the chip (in the Y-axis direction). On the other hand, in FIG. 14, the metal wiring MLvss from the pad PDs2 shown in FIG. 13 extends toward CLpw2 in the X-axis direction, and after reaching CLpw2, it extends in the Y-axis direction of the chip. MLvcc and MLvss are properly connected to the net-like metal wiring in the power feeding region VAR like the case shown in FIG. 13.

By using the configuration example like this, a power source with reduced noise can be supplied to OSCBK and the parasitic capacitances of the XIN node and the XOUT node can be reduced like the case shown in FIG. 13. Further, compared with the case shown in FIG. 13, since the cell CL for a pad PDi is sandwiched from both sides thereof between the cells CLpw1 and CLpw2 for power source supply, noise tolerance of the XIN node can be improved. More specifically, since the XIN node is smaller in signal amount and lower in noise tolerance than the XOUT node, it is beneficial to enhance the noise tolerance of the XIN node preferentially.

<<Chip Layout [5']>>

Figure 15:
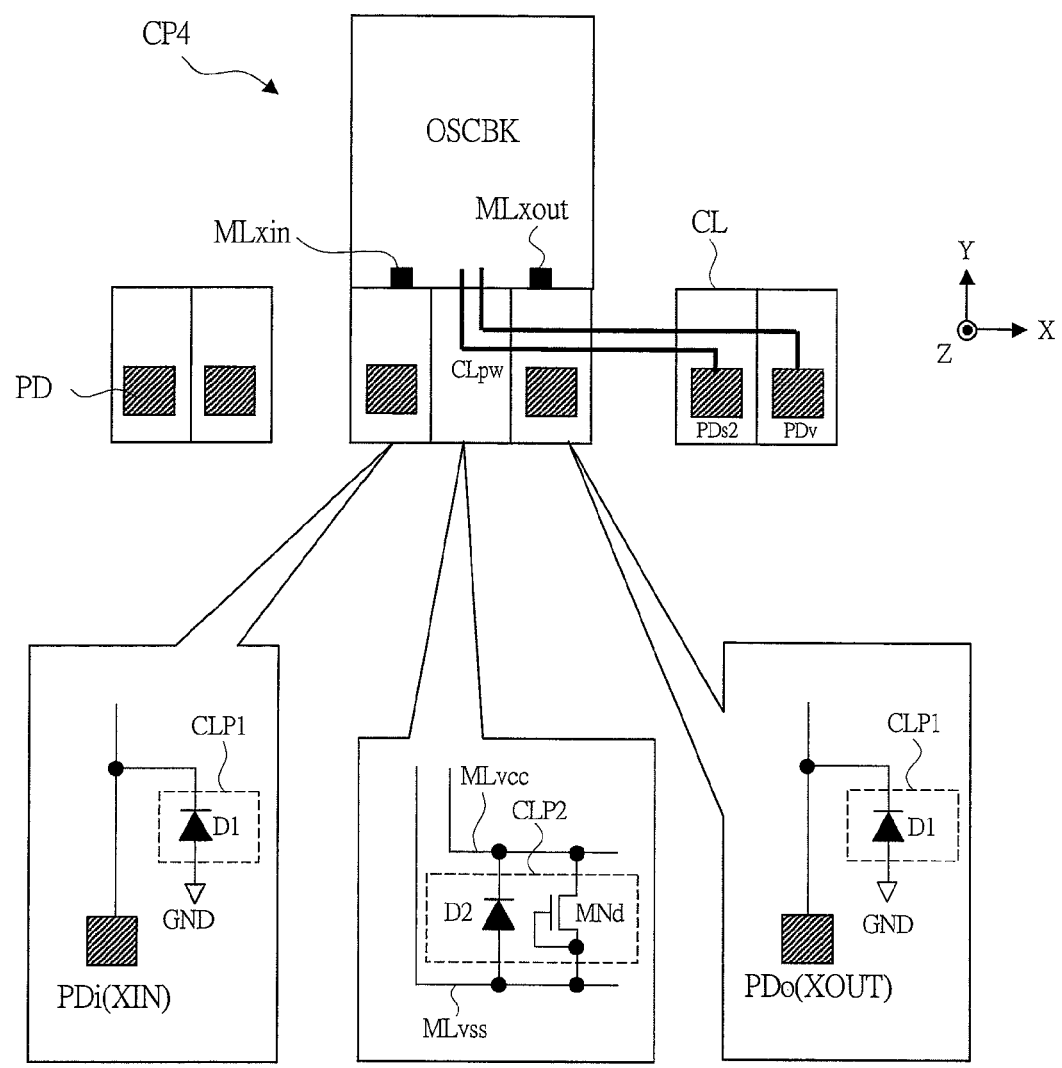
FIG. 15 is a schematic diagram showing a detailed configuration example of respective cells in the configuration example shown in FIG. 13.

FIG. 15 is a schematic diagram showing a detailed configuration example of respective cells in the configuration example shown in FIG. 13. As shown in FIG. 15, an ESD protective element (clamping element) CLP1 is provided in the cell CL including the pad PDi for XIN, and an ESD protective element (clamping element) CLP1 is similarly provided in the cell CL including the pad PDo for XOUT. CLP1 performs clamping between PDi, PDo and the ground power source voltage GND. Further, an ESD protective element (clamping element) CLP2 is provided in the cell CLpw for power source supply. CLP2 performs clamping between the metal wiring MLvcc and the metal wiring MLvss.

CLP2 is made up of, for example, a pn-junction diode D2 having an anode on the side of MLvss and a cathode on the side of MLvcc, an n-channel MOS transistor MNd having a source-drain path connected between MLvcc and MLvss and a gate connected to MLvss, and others. On the other hand, CLP1 is made up of a p-n junction diode D1 having an anode on the side of GND and a cathode on the side of PDi and PDo and others. When a protective element such as MNd is applied in CLP1 for signal, increase of the parasitic capacitance, increase of leakage current and others become excessive, and therefore the p-n junction diode is applied here.

The configuration example shown in FIG. 15 is provided with the following features. First of all, as a ninth feature, the clamping element on the side of the power source voltage (VCC) is not connected to the pads PDi for XIN and PDo for XOUT, and only the clamping element on the side of GND is connected thereto. This is in order that the crystal oscillation device is adapted to a wide range of power source voltage. More specifically, if the clamping element on the side of the power source voltage is connected to PDi and PDo, the capacitance value of the clamping element changes in accordance with the value of the power source voltage, and the values of the parasitic capacitances of the XIN node and the XOUT node may be changed (and the oscillation may become unstable), and such an event has to be prevented.

Subsequently, as a tenth feature, the ESD protective element CLP2 is provided in CLpw. In general, the ESD protective element is provided just near the external terminal (for example, in the cell for PDs2 or PDv), but in this case, since a power source path has a distance from the external terminal to OSCBK, for example, when serge is directly mixed into MLvcc or MLvss, OSCBK may not be sufficiently protected. Therefore, by arranging CLP2 just near OSCBK like the configuration example shown in FIG. 15, sufficient protection of OSCBK from serge becomes possible. Incidentally, the ESD protective element may be arranged just near the external terminal (for example, in the cell for PDs2 or PDv), and it may be omitted in some cases. Incidentally, the configuration example shown in FIG. 13 is taken as an example for the description here, but the ESD protective element for the pad PDi or PDo can be similarly applied also to other configuration examples. Further, the ESD protective element in the cell for power source supply may be similarly applied to, for example, a configuration in which OSCBK is not provided with a dedicated power source including the configuration example shown in FIG. 14.

<<Layout of Semiconductor Package>>

Figure 16:
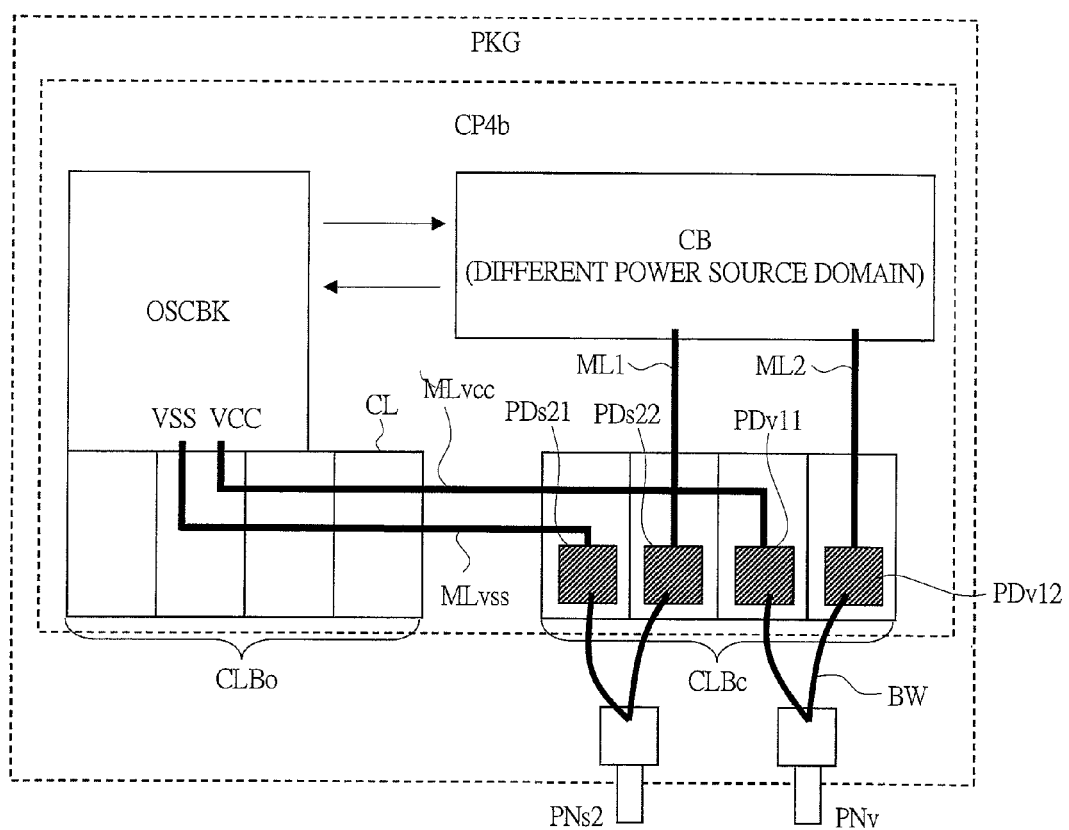
FIG. 16 is a schematic diagram showing one example of a package configuration in a crystal oscillation device according to an embodiment of the present invention.

FIG. 16 is a schematic diagram showing one example of a package configuration in a crystal oscillation device according to an embodiment of the present invention. A semiconductor package PKG shown in FIG. 16 is mounted with a semiconductor chip CP4b which is not provided with a dedicated power source for the oscillation circuit section OSCBK like the configuration example shown in FIG. 13 or the like described above. The semiconductor package PKG is provided with a set of power source terminals composed of an external terminal PNs2 for VSS and an external terminal PNv for VCC, and CP4b in PKG performs a predetermined operation with a power source supplied from the set of power source terminals. CP4b is here provided with a predetermined circuit block CB in addition to OSCBK. Also, in CP4b, a cell region CLBo made up of a plurality of cells CL corresponding to OSCBK is arranged and a cell region CLBc made up of a plurality of cells CL corresponding to CB is arranged so as to separate from CLBo by a fixed distance.

Here, as an eleventh feature, two pads PDs21 and PDs22 are arranged so as to correspond to the external terminal PNs2 and two pads PDv11 and PDv12 are arranged so as to correspond to the external terminal PNv in CLBc. PDs21 and PDs22 are commonly connected to PNs2 via different bonding wires BW, respectively, and PDv11 and PDv12 are commonly connected to PNv via different bonding wires BW, respectively. Metal wirings MLvss and MLvcc extending to OSCBK described in FIG. 13 and others are connected to PDs21 and PDv11, respectively. On the other hand, PDs22 and PDv12 are connected to the circuit block CB via metal wirings ML1 and ML2, respectively.

By using the eleventh feature in this manner, reduction of the power source noise can be realized. For example, when only one set of power sources is provided and there is only one pad corresponding to each of PNs2 and PNv, power source noise from CB comes around to the side of OSCBK via the pad, and the failure in oscillation may occur. Therefore, when two pads are provided so as to correspond to one external terminal and double bonding from the one external terminal to these pads is made like the configuration example shown in FIG. 16, the power source noise from CB comes around to the side of OSCBK via two bonding wires BW. At this time, since BW has an inductance component, the inductance component constitutes a low-pass filter together with the parasitic capacitance of the power source, and as a result, it becomes possible to damp the power source noise coming around from CB to the side of OSCBK. Incidentally, although two pads are caused to correspond to one external terminal here, it is also possible to cause three or more pads to correspond to one external terminal in further expansion.

<<Detailed Layout of Printed Circuit Board>>
<<Circuit Board Layout [1]>>

Figure 17:
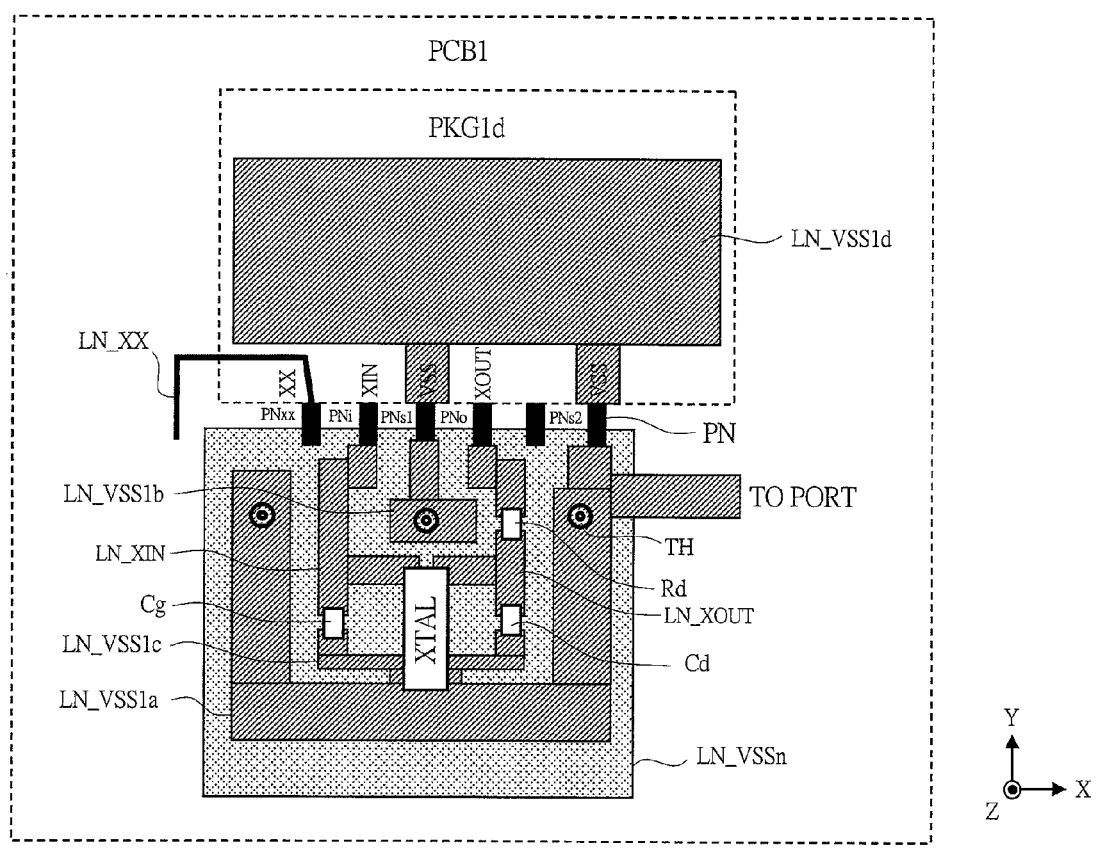
FIG. 17 is a schematic diagram showing a layout configuration example of a printed circuit board which is a constituent element in a crystal oscillation device according to an embodiment of the present invention.

FIG. 17 is a schematic diagram showing a layout configuration example of a printed circuit board which is a constituent element in a crystal oscillation device according to an embodiment of the present invention. In FIG. 17, a semiconductor package PKG1$d$ is mounted on a printed circuit board PCB1. In PKG1$d$, an external terminal PNxx for a predetermined signal XX, an external terminal PNi for XIN, an external terminal PNs1 for VSS, and an external terminal PNo for XOUT are sequentially arranged along the X-axis direction, and an external terminal PNs2 for VSS is arranged with interposing one external terminal therebetween. A wiring pattern LN_VSS1$d$ for VSS is formed in a mounting region of PKG1$d$ in the wiring layer in the uppermost layer of PCB1 (corresponding to the first wiring layer LY1 in FIG. 1B). The above-described two external terminals PNs1 and PNs2 for VSS are connected to this LN_VSS1$d$.

Capacitors Cg and Cd and a quartz crystal unit XTAL as external components are mounted on PCB1. Further, in addition to LN_VSS1$d$, wiring patterns LN_XIN, LN_XOUT, LN_VSS1$a$, LN_VSS1$b$, LN_VSS1$c$, and LN_XX are formed in the wiring layer in the uppermost layer (LY1 in FIG. 1B) in PCB1. LN_XIN has one end connected to PNi for XIN, extends approximately in a Y-axis direction, and has the other end connected to one end of Cg. LN_XOUT has one end connected to PNo for XOUT, extends approximately in the Y-axis direction via a resistor Rd (may be omitted), and has the other end connected to one end of Cd. LN_XIN and LN_XOUT have branched wirings extending in the X-axis direction, and XTAL is connected between a distal end of the branched wiring of LN_XIN and a distal end of the branched wiring of LN_XOUT.

LN_VSS1b has one end connected to PNs1 for VSS, and extends approximately in the Y-axis direction in a region between LN_XIN and LN_XOUT. The other ends of Cg and Cd are connected to the wiring pattern LN_VSS1c for VSS. LN_VSS1a has one end connected to PNs2 for VSS, and it is arranged in an approximately loop shape so as to enclose a formation region or a mounting region of the above-described XTAL, Cg, Cd, LN_XIN, LN_XOUT, LN_VSS1b, and LN_VSS1c. LN_VSS1c is connected to LN_VSS1a in the wiring layer in the uppermost layer (LY1 in FIG. 1B). Further, LN_XX has one end connected to PNxx for XX, and after it extends in an inward direction of PKG1d (after it extends in the mounting portion of PKG1d), it extends in a predetermined direction.

Further, in PCB1, a planar wiring pattern LN_VSSn for VSS is formed in a wiring layer (corresponding to the n-th wiring layer LYn in FIG. 1B) which is a lower layer portion (in the Z-axis direction) positioned below the respective wiring patterns (LN_XIN, LN_XOUT, LN_VSS1a, LN_VSS1b, and LN_VSS1c) in the above-described wiring layer in the uppermost layer. LYn is desirably the lowermost layer, but the present invention is not necessarily limited to this configuration, and LYn may be an intermediate layer positioned between the uppermost layer and the lowermost layer. A portion of the above-described LN_VSS1b positioned near the other end thereof is connected to LN_VSSn via a through hole TH, and portions of LN_VSS1a positioned near one end thereof and near the other end thereof are also connected to LN_VSSn via through holes TH.

Here, the configuration example shown in FIG. 17 has the following features. First of all, the configuration example is provided with the above-described first feature (arrangement of PNs1 between PNi and PNo), the second feature (arrangement of LN_VSS1b between LN_XIN and LN_XOUT), and the fourth feature (arrangement of LN_VSSn in a lower layer), and thus, a reduction effect of the parasitic capacitance between pins, a reduction effect of the coupling noise between pins, improvement effect of noise tolerance, and others can be obtained. Further, as a twelfth feature, after the other ends of the capacitors Cg and Cd are once connected to each other with a short wiring (LN_VSS1c), they are connected to LN_VSS1a. By this means, like the third feature, improvement in noise tolerance can be achieved as compared with the case of direct connection to LN_VSS1a (case of the configuration example shown in FIG. 32). However, in order to further improve noise tolerance, the connection to LN_VSS1b arranged closer to the VSS node of the semiconductor package like the configuration example shown in FIG. 1 and others is more desirable. Further, a thirteenth feature lies in an arrangement direction of the wiring pattern LN_XX. By making LN_XX extend once from PNxx in an inward direction of the semiconductor package, the parasitic capacitance and the coupling noise between itself and the XIN node can be reduced as compared with the case where it extends in an outward direction (case of the configuration example shown in FIG. 32), and the noise tolerance of the XIN node can be improved.

Incidentally, in FIG. 17, a portion of the wiring pattern LN_VSS1a for VSS positioned near the external terminal PNs2 for VSS is connected to a port (PORT) for VSS. The port (PORT) for VSS means a VSS terminal of a power source generating device (DC-DC converter or the like) (not shown) mounted on the printed circuit board. A connection position of the port (PORT) is not particularly limited to this, but it is desirable to set the connection position to a position as close to the VSS node (external terminal for VSS) of the semiconductor package as possible. From this viewpoint, it is possible to set the connection position at, for example, LN_VSS1d or the like. On the other hand, when the connection position is set at an end portion which is not on the side of PNs2 of LN_VSS1a as a comparative example, since a current flows from PNs2 to the port (PORT) via the whole LN_VSS1a by the oscillating operation, it is not desirable in view of the noise tolerance.

<<Circuit Board Layout [2]>>

Figure 18:
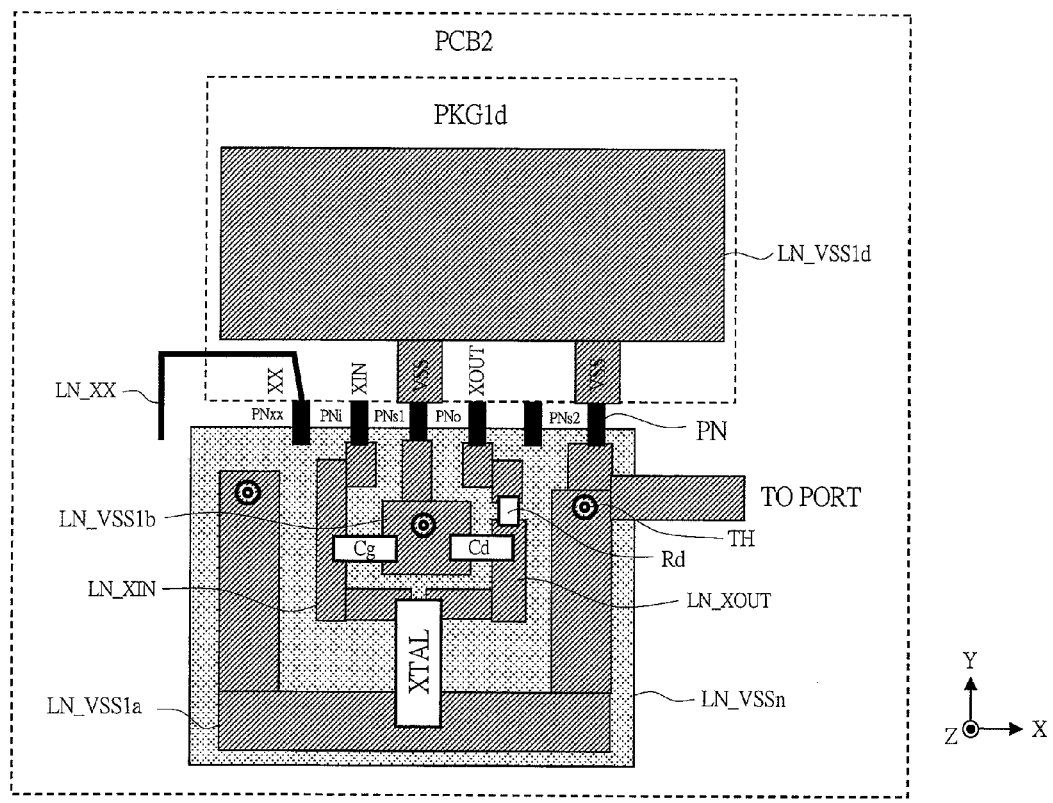
FIG. 18 is a schematic diagram showing another layout configuration example of a printed circuit board which is a constituent element in a crystal oscillation device according to an embodiment of the present invention.

FIG. 18 is a schematic diagram showing another layout configuration example of a printed circuit board which is a constituent element in a crystal oscillation device according to an embodiment of the present invention. In FIG. 18, a semiconductor package PKG1d and external components (capacitors Cg and Cd, resistor Rd, and quartz crystal unit XTAL) similar to those shown in FIG. 17 are mounted on a printed circuit board PCB2, and wiring patterns approximately similar to those shown in FIG. 17 are formed thereon. Different points from the configuration example shown in FIG. 17 are the next two points. First, XTAL is connected between a terminal of the wiring pattern LN_XIN extending from the external terminal PNi for XIN and a terminal of the wiring pattern LN_XOUT extending from the external terminal PNo for XOUT. Second, one ends of Cg and Cd are connected to the wiring pattern LN_VSS1b extending from the external terminal PNs1 for VSS, and the other end of Cg and the other end of Cd are connected to LN_XIN and LN_XOUT, respectively. Thus, the configuration example shown in FIG. 18 is provided with the third feature (one ends of Cg and Cd are connected to LN_VSS1b) described in FIG. 1 instead of the twelfth feature described in FIG. 17. By this means, further improvement in noise tolerance can be expected as compared with the configuration example shown in FIG. 17. Incidentally, the other features are the same as those in the case shown in FIG. 17.

<<Circuit Board Layout [3]>>

Figure 19:
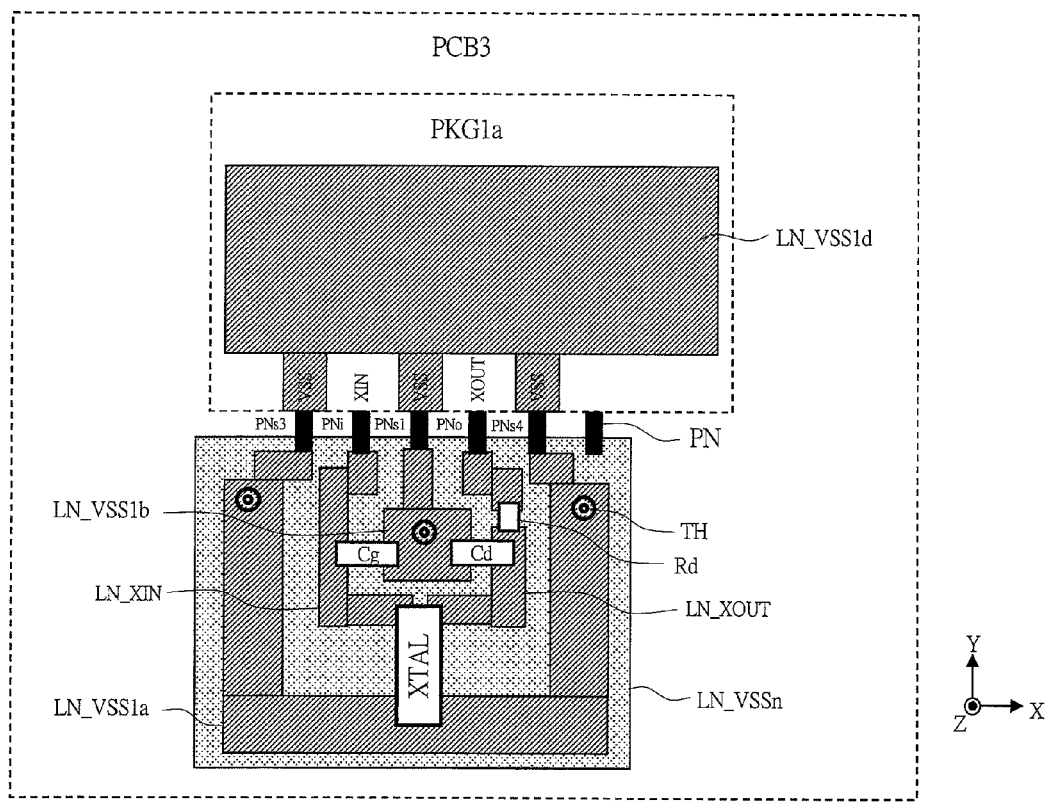
FIG. 19 is a schematic diagram showing a layout configuration example obtained by modifying the layout configuration example shown in FIG. 18.

FIG. 19 is a schematic diagram showing a layout configuration example obtained by modifying the layout configuration example shown in FIG. 18. In FIG. 19, a semiconductor package PKG1a provided with external terminals PN different from those of the case shown in FIG. 18 is mounted on the printed circuit board PCB3. In PKG1a, an external terminal PNs3 for VSS, an external terminal PNi for XIN, an external terminal PNs1 for VSS, an external terminal PNo for XOUT, and an external terminal PNs4 for VSS are sequentially arranged along the X-axis direction. More specifically, each of PNi and PNo is sandwiched between VSS and VSS like the above-described configuration example shown in FIG. 4.

On PCB3, the above-described three external terminals PNs3, PNs1, and pNs4 for VSS are connected to the wiring pattern LN_VSS1d for VSS formed on the mounting portion of PKG1a. The respective wiring patterns LN_XIN, LN_VSS1b, and LN_XOUT extending from PNi, PNs1, and PNo and the respective external components (capacitors Cg and Cd, resistor Rd, and quartz crystal unit XTAL) connected thereto are mounted in the same manner as those in the configuration example shown in FIG. 18. Here, the configuration example shown in FIG. 19 and the configuration example shown in FIG. 18 are slightly different in the configuration of the wiring pattern LN_VSS1a for VSS. LN_VSS1a is formed in an approximately loop shape starting from PNs2 and a terminal point of LN_VSS1a is put in an open state in the wiring layer in the uppermost layer (LY1 shown in FIG. 1B) in the configuration example shown in FIG. 18, but LN_VSS1a is formed so as to make a complete loop between PNs4 and PNs3 in the configuration example shown in FIG.

19. More specifically, a complete loop is formed by LN_VSS1a and LN_VSS1d in the wiring layer in the uppermost layer.

When the configuration example like this is used, since the XIN node, the XOUT node, and various external components can be completely guarded by a loop wiring to be the VSS node in addition to the various effects described in FIG. 18, further improvement in noise tolerance can be expected as compared with the configuration example shown in FIG. 18. However, since the loop wiring functions as a loop antenna, the reduction in noise tolerance is concerned, but no particular problem occurs here because the planar wiring pattern LN_VSSn for VSS is provided in the lower layer as described in the fourth feature. Incidentally, if LN_VSSn is not provided, since LN_VSS1a in the configuration example shown in FIG. 18 is opened at its one end, it does not function as a loop antenna, but it functions as a monopole antenna in some cases. In this case, resonance occurs with a frequency corresponding to a wiring length of LN_VSS1a, so that noise with the frequency may occur. Further, the connection position of the port for VSS is not shown in FIG. 19, but the connection position can be set, for example, near PNs4 in LN_VSS1a, near PNs3 in LN_VSS1a, at LN_VSS1d or the like.

<<Circuit Board Layout [4]>>

Figure 20:
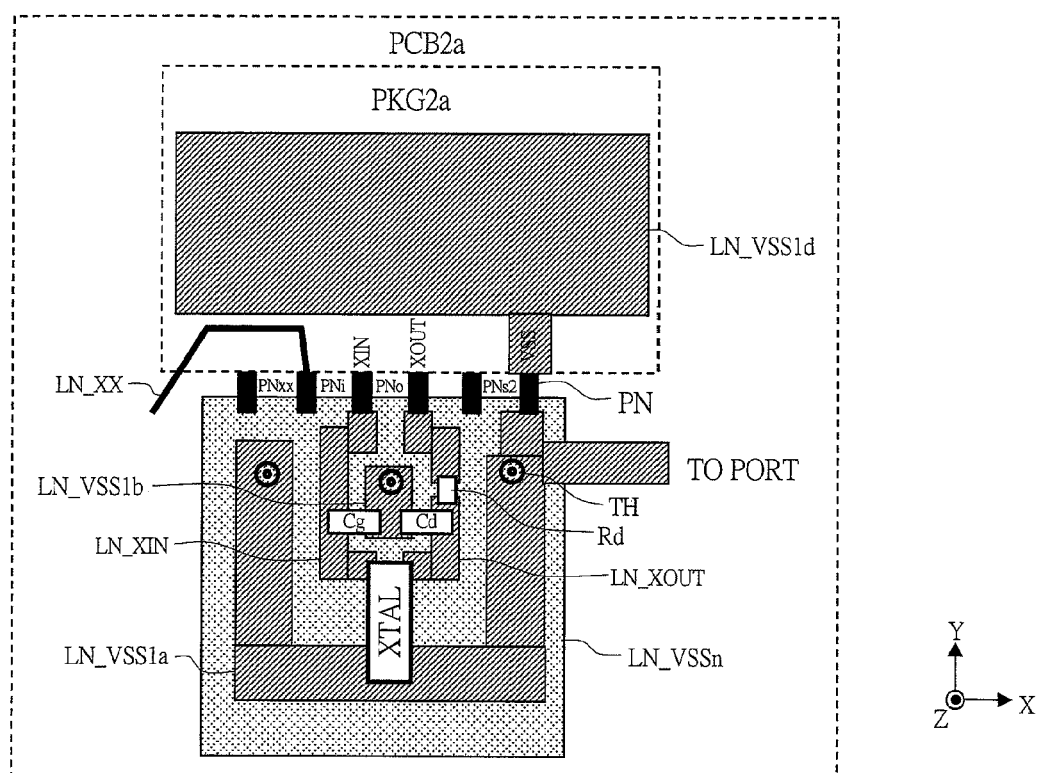
FIG. 20 is a schematic diagram showing another layout configuration example obtained by modifying the layout configuration example shown in FIG. 18.

FIG. 20 is a schematic diagram showing another layout configuration example obtained by modifying the layout configuration example shown in FIG. 18. In FIG. 20, a semiconductor package PKG2a provided with external terminals different from those in the configuration example shown in FIG. 18 is mounted on the printed circuit board PCB2a. In PKG2a, an external terminal PNxx for a predetermined signal XX, an external terminal PNi for XIN and an external terminal PNo for XOUT are sequentially arranged along the X-axis direction, and an external terminal PNs2 for VSS is arranged adjacent to the external terminal PNo for XOUT with interposing one external terminal therebetween. More specifically, in the configuration example shown in FIG. 20, PNi and PNo are arranged adjacent to each other like the above-described configuration examples shown in FIG. 2, FIG. 7, and others.

On the PCB2a, the above-described external terminal PNs2 for VSS is connected to the wiring pattern LN_VSS1d for VSS formed on the mounting portion of PKG2a. The respective wiring patterns LN_XX, LN_XIN, LN_XOUT, and LN_VSS1a extending from the respective external terminals PNxx, PNi, PNo, and PNs2 are similar to those in the case shown in FIG. 18. However, since the external terminal for VSS is not provided between PNi and PNo here, the wiring pattern LN_VSS1b for VSS is arranged on a region between LN_XIN and LN_XOUT an island shape in isolation. LN_VSS1b is connected to the wiring pattern LN_VSSn for VSS in a lower layer thereof via a through hole TH. Further, the various external components (capacitors Cg and Cd, resistor Rd, and quartz crystal unit XTAL) are mounted in the same manner as those in the case shown in FIG. 18.

When the configuration example like this is used, even if the external terminal PNi for XIN and the external terminal PNo for XOUT are arranged adjacent to each other, the parasitic capacitance and the coupling noise between pins in the XIN node and the XOUT node can be reduced by providing LN_VSS1b as described in the second feature. Further, as described in the third feature, improvement in noise tolerance can be achieved by connecting one ends of Cg and Cd to this LN_VSS1b. Incidentally, the other features and effects are the same as those in the case shown in FIG. 18.

<<Circuit Board Layout [5]>>

Figure 21:
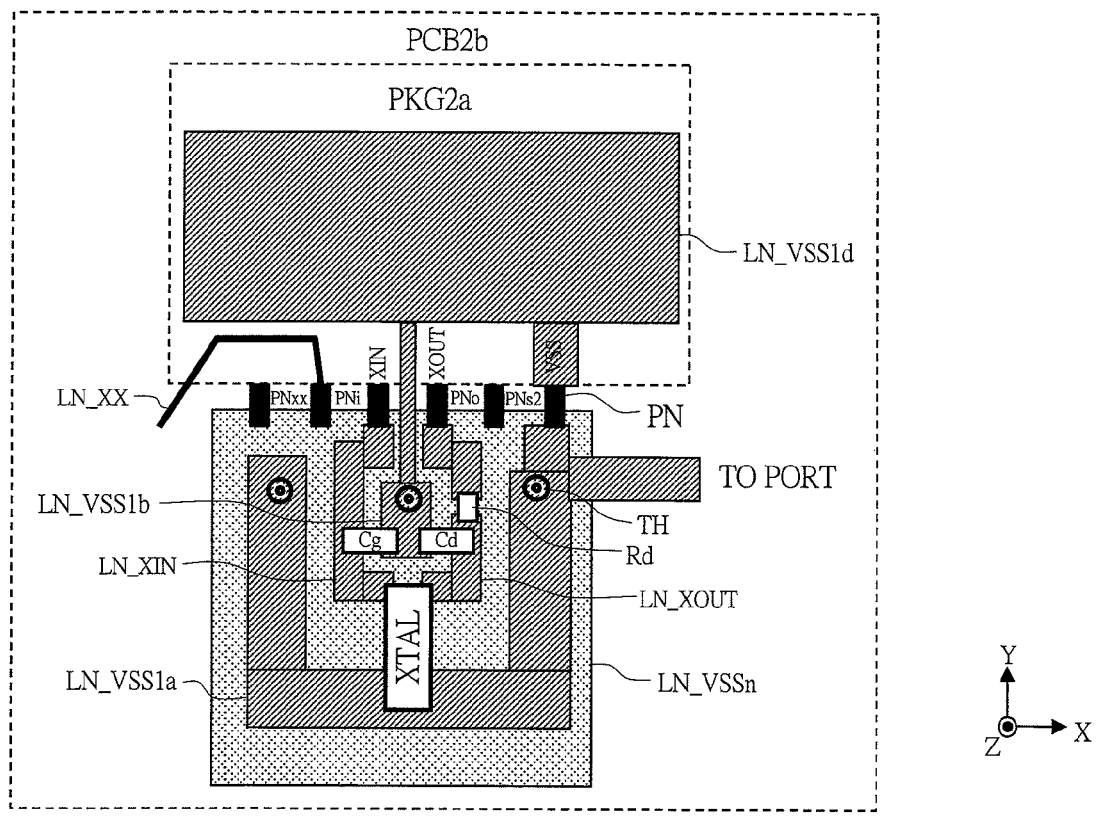
FIG. 21 is a schematic diagram showing a layout configuration example obtained by modifying the layout configuration example shown in FIG. 20.

FIG. 21 is a schematic diagram showing a layout configuration example obtained by modifying the layout configuration example shown in FIG. 20. A semiconductor package PKG2a and various external components (capacitors Cg and Cd, resistor Rd, and quartz crystal unit XTAL) similar to those in the case shown in FIG. 20 are mounted on a printed circuit board PCB2b shown in FIG. 21, and various wiring patterns similar to those in the case shown in FIG. 20 are formed thereon. A difference between the configuration example shown in FIG. 21 and the configuration example shown in FIG. 20 lies in that the wiring pattern LN_VSS1b is arranged in an island shape in isolation in the configuration example shown in FIG. 20, while the wiring pattern LN_VSS1b is connected to the wiring pattern LN_VSS1d for VSS formed in the mounting portion of PKG2a by the use of a space between the external terminal PNi and the external terminal PNo in the configuration example shown in FIG. 21.

When the configuration example like this is used, further improvement in noise tolerance can be realized in addition to various effects described in FIG. 20. More specifically, in the configuration example shown in FIG. 20, there is a possibility that inconsistency of VSS level may occur because a distance is provided between the VSS node and the wiring pattern LN_VSS1b in PKG2a, but the distance can be reduced by using the configuration example shown in FIG. 21, so that occurrence of power source noise due to inconsistency of the VSS level can be suppressed.

<<Circuit Board Layout [6]>>

Figure 22:
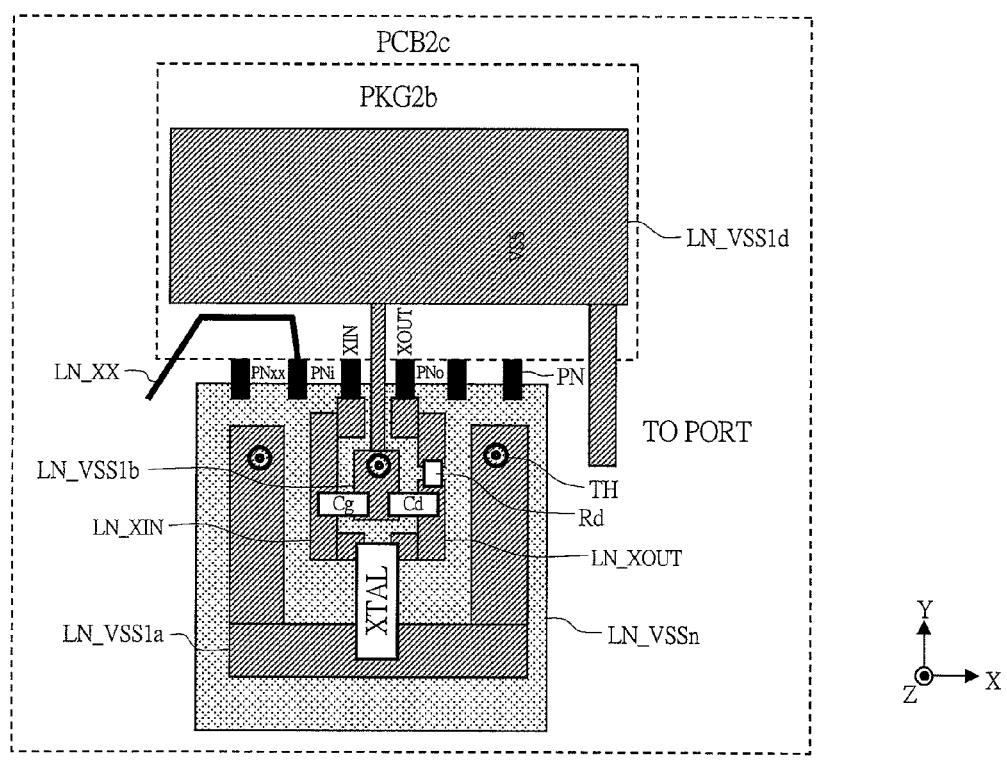
FIG. 22 is a schematic diagram showing a layout configuration example obtained by modifying the layout configuration example shown in FIG. 21.

FIG. 22 is a schematic diagram showing a layout configuration example obtained by modifying the layout configuration example shown in FIG. 21. A semiconductor package PKG2b different from that in the case shown in FIG. 21 is mounted on a printed circuit board PCB2c shown in FIG. 22. In the configuration of the semiconductor package PKG2b shown in FIG. 22, an external terminal for VSS (PNs2 in FIG. 21) is not provided near the external terminal PNi for XIN or the external terminal PNo for XOUT unlike PKG2a shown in FIG. 21. Wiring patterns and a mounting method of various external components in PCB2c are approximately the same as those in PCB2b shown in FIG. 21.

Here, as a difference between the configuration examples shown in FIG. 22 and FIG. 21, since the external terminal for VSS is not provided in FIG. 22, both ends of the wiring pattern LN_VSS1a for VSS formed in an approximately loop shape are put in an open state in the wiring layer in the uppermost layer (LY1 in FIG. 1B). When the configuration example like this is used, even if the external terminal for VSS is not provided near PNi or PNo, an effect approximately similar to that obtained in FIG. 21 can be obtained. Incidentally, an example where the port (PORT) for VSS is connected to the wiring pattern LN_VSS1d for VSS is shown, but the configuration example is not limited to this.

<<Circuit Board Layout [7]>>

Figure 23:
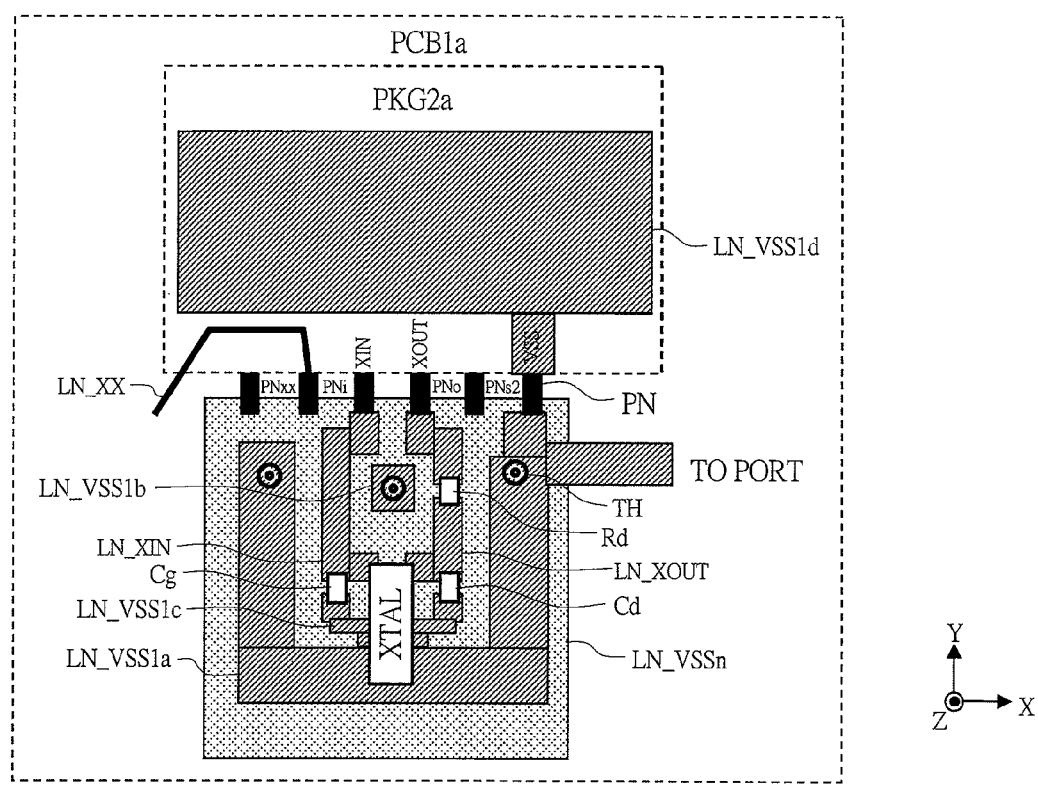
FIG. 23 is a schematic diagram showing a layout configuration example obtained by modifying the layout configuration example shown in FIG. 17.

FIG. 23 is a schematic diagram showing a layout configuration example obtained by modifying the layout configuration example shown in FIG. 17. A semiconductor package PKG2a different from that shown in FIG. 17 is mounted on a printed circuit board PCB1a shown in FIG. 23. In the semiconductor package PKG2a, as described in FIG. 20 and others, an external terminal PNxx for a predetermined signal XX, an external terminal PNi for XIN and an external terminal PNo for XOUT are sequentially arranged along the X-axis direction, and an external terminal PNs2 for VSS is arranged adjacent to the external terminal PNo for XOUT with interposing one external terminal therebetween. More specifically, in the configuration example shown in FIG. 23, an external terminal for VSS is not provided between PNi and PNo unlike PKG1*d* shown in FIG. 17.

Accordingly, in PCB1*a* in FIG. 23, a wiring pattern LN_VSS1*b* for VSS is arranged in an island shape in isolation in a region between the wiring pattern LN_XIN for XIN and the wiring pattern LN_XOUT for XOUT. LN_VSS1*b* is connected to the wiring pattern LN_VSSn for VSS in a lower layer via a through hole TH. The configuration other than these is similar to that shown in FIG. 17. When the configuration example like this is used, even when PNi and PNo are arranged adjacent to each other, as described in the second feature, the parasitic capacitance and the coupling noise between pins in the XIN node and the XOUT node can be reduced by providing LN_VSS1*b*.

<<Circuit Board Layout [8]>>

Figure 24:
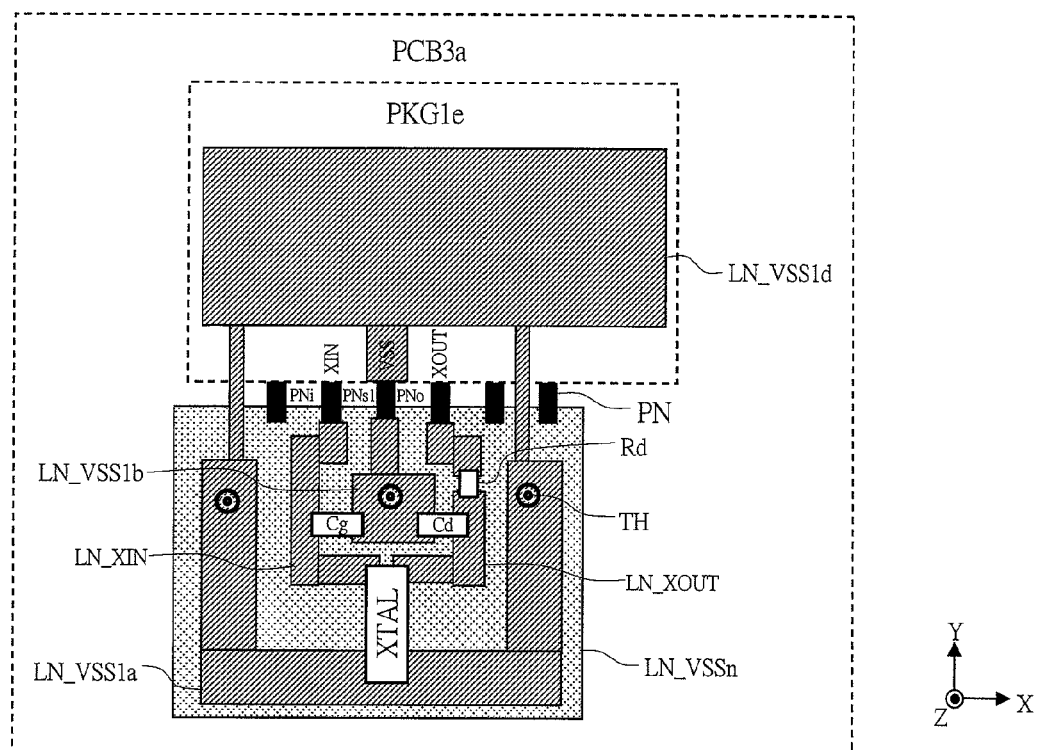
FIG. 24 is a schematic diagram showing a layout configuration example obtained by modifying the layout configuration example shown in FIG. 19.

FIG. 24 is a schematic diagram showing a layout configuration example obtained by modifying the layout configuration example shown in FIG. 19. A semiconductor package PKG1*e* different from that shown in FIG. 19 is mounted on a printed circuit board PCB3*a* shown in FIG. 24. In the semiconductor package PKG1*e*, an external terminal PNi for XIN, an external terminal PNs1 for VSS, and an external terminal PNo for XOUT are sequentially arranged along the X-axis direction. However, in the configuration example shown in FIG. 24, an external terminal for VSS except for PNs1 is not provided near PNi and PNo unlike the case shown in FIG. 19.

Accordingly, in PCB3*a* shown in FIG. 24, both ends of the wiring pattern LN_VSS1*a* for VSS are connected to a wiring pattern LN_VSS1*d* for VSS formed in the mounting portion of PKG1*e* by the use of a space between the external terminals PN adjacent to each other. Therefore, also in this case, a loop wiring is formed by LN_VSS1*a* and LN_VSS1*d* like the configuration example shown in FIG. 19. The other configurations are similar to those shown in FIG. 19. When the configuration example like this is used, even when the external terminal for VSS is not sufficiently provided near PNi or PNo, an effect approximately similar to that in the case shown in FIG. 19 can be obtained.

<<Circuit Board Layout [9]>>

Figure 25:
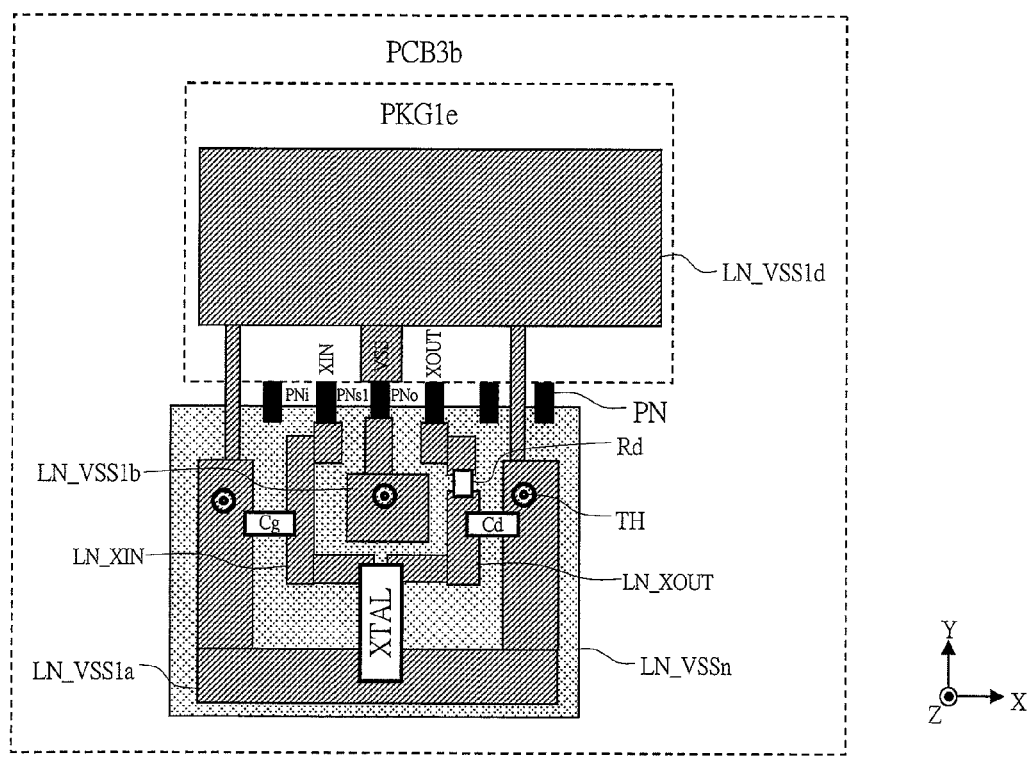
FIG. 25 is a schematic diagram showing a layout configuration example obtained by modifying the layout configuration example shown in FIG. 24.

FIG. 25 is a schematic diagram showing a layout configuration example obtained by modifying the layout configuration example shown in FIG. 24. A semiconductor package PKG1*e* similar to that shown in FIG. 24 is mounted on a printed circuit board PCB3*b* shown in FIG. 25, and various wiring patterns similar to those shown in FIG. 24 are formed thereon. A difference between the configuration example shown in FIG. 25 and the configuration example shown in FIG. 24 lies in that one ends of capacitors Cg and Cd are connected to the wiring pattern LN_VSS1*b* for VSS in the configuration example shown in FIG. 24, while they are connected to the wiring pattern LN_VSS1*a* for VSS in the configuration example shown in FIG. 25. When the configuration example shown in FIG. 25 and the configuration example shown in FIG. 24 are compared with each other, the configuration example shown in FIG. 24 is desirable from the viewpoint of noise tolerance as described in the third feature. However, when compared with the configuration example shown in FIG. 32, sufficient effect of noise tolerance improvement can be obtained in FIG. 25 because of the first and second features (VSS node is provided between the XIN node and the XOUT node) and the fourth feature (LN_VSSn is provided in the lower layer) and the presence of the loop wiring made up of LN_VSS1*a* and LN_VSS1*d*.

<<Circuit Board Layout [10]>>

Figure 26:
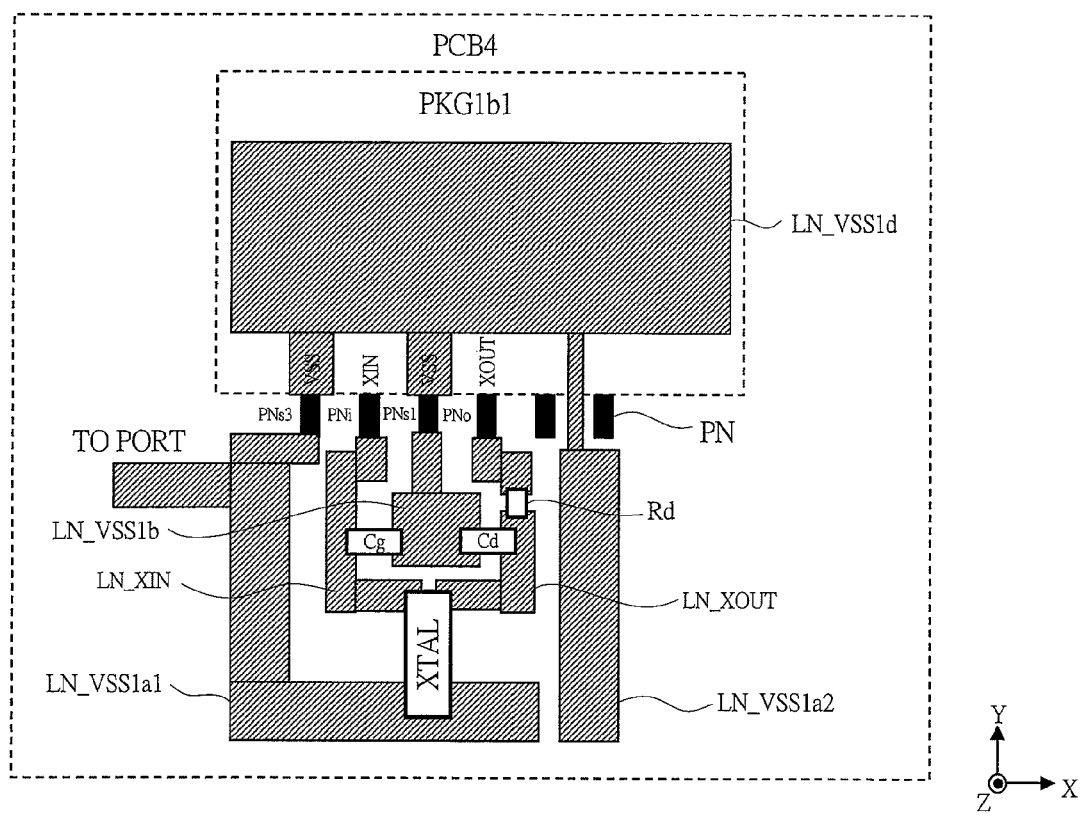
FIG. 26 is a schematic diagram showing still another layout configuration example of a printed circuit board which is a constituent element in a crystal oscillation device according to an embodiment of the present invention.

FIG. 26 is a schematic diagram showing still another layout configuration example of a printed circuit board which is a constituent element in a crystal oscillation device according to an embodiment of the present invention. A semiconductor package PKG1*b*1 is mounted on a printed circuit board PCB4 shown in FIG. 26. In PKG1*b*1, an external terminal PNs3 for VSS, an external terminal PNi for XIN, an external terminal PNs1 for VSS, and an external terminal PNo for XOUT are sequentially arranged in the X-axis direction. Incidentally, the arrangement of the external terminals is similar to that in the configuration example shown in FIG. 5. A wiring pattern LN_VSS1*d* for VSS is formed in the mounting portion of PKG1*b*1 in the wiring layer in the uppermost layer (LY1 in FIG. 1B) of PCB4. The above-described two external terminals PNs1 and PNs3 for VSS are connected to this LN_VSS1*d*.

Respective wiring patterns LN_XIN, LN_VSS1*b*, and LN_XOUT connected to PNi, PNs1, and PNo are similar to the wiring patterns shown in FIG. 18, and a mounting method of various external components (capacitors Cg and Cd, resistor Rd, and quartz crystal unit XTAL) is similar to that in the case shown in FIG. 18. However, in the configuration example here, a wiring pattern for VSS (LN_VSSn shown in FIG. 18) is not provided in the lower layer unlike the case shown in FIG. 18. This is because it is assumed that, for example, when a printed circuit board PCB4 whose thickness (in the Z-axis direction) is very small is used, a parasitic capacitance due to the wiring pattern for VSS in a lower layer in the printed circuit board PCB4 becomes excessive.

In this case, it is necessary to prevent a function of a loop antenna from occurring while sufficiently guarding the formation region of LN_XIN, LN_XOUT, and LN_VSS1*b* and the mounting region of various external components by the use of the VSS node. Therefore, an approximately L-shaped wiring pattern LN_VSS1*a*1 extending from PNs3 in the Y-axis direction and then extending in the X-axis direction and a wiring pattern LN_VSS1*a*2 extending from LN_VSS1*d* around LN_XOUT through a space between the external terminals PN positioned adjacent to each other in the Y-axis direction are provided here. A slight clearance is provided between a terminal portion of LN_VSS1*a*1 and a terminal portion of LN_VSS1*a*2 so that a complete loop wiring is not formed. A position of the clearance is located at a position far from the whole of LN_XIN and LN_XOUT, and the position is located at the position further from LN_XIN than from LN_XOUT. When the configuration example like this is used, even if a very thin printed circuit board is used, various effects described above can be achieved to some extent.

<<Circuit Board Layout [11]>>

Figure 27:
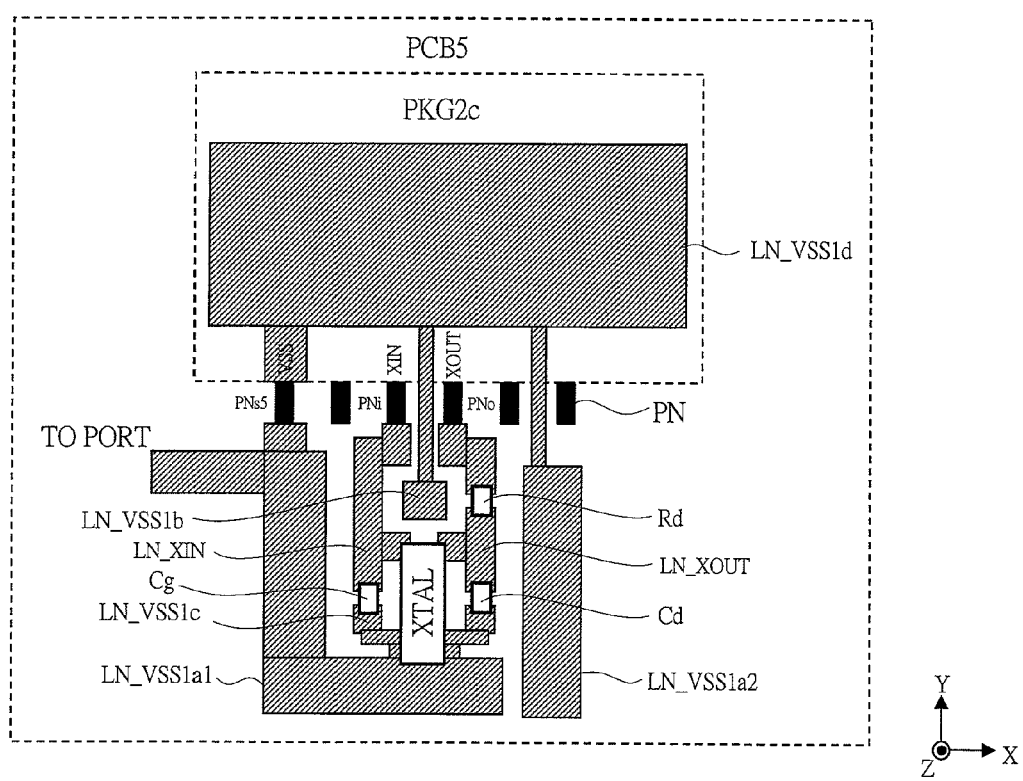
FIG. 27 is a schematic diagram showing a layout configuration example obtained by modifying the layout configuration example shown in FIG. 26.

FIG. 27 is a schematic diagram showing a layout configuration example obtained by modifying the layout configuration example shown in FIG. 26. The configuration example shown in FIG. 27 is not provided with a wiring pattern for VSS in a lower layer and it is adapted to a very thin printed circuit board like the configuration shown in FIG. 26. A semiconductor package PKG2*c* is mounted on a printed circuit board PCB5 shown in FIG. 27. In PKG2*c*, an external terminal PNs5 for VSS is arranged, and an external terminal PNi for XIN and an external terminal PNo for XOUT are sequentially arranged in the X-axis direction adjacent to the external terminal PNs5 for VSS with interposing one external terminal therebetween.

A wiring pattern LN_VSS1*a*1 connected to PNs5 and a wiring pattern LN_VSS1*a*2 connected to LN_VSS1*d* are provided in PCB5 like the case shown in FIG. 26. Respective wiring patterns LN_XIN and LN_XOUT connected to PNi and PNo and a mounting method of various external components (capacitors Cg and Cd, resistor RD, and quartz crystal unit XTAL) are approximately similar to those in the configuration example shown in FIG. 17. However, the wiring pattern LN_VSS1b for VSS arranged between LN_XIN and LN_X-OUT is connected to LN_VSS1d by the use of a space between PNi and PNo. When the configuration example like this is used, an effect similar to that obtained in the configuration example shown in FIG. 26 can be obtained.

<<Detailed Layout of Semiconductor Package and Chip>>
<<Layout [1]>>

Figure 28:
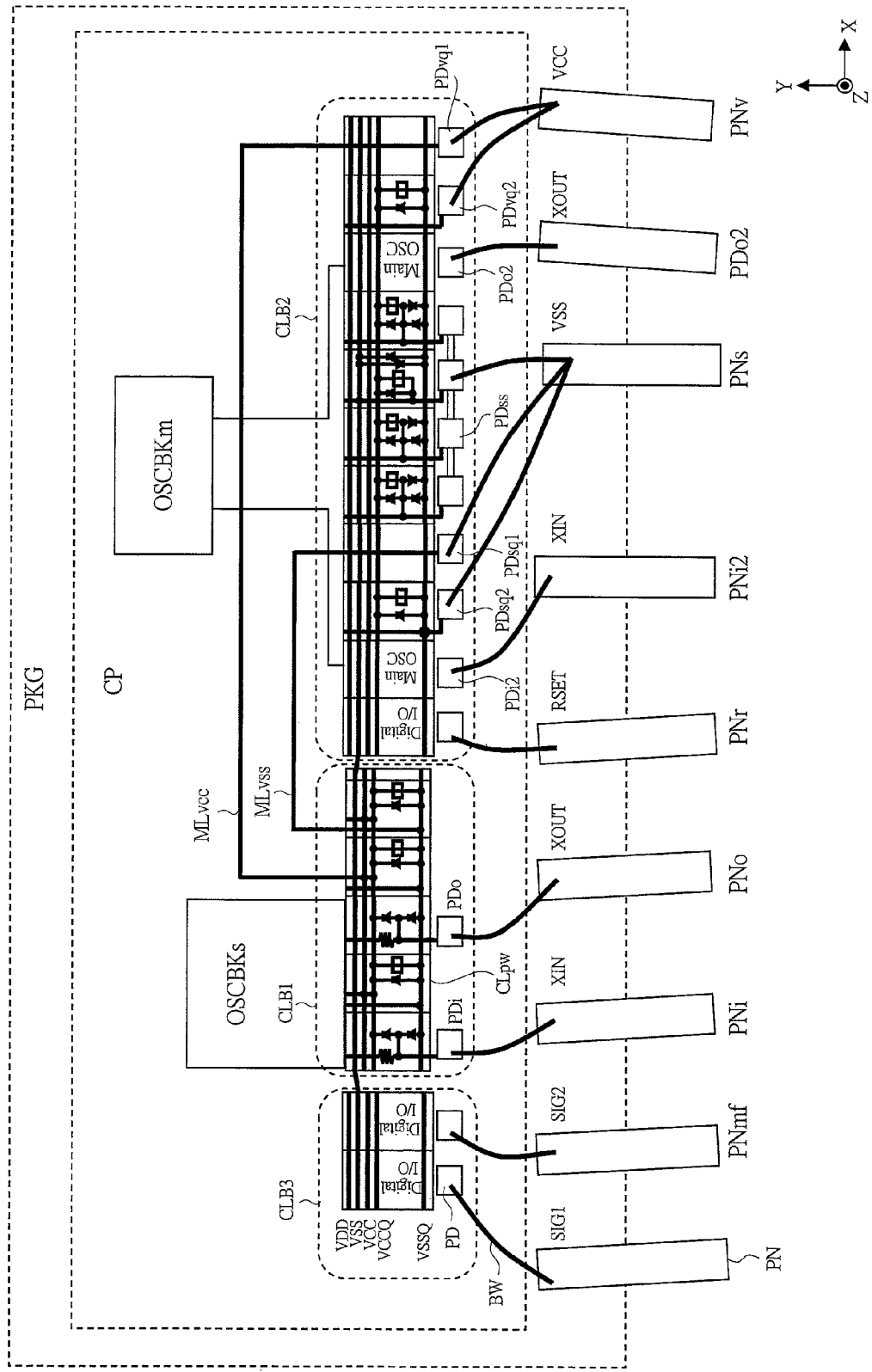
FIG. 28 is a diagram showing a detailed layout configuration example of a semiconductor package and a semiconductor chip which are constituent elements in a crystal oscillation device according to an embodiment of the present invention.

FIG. 28 is a diagram showing a detailed layout configuration example of a semiconductor package and a semiconductor chip which are constituent elements in a crystal oscillation device according to an embodiment of the present invention. The configuration example shown in FIG. 28 reflects various features described above properly. In the semiconductor package PKG shown in FIG. 28, an external terminal PNmf for a set signal, an external terminal PNi for XIN, an external terminal PNo for XOUT, an external terminal PNr for a reset signal, an external terminal PNi2 for XIN, an external terminal PNs for VSS, an external terminal PDo2 for XOUT, and an external terminal PNv for VCC are sequentially arranged along the X-axis direction. Further, an oscillation circuit section OSCBKs for a sub-clock signal and an oscillation circuit section OSCBKm for a main clock signal are formed in the semiconductor chip CP.

OSCBKs and OSCBKm are both provided with an inverter circuit IV, a feedback resistor RF, and others described in FIG. 30, but frequencies of oscillation signals to be generated thereby are different from each other. OSCBKm generates an oscillation signal with a frequency of, for example, several MHz to several tens MHz or the like, and OSCBKs generates an oscillation signal with a frequency of, for example, less than 1 MHz typified by 32 kHz or the like. The above-described PNi and PNo are signal terminals for OSCBKs, and PNi2 and PNo2 are signal terminals for OSCBKm. A low CL value (for example, CL value=3 to 7 pF)—adapted quartz crystal unit (not shown) as an external component is connected between PNi and PNo. As the quartz crystal unit, a tuning-fork quartz crystal unit is typically used. On the other hand, a quartz crystal unit (not shown) as an external component is also connected between PNi2 and PNo2. As the quartz crystal unit, an AT-cut quartz crystal unit is typically used.

A cell region CLB1 corresponding to OSCBKs, a cell region CLB2 corresponding to OSCBKm, and the other common cell region CLB3 are provided along the X-axis direction in the semiconductor chip CP. CLB1 is arranged between CLB2 and CLB3 in the X-axis direction, and a certain distance is secured between CLB2 and CLB3. The external terminal PNs is connected to three kinds of pads PDsq1, PDsq2, and PDss formed in CLB2 via three bonding wires BW. The external terminal PNv is connected to two kinds of pads PDvq1 and PDvq2 formed in CLB2 via two bonding wires BW. Among them, PDvq1 and PDsq1 are properly connected to respective power source supply lines (VCCQ, VSSQ, and the like) in CLB1 via metal wirings MLvcc and MLvss. Further, PDvq2 and PDsq2 are properly connected to respective power source supply lines (VCCQ, VSSQ, and the like) in CLB2. The respective power source supply lines in CLB1 and the respective power source supply lines in CLB2 are basically formed in a separate manner except that one common ground power source voltage line (VSS) is provided.

In the cell region CLB1, a pad PDi for XIN and a pad PDo for XOUT are formed, and a cell CLpw for power source supply is provided between a cell corresponding to PDi and a cell corresponding to PDo. Further, CLB1 is provided with two cells that receive power source supply from the above-described MLvcc and MLvss, and power source supply from the cells is transmitted to CLpw via respective power source supply lines and it is supplied into OSCBKs via the CLpw. The ESD protective elements are provided in the two cells and CLpw supplied with the power source supply.

In the configuration example described above, OSCBKm has the configuration in which PNi2 is sandwiched between PNr and PNs, PDo2 is sandwiched between PNs and PNv, and respective pads corresponding thereto sandwich the XIN node and the XOUT node properly. Therefore, reduction of the coupling noise between pins, improvement in noise tolerance in the XIN node and the XOUT node, and the like can be sufficiently achieved. On the other hand, in OSCBKs, since PNi and PNo are arranged adjacent to each other, increases of the parasitic capacitance and coupling noise between pins are concerned, and reduction of noise tolerance of the XIN node and the XOUT node is also concerned. Therefore, by providing the cell CLpw for power source supply between the cell corresponding to PDi and the cell corresponding to PDo, the parasitic capacitance and the coupling noise are reduced, and by securing a certain distance between CLB1 and CLB2 and between CLB1 and CLB3 and forming respective power source supply lines so as to be separated from one another, the noise tolerance is enhanced. Incidentally, since PNr and PNmf are for a reset signal and for a set signal, they are not frequently fluctuated, and improvement of the noise tolerance is possible from this viewpoint.

<<Layout [2]>>

Figure 29:
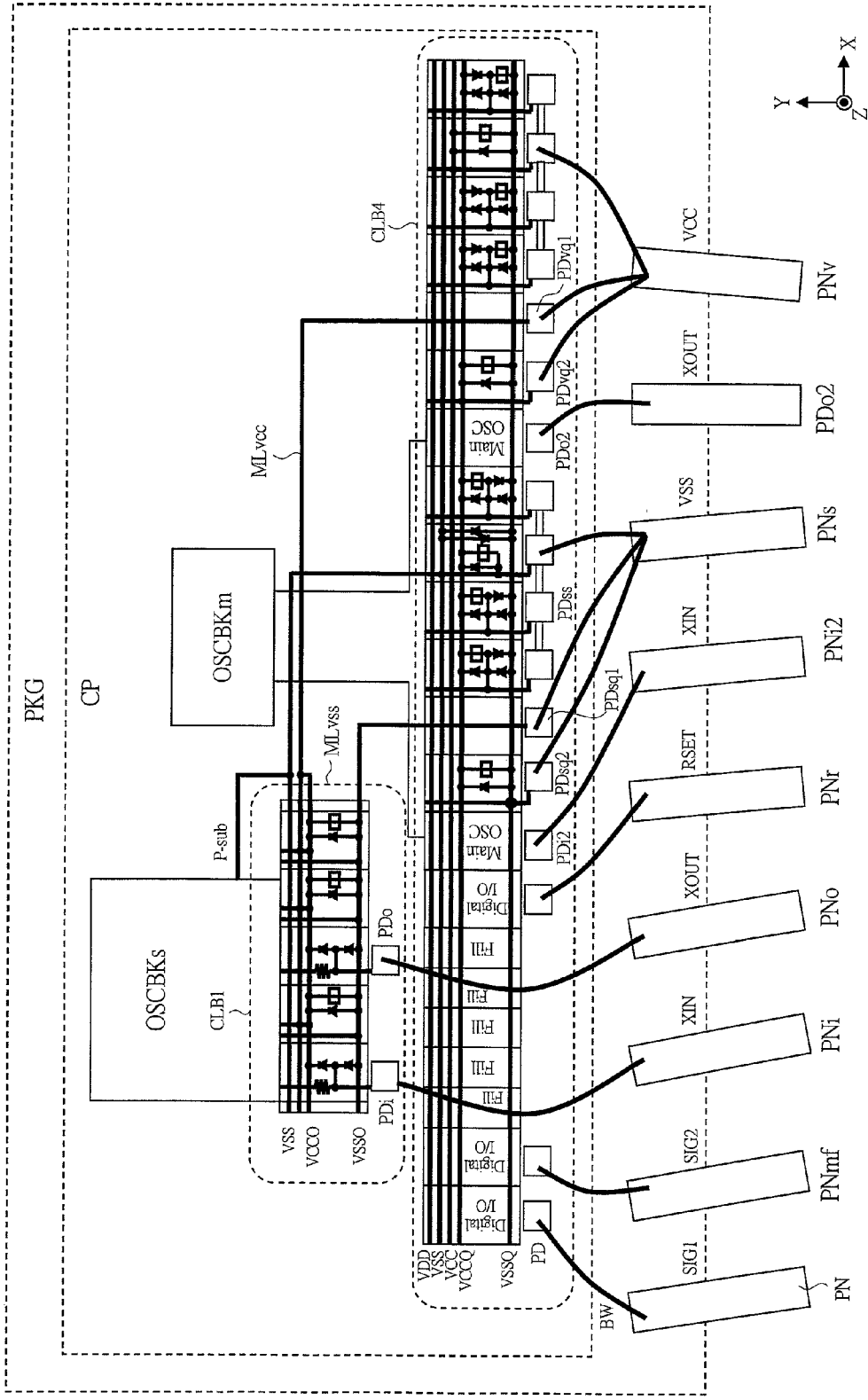
FIG. 29 is a diagram showing a detailed layout configuration example of a semiconductor package and a semiconductor chip obtained by modifying the configuration example shown in FIG. 28.

FIG. 29 is a diagram showing a detailed layout configuration example of a semiconductor package and a semiconductor chip obtained by modifying the configuration example shown in FIG. 28. A main difference between the configuration example shown in FIG. 29 and the configuration example shown in FIG. 28 lies that a cell region CLB4 is arranged along one side of the chip (along the X-axis direction) and a cell region CLB1 is arranged at a position whose coordinate in the Y-axis direction (in the inward direction of the chip) is different from that of CLB4 in the configuration example shown in FIG. 29. CLB1 is for the oscillation circuit section OSCBKs for the sub-clock like the configuration example shown in FIG. 28. On the other hand, CLB4 is for common use in the chip, and some cells thereof are used for the oscillation circuit section OSCBKm for a main clock. When the configuration example shown in FIG. 29 is used, since CLB1 can be further separated from the other cell regions as compared with the configuration example shown in FIG. 28, further improvement of the noise tolerance can be expected.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, as shown in FIG. 28, the crystal oscillation device according to the present embodiment is beneficial when it is applied to a crystal oscillation device for sub-clock typified by 32 kHz, but it is not necessarily limited to this, and it may be applied to a crystal oscillation device for main clock in some cases. However, since the crystal oscillation device for sub-clock is smaller in current consumption and smaller in signal amount than the crystal oscillation device for main clock, there is a possibility that the noise tolerance is more reduced in the former. In addition, when a low CL value-adapted quartz crystal unit is used in order to further reduce the current consumption, further reduction of the noise tolerance, influence of the parasitic capacitance, and others are concerned. From such a viewpoint, the crystal oscillation device according to the present embodiment is more beneficial when it is applied to the crystal oscillation device for sub-clock.

Further, an external lead type package typified by QFP (Quad Flat Package) has been used here as the semiconductor package, but the present invention is not limited to this as a matter of course, and another package type can be adopted. For example, even when a ball-type package such as BGA (Ball Grid Array) is used, the above-described various features in the semiconductor chip and the various features on the printed circuit board can be achieved.

<<Representative Embodiment of Whole Crystal Oscillation Device [1B]>>

Figure 34:
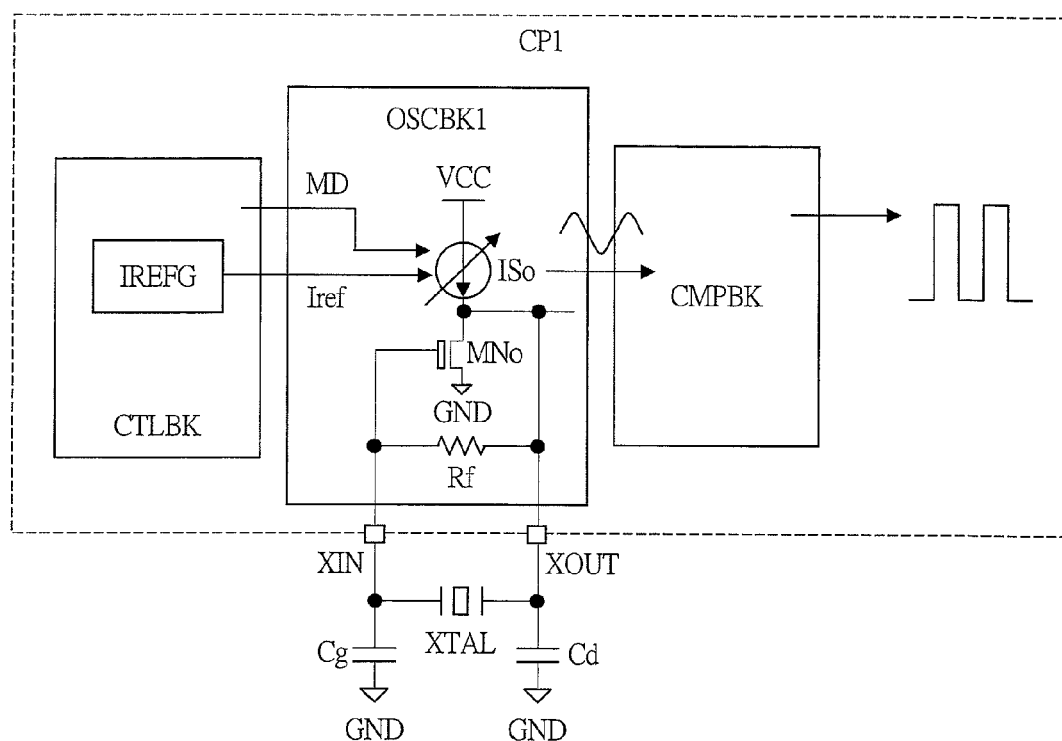
FIG. 34 is a schematic diagram showing a whole configuration example of a crystal oscillation device according to an embodiment of the present invention.

FIG. 34 is a schematic diagram showing a whole configuration example of a crystal oscillation device according to an embodiment of the present invention. The crystal oscillation device shown in FIG. 34 is provided with a semiconductor chip (semiconductor device) CP1, and capacitors Cg and Cd and a quartz crystal unit XTAL provided outside CP1. In CP1, a control circuit block CTLBK, an oscillation circuit block (oscillation circuit section) OSCBK1, and a comparator circuit block CMPBK are formed. OSCBK1 is provided with a current source ISo whose one end is connected to a power source voltage VCC, an oscillation NMOS transistor MNo whose drain is connected to the other end of ISo and whose source is connected to a ground power source voltage GND (0V), and a feedback resistor Rf with a high resistance (for example, 10 MΩ or the like) connected between the gate and the drain of MNo. The gate of MNo is connected to an external terminal for oscillation input signal XIN and the drain of MNo is connected to an external terminal for oscillation output signal XOUT.

Figure 50:
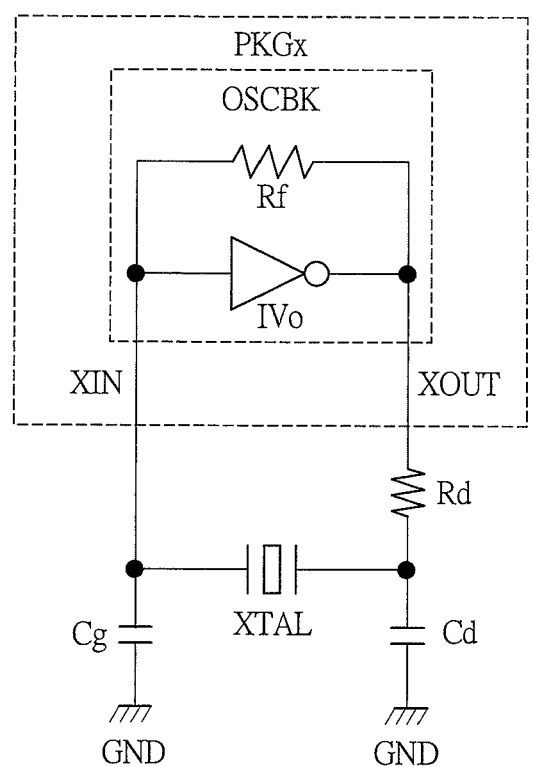
FIG. 50 is a circuit diagram showing a configuration example of a general crystal oscillation device.

The capacitor Cg is connected between an external terminal for XIN and GND, and the capacitor Cd is connected between an external terminal for XOUT and GND. XTAL is connected between an external terminal for XIN and an external terminal for XOUT. Incidentally, though omitted in FIG. 34, a resistor Rd for restriction or the like can be added in some cases as shown in FIG. 50. XTAL has a configuration adapted to a low load capacitance value (low CL value) such as, for example, 3 to 7 pF, and a tuning-fork quartz crystal unit is typically used. Cg and Cd have, for example, the same capacitance value and they are set to such values that a combined capacitance value of series connection of Cg and Cd coincides with the CL value of XTAL when respective parasitic capacitances are disregarded.

CTLBK is provided with a reference current generating circuit IREFG which generates a stable reference current Iref with no voltage dependence, and the current source ISo generates a predetermined bias current by using the Iref. MNo and ISo constitute an inverting logic circuit (or negative resistance generating circuit), and MNo performs oscillation operation at oscillation frequencies in accordance with various parameters of the quartz crystal unit XTAL or the like by using the bias current from ISo. By this means, an oscillation output signal XOUT having a frequency of, for example, 32 kHz is generated at the external terminal (XOUT). Here, the bias current from ISo is set to a very small value such as, for example, about 100 nA in order to reduce power consumption, and correspondingly, a magnitude of a voltage amplitude in XOUT becomes a very small value such as, for example, about 100 to 300 mV. The comparator circuit block CMPBK determines whether a voltage level of XOUT is high or low based on a predetermined comparison voltage, thereby shaping XOUT to a rectangular oscillation signal (clock signal) having a voltage amplitude of a VCC level (for example, 1.6 V or higher).

Further, in the configuration of the crystal oscillation device shown in FIG. 34, not only a low CL value-adapted quartz crystal unit XTAL but also a standard CL value-adapted XTAL such as, for example, 12.5 pF can be connected. As the standard CL value-adapted XTAL, an AT-cut quartz crystal unit is representatively used. When the standard CL value-adapted XTAL is used, a bias current for a low CL value from the above-described ISo is insufficient in a current value. Therefore, in FIG. 34, ISo is a variable current source which can change the magnitude of a bias current in accordance with a mode-setting signal MD from the control circuit block CTLBK. In the case of connecting the standard CL value-adapted XTAL, the bias current from ISo is set to a value larger by at least one order of magnitude than that of the above-described bias current for a low CL value.

As described above, the crystal oscillation device shown in FIG. 34 has, for example, the following features. A first feature lies in that the inverting logic circuit (MNo, ISo) operating with a very small bias current is combined to the low CL value-adapted quartz crystal unit XTAL, and reduction of a voltage amplitude at XOUT due to an adverse effect of the combination is compensated by the comparator circuit block CMPBK. By this means, especially, since the bias current of the inverting logic circuit can be reduced down to a limit, reduction of power consumption in the crystal oscillation device can be achieved. A second feature lies in that the inverting logic circuit (MNo, ISo) is configured to have a two-stage series connection between VCC and GND. By this means, it becomes possible to adapt to a wide range of power source voltage VCC (for example, 1.62 V to 5.5 V), and especially, it becomes possible to adapt to a low power source voltage according to a trend of reduction of power consumption (namely, reduction of a power source voltage) in various electric equipments. A third feature lies in that since a variable current source is used as the current source ISo, options of a plurality of quartz crystal units XTAL (adapted to a low CL value or adapted to a standard CL value) are provided to a user with using the same semiconductor chip CP1. By this means, cost reduction, improvement of convenience, and the like can be realized.

<<Representative Embodiment of Whole Crystal Oscillation Device [2B]>>

Figure 35:
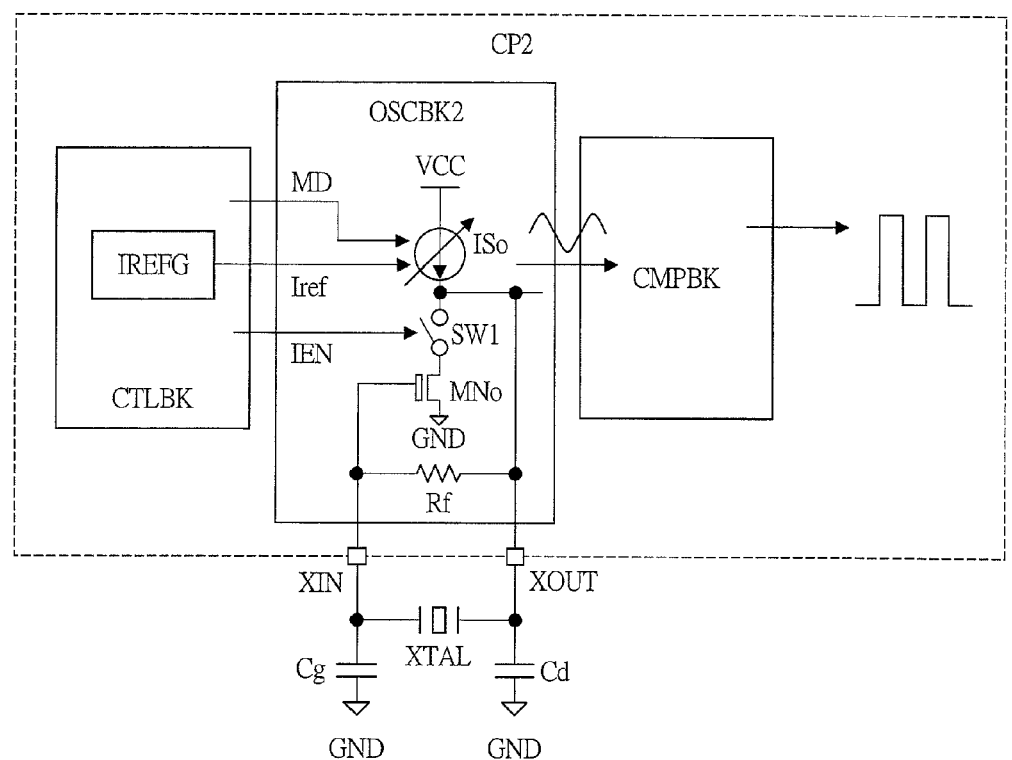
FIG. 35 is a schematic diagram showing a whole configuration example obtained by modifying the configuration example shown in FIG. 34 in a crystal oscillation device according to an embodiment of the present invention.

FIG. 35 is a schematic diagram showing a whole configuration example obtained by modifying the configuration example shown in FIG. 34 in a crystal oscillation device according to an embodiment of the present invention. Compared with the configuration shown in FIG. 34, the crystal oscillation device shown in FIG. 35 is different in that a switch circuit SW1 is added in the oscillation circuit block OSCBK2 in the semiconductor chip CP2. Further, the crystal oscillation device shown in FIG. 35 is correspondingly different from the configuration example shown in FIG. 34 in that the control circuit block CTLBK controls ON/OFF of SW1 in accordance with an enable signal IEN. Since the configurations other than these of the crystal oscillation device shown in FIG. 35 are similar to those shown in FIG. 34, detailed description thereof is omitted. SW1 is inserted between the current source ISo and the drain of the oscillation NMOS transistor MNo. Also, a connection node between ISo and SW1 is connected to an external terminal for XOUT.

Figure 36:
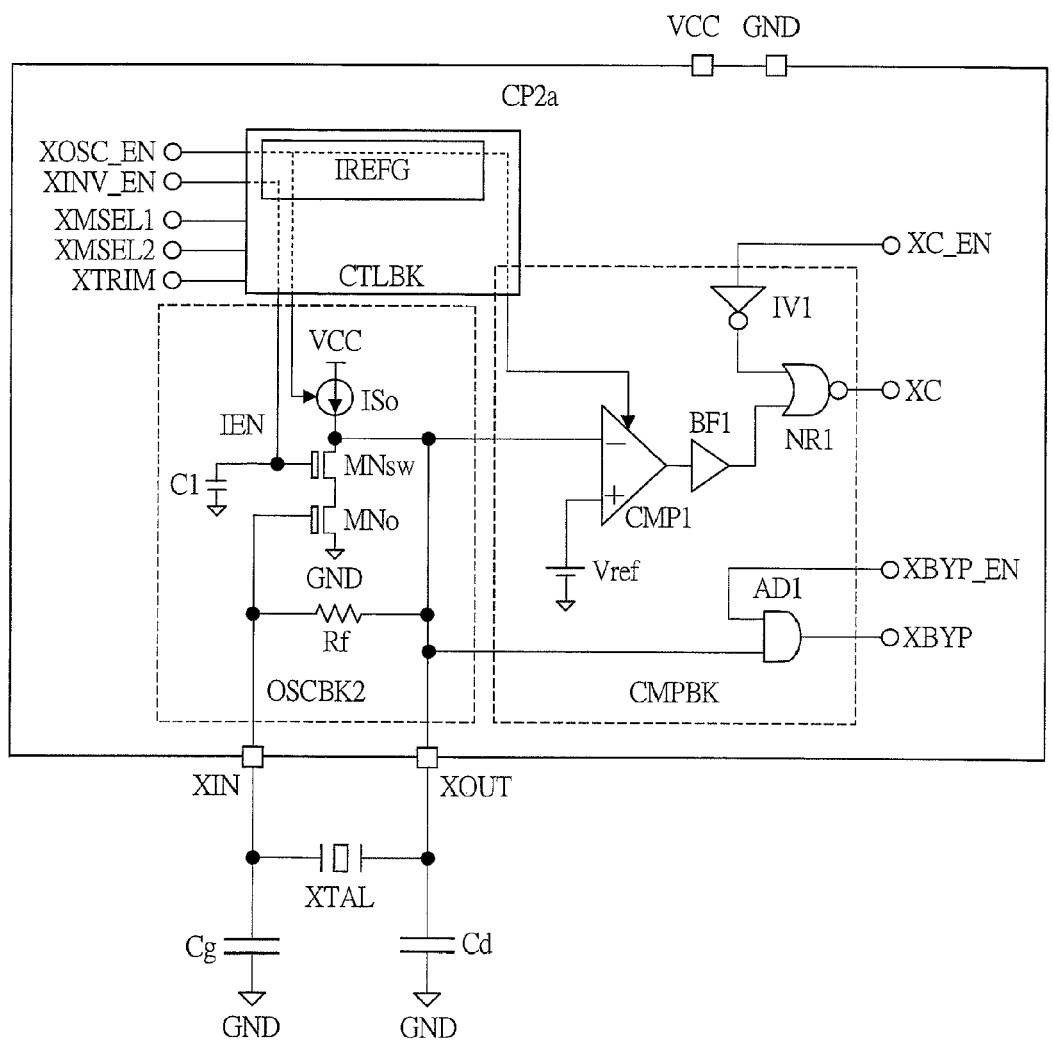
FIG. 36 is a circuit block diagram showing a detailed configuration example of the crystal oscillation device shown in FIG. 35.

FIG. 36 is a circuit block diagram showing a detailed configuration example of the crystal oscillation device shown in FIG. 35. In FIG. 36, a semiconductor chip CP2a is provided with external terminals for power source voltage VCC and for ground power source voltage GND in addition to the above-described external terminals for oscillation input signal XIN and for oscillation output signal XOUT. An oscillation enable signal XOSC_EN, an inverting logic enable signal XINV_EN, mode-selecting signals XMSEL1 and XMSEL2, and a trimming signal XTRIM are inputted into the control circuit block CTLBK in CP2a from a plurality of (five in this case) internal terminals. XOSC_EN is a master signal for controlling the whole crystal oscillation device into an active state (ON state or effective state) or a non-active state (OFF state or ineffective state), and in the example shown in FIG. 36, the reference current generating circuit IREFG stops a producing operation of a reference current when it is in the non-active state.

The inverting logic enable signal XINV_EN is a signal which is an origin of the above-described enable signal IEN, and it is also a signal for controlling the active state or the non-active state of the inverting logic circuit in the oscillation circuit block OSCBK2. The mode-selecting signals XMSEL1 and XMSEL2 are signals for determining whether the quartz crystal unit XTAL is adapted to the low CL value or the standard CL value, and they are signals which are origins of the above-described mode-setting signal MD. The trimming signal XTRIM is a signal for correcting manufacturing variations of the current source ISo. These internal terminals (XOSC_EN, XINV_EN, XMSEL1, XMSEL2, and XTRIM) are connected to, for example, various function units (processor unit, controller unit, clock-generating unit, and the like) (not shown) separately provided in the semiconductor chip CP2a, and some of them may be external terminals of CP2a in some cases.

In FIG. 36, the above-described current source ISo, the oscillation NMOS transistor MNo, and an NMOS transistor MNsw corresponding to the switch circuit SW1 are formed in the oscillation circuit block OSCBK2. Further, in this configuration, a capacitor C1 is connected to the gate of MNsw, and the reference current generating circuit IREFG charges/discharges CI in accordance with XINV_EN, thereby controlling ON/OFF of MNsw. However, the present invention is not limited to this as a matter of course, and the gate of MNsw may be directly voltage-driven by XINV_EN.

In FIG. 36, a comparator circuit CMP1, a buffer circuit BF1, a NOR circuit NR1, an inverter circuit IV1, and an AND circuit AD1 are formed in the comparator circuit block CMPBK. CMP1 determines whether the oscillation output signal XOUT is high or low based on the comparison voltage Vref and generates a clock signal having a voltage amplitude of the power source voltage VCC level. The clock signal is transmitted to one of two inputs of NR1 via BF1. A clock output enable signal XC_EN inputted from the internal terminal is transmitted to the other of the two inputs of NR1 via IV1, and an output of NR1 is connected to an internal terminal for clock signal XC. When XC_EN is in level, the clock signal XC is fixed to level regardless of an output of BF1. In the AND circuit AD1, XOUT is inputted to one of two inputs thereof, a bypass enable signal XBYP_EN inputted from an internal terminal is transmitted to the other of the two inputs thereof, and an output thereof is connected to an internal terminal for a bypass signal XBYP. When XBYP_EN is in 'H' level, an external terminal for XOUT is bypassed to XBYP. Incidentally, respective internal terminals (XC_EN, XC, XBYP_EN, and XBYP) are connected to the above-described various function units or some of them are provided as external terminals.

By providing the switch circuit SW1 (MNsw) in the oscillation circuit block OSCBK2 in this manner as the fourth feature, test of the crystal oscillation device can be facilitated, and when the oscillation operation in the crystal oscillation device makes transition from a non-active state (OFF state or ineffective state) to an active state (ON state or effective state), the transition time can be reduced. First of all, regarding the facilitation of test, if the semiconductor chip CP2 (CP2a) is the so-called microcomputer or the like, when various function units in the microcomputer are tested, it is desirable in some cases that a clock signal is directly supplied from an external test apparatus without interposition of the crystal oscillation device.

At this time, if a clock signal is supplied to the external terminal (XOUT) from the test apparatus in the configuration example shown in FIG. 34, since MNo changes to ON state and XOUT is connected to GND, there may be the case where it becomes difficult to supply a clock signal from the test apparatus. Therefore, when the configuration example shown in FIG. 35 and FIG. 36 is used, a short-circuit path via the above-described MNo can be eliminated by controlling SW1 (MNsw) to OFF, so that a clock signal can be directly supplied from the test apparatus to the external terminal (XOUT). Specifically, by controlling SW1 (MNsw) to OFF and setting the bypass enable signal XBYP_EN at 'H' level, the external terminal (XOUT) is bypassed to the internal terminal (XBYP) and test is performed by XBYP. Incidentally, it is also possible to take the clock signal supplied from the external terminal (XOUT) from the internal terminal (XC) instead of the internal terminal (XBYP), but it is beneficial to provide a bypass route via AD1 for such a case that test should be performed using a clock signal with a relatively high frequency.

Next, regarding the above-described transition time of the oscillation operation from the non-active state to the active state, if the crystal oscillation device is changed to a non-active state by stopping operation of IREFG by the use of XOSC_EN shown in FIG. 36, it takes time for the stabilization of IREFG when it is returned to the active state, and there is a possibility that the transition time to the active state (period required for stabilizing XOUT) becomes long. Therefore, when the crystal oscillation device is changed to the non-active state, the operation of the oscillation circuit block OSCBK2 (inverting logic circuit) is stopped by controlling SW1 (MNsw) to OFF while keeping IREFG in an operating state. By this means, it is possible to reduce the transition time required for the stabilization of XOUT when returned to the active state (when SW1 (MNsw) is returned to ON).

Incidentally, in order to reduce current consumption in the non-active state down to a limit, it is desirable to stop the operation of IREFG, but sufficient reduction of power consumption can be practically achieved by stopping the operation of OSCBK2 (inverting logic circuit). Further, regarding the above-described second feature (series two-stage connection between VCC and GND), although a three-stage connection is adopted in the configuration example shown in FIG. 35 and FIG. 36, since SW1 (MNsw) functions as a switch (because it is in an open state or a voltage between the source and the drain is extremely small), the configuration can be substantially regarded as the series two-stage connection.

<<Comparative Example of Representative Embodiment of Whole Crystal Oscillation Device [2B]>>

Figure 37:
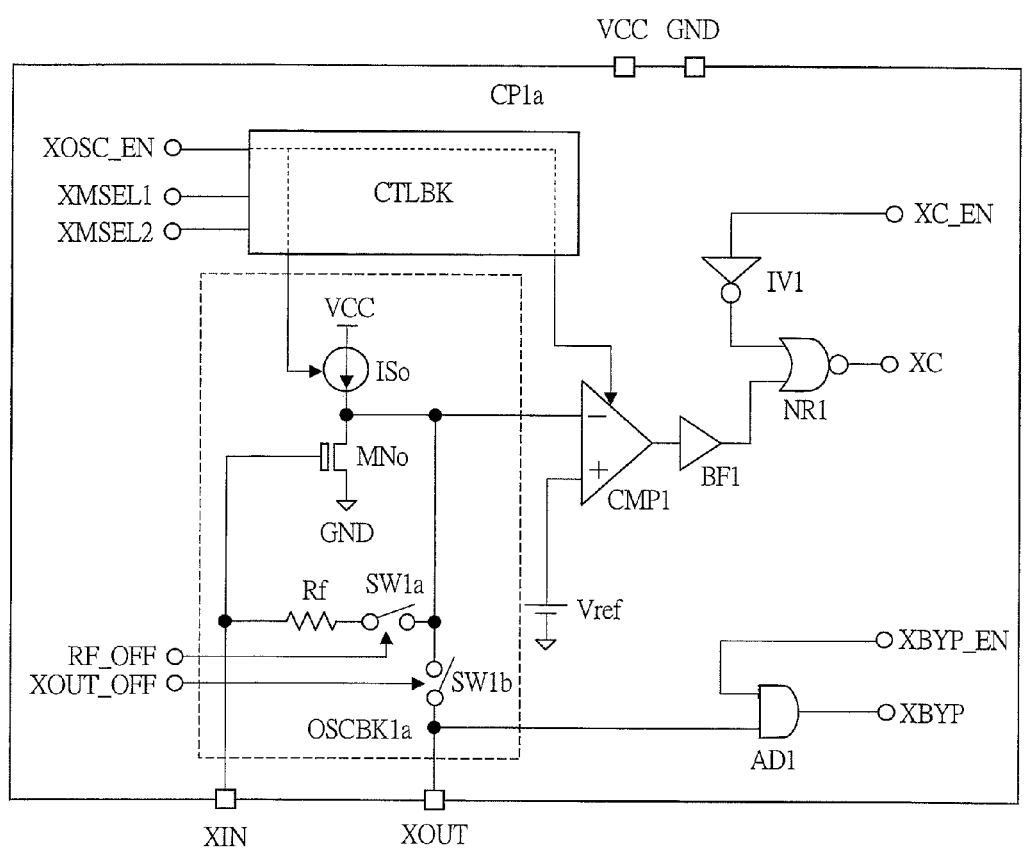
FIG. 37 is a circuit block diagram showing a configuration example of a whole crystal oscillation device examined as a comparative example of the configuration example shown in FIG. 36.

FIG. 37 is a circuit block diagram showing a configuration example of a whole crystal oscillation device examined as a comparative example of the configuration example shown in FIG. 36. In FIG. 37, the NMOS transistor MNsw for a switch shown in FIG. 36 is not provided in a semiconductor chip CP1a, but two switch circuits SW1a and SW1b are provided. SW1a is inserted between the gate and the drain of the oscillation NMOS transistor MNo in series with a feedback resistor Rf, and ON/OFF thereof is controlled in accordance with an oscillation operation stop signal RF_OFF from an internal terminal (or external terminal). SW1b is inserted between one (XOUT side) of two inputs of an AND circuit AD1 and one end (MNo side) of SW1a, and ON/OFF thereof is controlled in accordance with an oscillation output stop signal XOUT_OFF.

When the configuration example like this is used, by controlling the switch circuits SW1a and SW1b to OFF, a bypass route between the external terminal (XOUT) and the internal terminal (XBYP) can be formed at the time of test and the operation of the oscillation circuit block OSCBK1a can be stopped without any problem. However, when SW1a or SW1b is made up of, for example, a MOS transistor or the like, its ON resistance becomes higher particularly as the power source voltage VCC becomes lower, so that influence on an ordinary oscillation operation cannot be disregarded. More specifically, there is a possibility that deviation of the oscillation conditions or the like due to ON resistance of SW1a and SW1b occurs during an ordinary oscillation operation, and accuracy and stability of the oscillation operation are deteriorated. On the other hand, when MNsw for a switch is provided in the inverting logic circuit of the oscillation circuit block OSCBK2 like the configuration example shown in FIG. 36, since influence of ON resistance is reduced as compared with the configuration example shown in FIG. 37, it is beneficial in terms of accuracy and stability of the oscillation operation.

The outline of the crystal oscillation device according to the present embodiment has been described above, but the crystal oscillation device according to the present embodiment is further provided with a plurality of other features other than the above-described first to fourth features. These features will be properly described below along with the details of the crystal oscillation device.

<<Details of Control Circuit Block and Oscillation Circuit Block>>

Figure 38A:
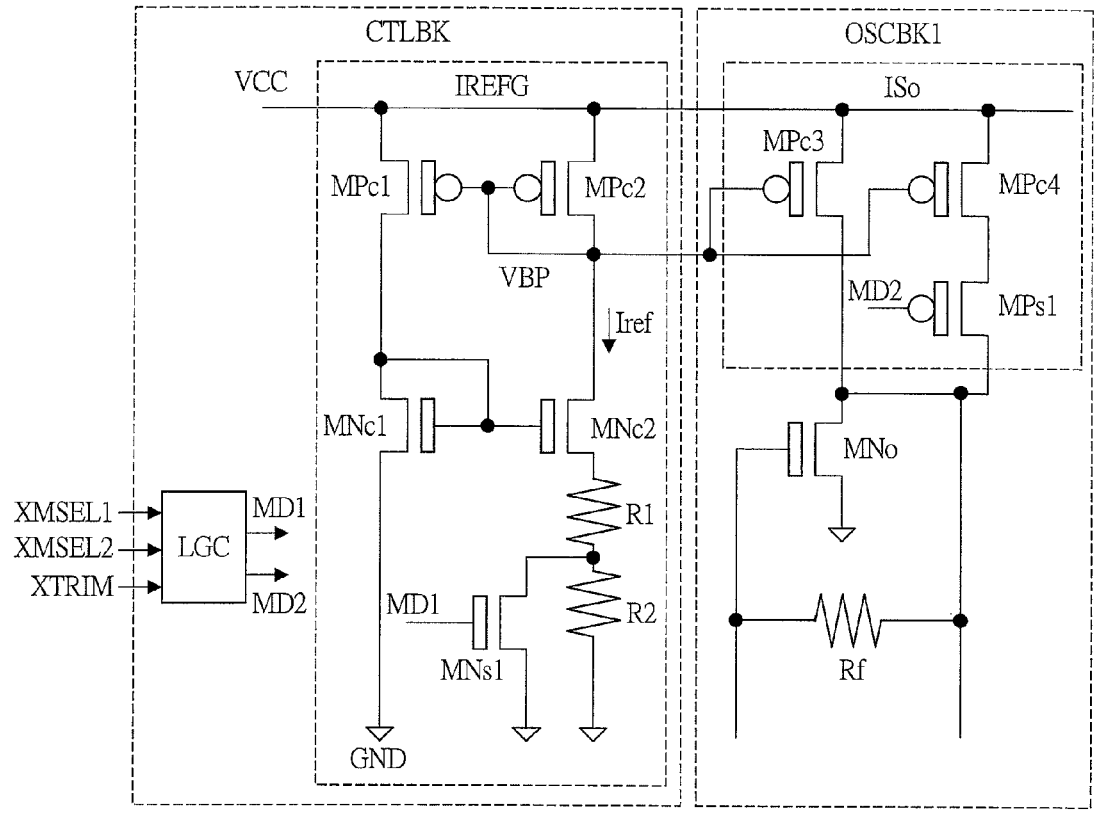
FIG. 38A is a circuit diagram showing a detailed configuration example of a control circuit block and an oscillation circuit block in the crystal oscillation device shown in FIG. 34.
Figure 38B:
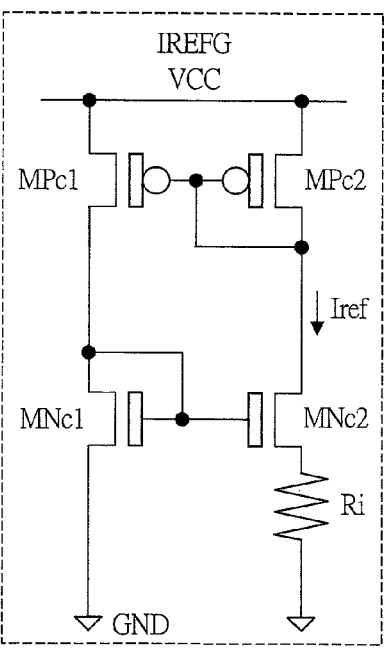
FIG. 38B is a circuit diagram of a portion extracted from the configuration example shown in FIG. 38A.

FIGS. 38A and 38B show details of the control circuit block CTLBK and the oscillation circuit block OSCBK1 in the crystal oscillation device shown in FIG. 34. FIG. 38A is a circuit diagram showing a configuration example thereof and FIG. 38B is a circuit diagram of a portion extracted from the configuration example shown in FIG. 38A. In FIGS. 38A and 38B, a control circuit block CTLBK is provided with a control logic circuit LGC and a reference current generating circuit IREFG. The mode-selecting signals XMSEL1 and XMSEL2 and the trimming signal XTRIM are inputted to LGC and LGC generates mode-setting signals MD1 and MD2 in accordance with these signals. IREFG is provided with NMOS transistors MNc1, MNc2, and MNs1, PMOS transistors MPc1 and MPc2, and resistors R1 and R2.

A basic configuration of IREFG is shown in FIG. 38B, and the configuration constitutes the so-called PTAT (Proportional To Absolute Temperature) circuit which generates a reference current Iref proportional to an absolute temperature. In FIG. 38B, MNc1 has the source connected to GND and the gate and drain commonly connected to each other. MNc2 has the source connected to GND via a resistor Ri for current setting and the gate commonly connected to the gate of MNc1. MPc1 and MPc2 constitute a current mirror circuit, and the sources thereof are connected to VCC and the gates thereof are commonly connected to each other. The drain of MPc1 is connected to the drain of MNc1, and the drain of MPc2 is connected to the drain of MNc2 and is connected to the gate of MPc2 (MPc1).

Here, MNc1, MNc2, MPc1, and MPc2 operate in a sub-threshold region (weak inverting region) where a gate-source voltage is lower than a threshold voltage. In the sub-threshold region, a source-drain current $I_{Ds}$ of each MOS transistor is defined by, for example, Equation (1). K represents an aspect ratio (gate width (W)/gate length (L)), Io represents a prefix coefficient of a sub-threshold current, m represents a constant, $V_T$ represents "kbT/q" (kb: Boltzmann constant, q: charge amount of electron, and T: temperature), Vgs represents a gate-source voltage, and Vth represents a threshold voltage.

$$I_{DS}=K \cdot Io \cdot \exp((Vgs-Vth)/(m \cdot V_T)) \quad (1)$$

Assuming that the transistor sizes (L and W) of MPc1 and MPc2 are the same, equal reference currents Iref flow in MPc1 and MPc2, and assuming that aspect ratios of MNc1 and MNc2 are K1 and K2, respectively, Equation (2) is established from a relationship "Vgs1−Vgs2=Iref·Ri" (Vgs1: Vgs of MNc1, Vgs2: Vgs of MNc2).

$$Iref=(1/Ri) \cdot m \cdot V_T \ln(K2/K1) \quad (2)$$

Since Iref increases in proportion to the temperature T according to Equation (2), IREFG shown in FIG. 38B constitutes the PTAT circuit. Further, IREFG shown in FIG. 38B constitutes a low power consumption circuit because respective transistors operate in the sub-threshold region. Incidentally, various circuits including a typical circuit utilizing a band gap of a bipolar transistor (diode) are known as the PTAT circuit, but it is desirable to adopt a system utilizing a sub-threshold characteristic of a MOS transistor as shown in FIG. 38B in order to achieve reduction of power consumption.

IREFG shown in FIG. 38A has a configuration in which a resistor Ri in FIG. 38B is replaced by a series connection circuit of R1 and R2 and MNs1 for a switch whose source-drain path is connected between a common connection node of R1 and R2 and GND. ON/OFF of MNs1 is controlled by the mode-setting signal MD1, and Ri=R1+R2 when MNs1 is in OFF and Ri=R1 when MNs1 is in ON. Specifically, when a quartz crystal unit adapted to a low CL value is connected, a value of Iref is set to a small value by turning off MNs1, and the value of Iref is set to a large value by turning on MNs1 when a quartz crystal unit adapted to a standard CL value is connected. Incidentally, the current value setting section (R1, R2, and MNs1) is here shown in a simplified manner, but actually, it is configured so as to adapt to even the fine adjustment of the value of Iref in accordance with the trimming signal TRIM by the use of a plurality of resistors, a plurality of MOS transistors for a switch, and mode-setting signals thereof.

The oscillation circuit block OSCBK1 includes a current source ISo, an oscillation NMOS transistor MNo, and a feedback resistor Rf. MNo operates in the sub-threshold region for the reduction in power consumption. ISo is provided with PMOS transistors MPc3, MPc4, and MPs1. MPs1 functions as a switch and ON/OFF thereof is controlled by the mode-setting signal MD2. MPc3 has the source connected to VCC and the drain connected to the drain of MNo, and MNc4 has the source connected to VCC and the drain connected to the drain of MNo via MPs1. MPc3 and MPc4 constitute a current mirror circuit together with the MPc1 (MPc2) in the above-described IREFG, and a gate voltage VBP of MPc1 (MPc2) is applied to the gate thereof. Here, MPc3 and MPc4 operate in the sub-threshold region like the MPc1, MPc2, and the like, and thus the reduction in power consumption can be achieved.

A bias current flowing in MNo becomes a current value supplied from MPc3 when MPs1 is in OFF, and it becomes an addition value of currents supplied from MPc3 and MPc4 when MPs1 is in ON. In other words, switching of the bias current value can be performed by changing a current mirror ratio of IREFG and ISo. Specifically, when the quartz crystal unit adapted to a low CL value is connected, a small bias current value is set by turning off MPs1, and a large bias current value is set by turning on MPs1 when the quartz crystal unit adapted to a standard CL value is connected. Incidentally, when switching between a bias current for a low CL value and a bias current for a standard CL value is performed, the switching can be performed by only one of switching based on the resistance value of the IREFG and switching based on the current mirror ratio of IREFG and ISo described above. However, when the bias current values for the low CL value and for the standard CL value are different by one or more order of magnitude, it is desirable to perform the switching by the both rather than either one from the viewpoint of accuracy and a circuit area. Though not particularly limited, when the bias current values are different, for example, 10 times, the bias current value is quintupled by the resistance value of IREFG, and is then doubled by the current mirror ratio of IREFG and ISo.

Here, in the configuration example shown in FIGS. 38A and 38B, as the fifth feature, when the CL value of the quartz crystal unit is changed "M" times, the bias current of MNo is increased "square of M" times. Further, as the sixth feature, the bias current value of MNo is increased in proportion to an absolute temperature regardless of the CL value of the quartz crystal unit. The fifth feature is realized by designing the variable range of the resistance value of IREFG and the variable range of the current mirror ratio of IREFG and ISo in advance in accordance with a preset application range of the CL value of the quartz crystal unit. The sixth feature is realized by using the PTAT circuit for the reference current generating circuit IREFG as described above. By providing the fifth feature, the oscillation margin can be kept constant regardless of the kind (CL value) of the quartz crystal unit, and by providing the sixth feature, the temperature dependency of the oscillation margin is reduced and the oscillation margin can be kept constant. Since the quartz crystal unit is used in various electronic equipments, stable operation in a wide range of, for example, −40 to 125° C. is desired in terms of the temperature dependency.

In the crystal oscillation device, it is generally necessary to keep the index called oscillation margin (Rm/Re) given by Equation (3) in a prescribed value or more. Rm is a negative resistance value realized by an inverting logic circuit in the oscillation circuit block, and Re is an equivalent series resistance value of the quartz crystal unit. The symbol w is an oscillation frequency (angular velocity) and gm is a mutual conductance of the inverting logic circuit. The mutual conductance gm is given by Equation (5) based on the above-described Equation (1). Further, CL in Equation (3) is a value of a load capacitance, and CL=(Cg·Cd)/(Cg+Cd) when parasitic capacitance other than the external capacitors Cg and Cd is disregarded in, for example, FIG. 34 or the like. Here, when Cg=Cd is assumed, Equation (3) and Equation (4) are equal to each other.

$$(Rm/Re) = (gm/(4 \cdot CL^2 \cdot \omega^2)) \cdot (1/Re) \quad (3)$$

$$(Rm/Re) = (gm/(Cg \cdot Cd \cdot \omega^2)) \cdot (1/Re) \quad (4)$$

$$gm = (q \cdot I_{DS})/(m \cdot k_b \cdot T) \quad (5)$$

It is understood from Equation (3) and Equation (4) that the oscillation margin can be kept constant by making gm proportional to the square of CL or the product of Cg and Cd. This can be realized by making the bias current ($I_{DS}$) proportional to the square of CL or the product of Cg and Cd according to Equation (5). Further, it is understood from Equation (5) that, since gm is inversely proportional to the temperature T, the temperature dependency of gm can be reduced by making the bias current ($I_{DS}$) proportional to the temperature T. When the oscillation margin is kept constant by these means, for example, a margin design such as setting more bias current in consideration of variations of the oscillation margin becomes unnecessary, and no matter which of the low CL value and the standard CL value is used, the bias current can be reduced down to a theoretical limit and reduction of power consumption in the crystal oscillation device can be achieved.

Incidentally, when the oscillation margin is made constant in Equation (3) and Equation (4), gm can be made smaller as a quartz crystal unit with a lower CL value is used, and it is understood from Equation (5) that reduction of the bias current ($I_{DS}$) (namely, reduction in power consumption in the crystal oscillation device) is made possible. Further, if it is assumed that the low CL value is 4 pF and the standard CL value is 12 pF, when switching from the low CL value to the standard CL value is performed, since the CL value is tripled, it is necessary to increase the bias current ($I_{DS}$) 9 (=$3^2$) times. Since the fluctuation amount due to switching of the bias current ($I_{DS}$) is increased in this manner, it is desirable to use both of switching based on the resistance value of the reference current generating circuit IREFG and switching based on the current mirror ratio of IREFG and the current source ISo as described above.

Figure 39:
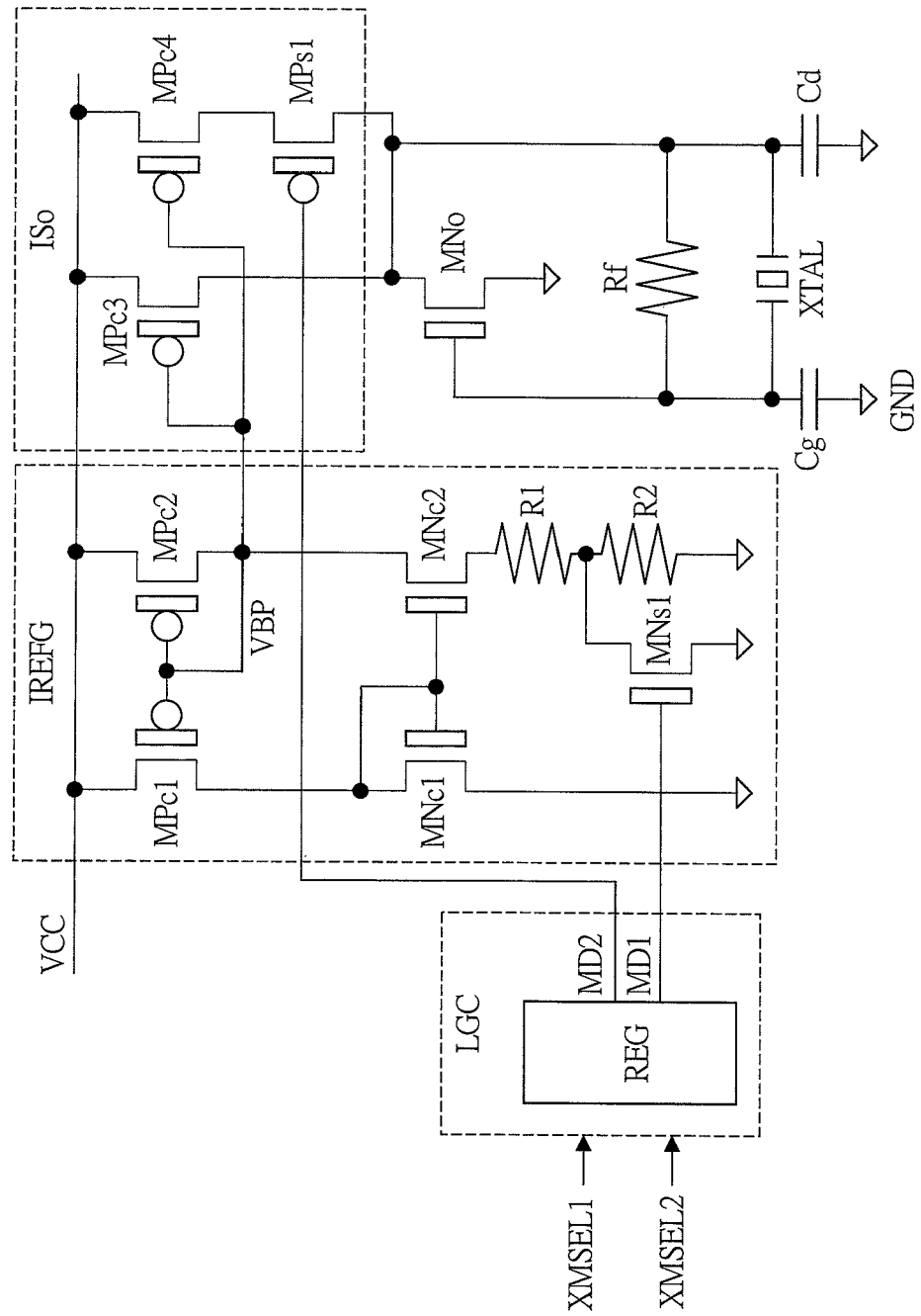
FIG. 39 is an explanatory diagram showing one example of a generating method of a mode-setting signal in FIG. 38.
Figure 40:
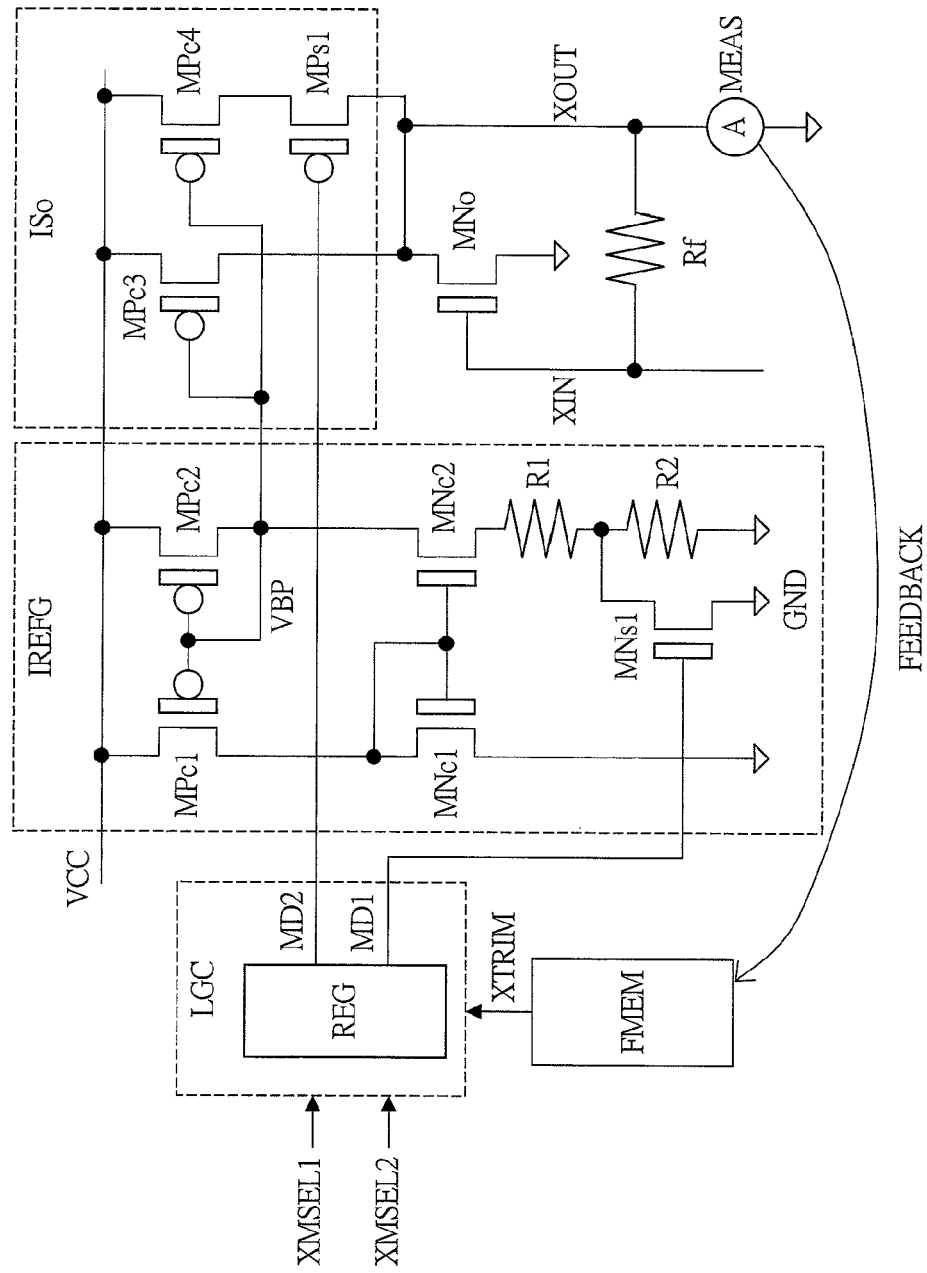
FIG. 40 is an explanatory diagram showing one example of a generating method of a mode-setting signal in FIG. 38.

FIG. 39 and FIG. 40 are explanatory diagrams showing examples of a producing method of the mode-setting signals MD1 and MD2 in FIG. 38. In the example shown in FIG. 39, a register circuit REG is provided in the control logic circuit LGC, and a current required in accordance with a quartz crystal unit or an oscillation mode to be used is properly set to a value of REG by using the selecting signals XSEL1 and XSEL2. The mode-setting signals MD1 and MD2 of the circuit are generated by this setting and an optimum current is supplied to the circuit. The example shown in FIG. 40 is the usage for solving the problem of manufacture variations. First, in a stage of test of the crystal oscillation device, a bias current from the current source ISo is measured by connecting an ammeter MEAS to the external terminal (XOUT) by the use of a test apparatus. Next, a trimming value in accordance with an error between the measurement value and a design value of the bias current is calculated by the test apparatus or the like, and the trimming value is preliminarily stored and saved in a nonvolatile memory FMEM such as a flash memory. For example, when the semiconductor chip CP1 shown in FIG. 34 is a microcomputer, a flash memory incorporated in the chip can be used as FMEM. The trimming value saved in FMEM is transferred to the control logic circuit LGC as a trimming signal XTRIM at the time of activation of the crystal oscillation device, and it is reflected in the mode-setting signals MD1 and MD2.

<<Details of Comparator Circuit Block [1]>>

Figure 41:
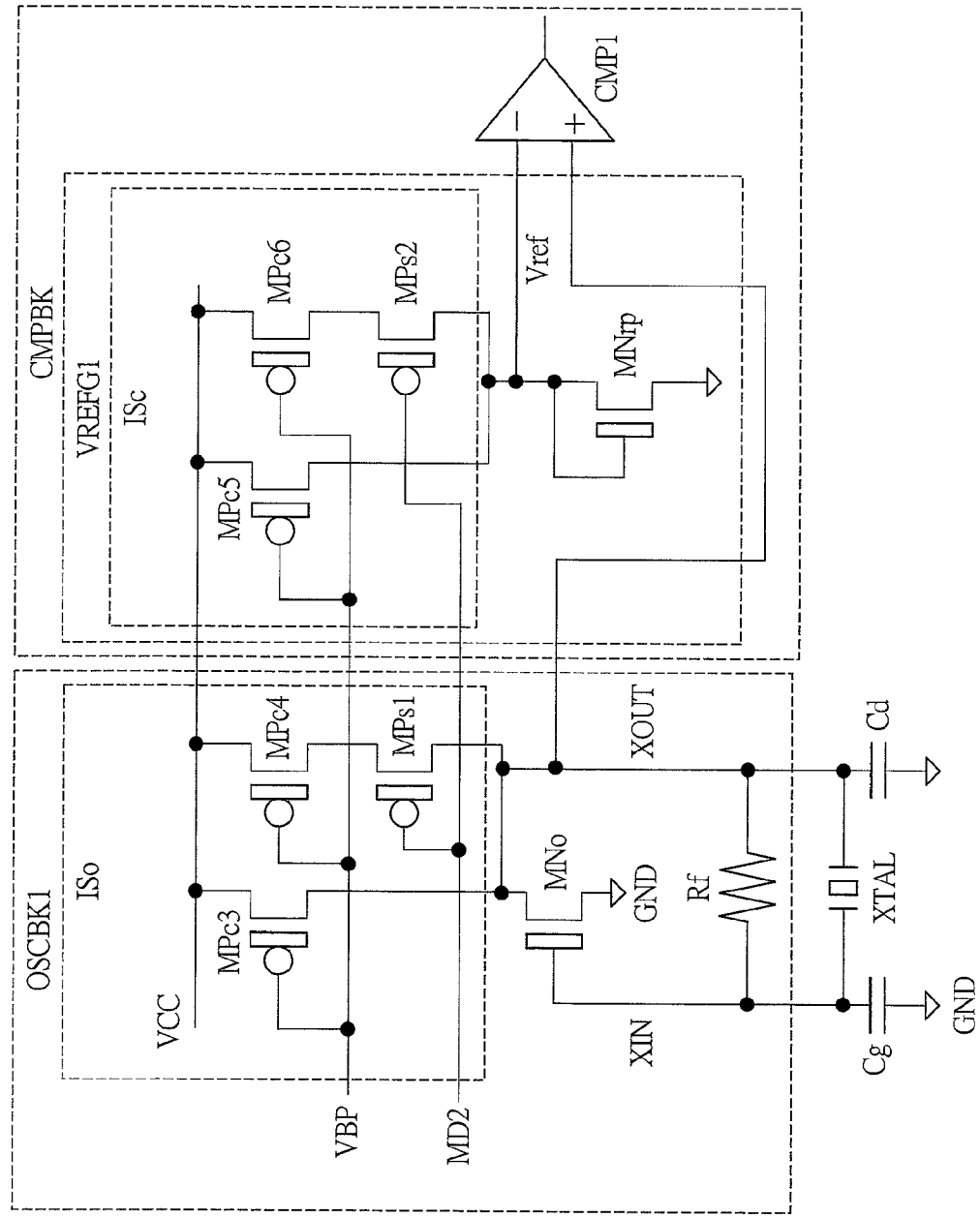
FIG. 41 is a circuit diagram showing a detailed configuration example of a portion of a comparator circuit block in the crystal oscillation device shown in FIG. 34.

FIG. 41 is a circuit diagram showing a detailed configuration example of a portion of a comparator circuit block CMPBK in the crystal oscillation device shown in FIG. 34. In FIG. 41, the comparator circuit block CMPBK includes a comparison voltage generating circuit VREFG1 and a comparator circuit CMP1. CMP1 has two inputs, to one input of which the oscillation output signal XOUT is inputted and to the other input of which the comparison voltage Vref is applied as described in the configuration example shown in FIG. 36 and the like. Here, a circuit generating the Vref is VREFG1.

VREFG1 is provided with a current source ISc to be a replica circuit of the current source ISo and an NMOS transistor MNrp to be a replica circuit of the oscillation NMOS transistor MNo in the above-described oscillation circuit block. MNrp has the source connected to GND and the gate and the drain commonly connected to each other. ISc is provided with PMOS transistors MPc5, MPc6, and MPs2. MPc5 and MPc6 constitute a current mirror circuit between them and MPc1 and MPc2 (see FIG. 38) in the reference current generating circuit IREFG like MPc3 and MPc4 in ISo. ON/OFF of MPs2 is controlled in accordance with the mode-setting signal MD2 like MPs1 in ISo. MPc5 has the source connected to VCC and the drain connected to the drain of MNrp, and MPc6 has the source connected to VCC and the drain connected to the drain of MNrp via MPs2. The comparison voltage Vref is generated from the drain of the MNrp.

Here, MNrp for replica has the same transistor size as the oscillation transistor MNo. Further, MPc5 has the same transistor size as MPc3, and MPc6 has the same transistor size as MPc4. By this means, a bias current having the same current value as the bias current supplied to the oscillation transistor MNo is supplied also to MNrp for replica, and a center voltage level of amplitude in the oscillation output signal XOUT generated from MNo appears at the drain (gate) of MNrp. CMP1 determines whether the voltage level of XOUT is high or low with using the drain voltage of MNrp as the comparison voltage Vref and outputs a clock signal having voltage amplitude of VCC level.

As described above, in the configuration example shown in FIG. 41, as the seventh feature, the center voltage level of XOUT (which is a voltage level satisfying XIN=XOUT when oscillation is not performed, in other words, DC-like stable point) is generated using the replica circuit (comparison voltage generating circuit VREFG1) reflecting the configuration of the oscillation circuit block OSCBK1. At this time, since MNo and MNrp have the same transistor size, PVT (process, voltage, and temperature) variations of MNo are reflected also in MNrp, so that the center voltage level of amplitude can be detected with a high degree of accuracy. Also, CMP1 determines whether the voltage level of XOUT is high or low with using the drain voltage of MNrp as the comparison voltage Vref, so that the duty ratio of the clock signal outputted from CMP1 can be brought close to 50%, and a highly accurate clock signal (having a high waveform quality) can be generated. Incidentally, particularly when a low CL value-adapted quartz crystal unit is used, since the amplitude level of XOUT is small, variation of the duty ratio due to deviation of the comparison voltage Vref becomes more significant. By using the seventh feature, such variation of duty ratio can be reduced.

<<Details of Comparator Circuit Block [1']>>

Figure 42A:
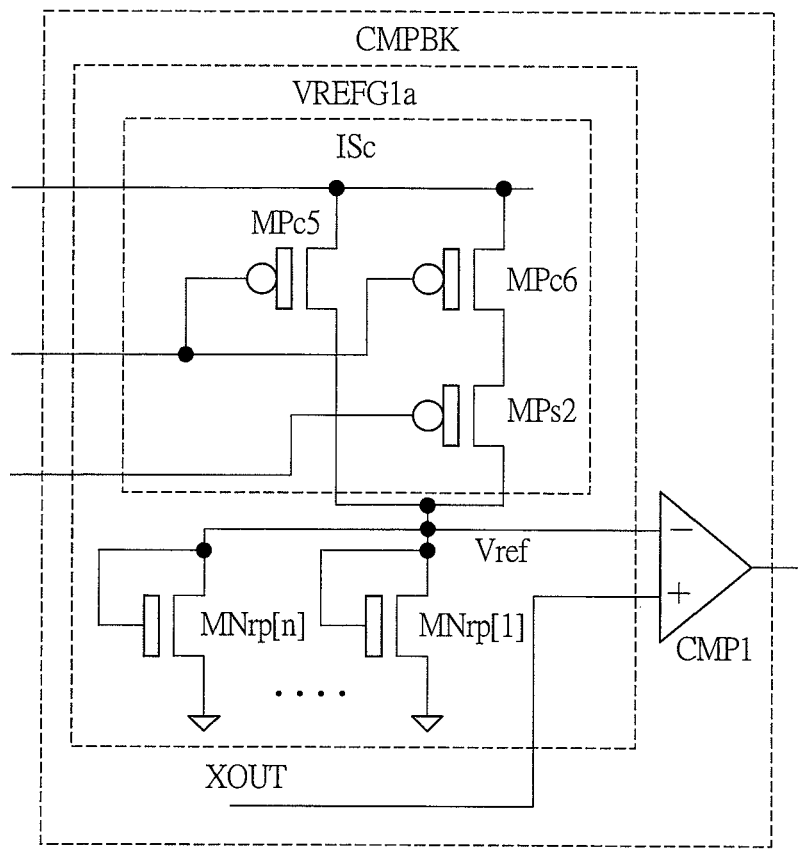
FIG. 42A is a circuit diagram showing a modified example of the comparator circuit block shown in FIG. 41.
Figure 42B:
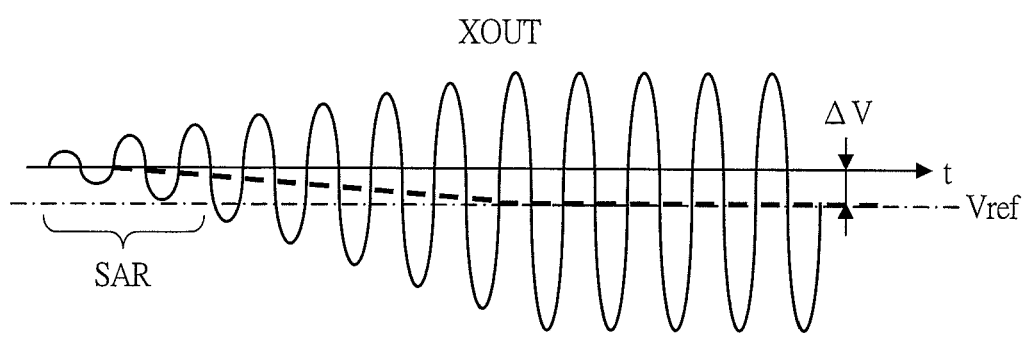
FIG. 42B is a waveform diagram showing an operation example of the modified example shown in FIG. 42A.

FIG. 42A is a circuit diagram showing a modified example of the comparator circuit block CMPBK shown in FIG. 41, and FIG. 42B is a waveform diagram showing an operation example of the comparator circuit block shown in FIG. 42A. Compared with the configuration example shown in FIG. 41, the comparator circuit block CMPBK shown in FIG. 42A is different in the configuration of the NMOS transistor for replica in the comparison voltage generating circuit VREFG1a. More specifically, the configuration example shown in FIG. 41 is provided with one NMOS transistor MNrp for replica, but the configuration example shown in FIG. 42A is provided with a plurality of NMOS transistors MNrp[1] to MNrp[n] for replica arranged in parallel between an input (Vref side) of the comparator circuit CMP1 and GND. Each of MNrp[1] to MNrp[n] is diode-connected like the MNrp shown in FIG. 41 and has the same diode size as the oscillation transistor MNo.

In the configuration example shown in FIG. 42A, as the eighth feature, by using the plurality of NMOS transistors for replica connected in parallel in this manner, the voltage level of the comparison voltage Vref is slightly lowered. This is because there is actually the case where the center voltage level of the oscillation output signal XOUT gradually lowers with the increase of the voltage amplitude of XOUT and the center voltage level in a stage where the voltage amplitude has been stabilized lowers by $\Delta V$ from that at the start of oscillation as shown in FIG. 42B. The factor thereof includes the fact that the oscillation NMOS transistor MNo is higher in driving ability than the current source (PMOS transistor) ISo in the oscillation circuit block. Further, the magnitude of $\Delta V$ is in a range of, for example, about 50 to 200 mV.

Therefore, by using the eighth feature, it is possible to correct the $\Delta V$ and the duty ratio of a clock signal outputted from CMP1 can be brought close to 50%. Further, as another effect, in a stage where the voltage amplitude of the oscillation output signal XOUT is growing, output fluctuation of CMP1 does not occur in a region SAR where the voltage amplitude of a half-cycle thereof does not reach $\Delta V$, so that noise reduction can be achieved in this region as shown in FIG. 42B. As a result, stability at the start of the oscillation is improved, and improvement in noise tolerance can be realized.

Incidentally, correction of $\Delta V$ is performed here by only a number (n) of MNrp[1] to MNrp[n] connected in parallel, but it is also possible to perform the correction of $\Delta V$ by using adjustment of the current mirror ratio in the current source ISc in combination in some cases. Specifically, for example, by making the size of each PMOS transistor in ISc smaller than that of each PMOS transistor in ISo, the bias current value for replica from ISc is made smaller than the bias current value for oscillation from ISo, thereby correspondingly reducing the above-described number (n) of transistors connected in parallel. In this case, since ISo and ISc are different in bias current value from each other, there is a possibility that the accuracy as the replica circuit is slightly lowered as compared with the case where both are made equal in bias current value, but reduction of the circuit area and reduction of power consumption can be realized.

<<Details of Comparator Circuit Block [2]>>

Figure 43:
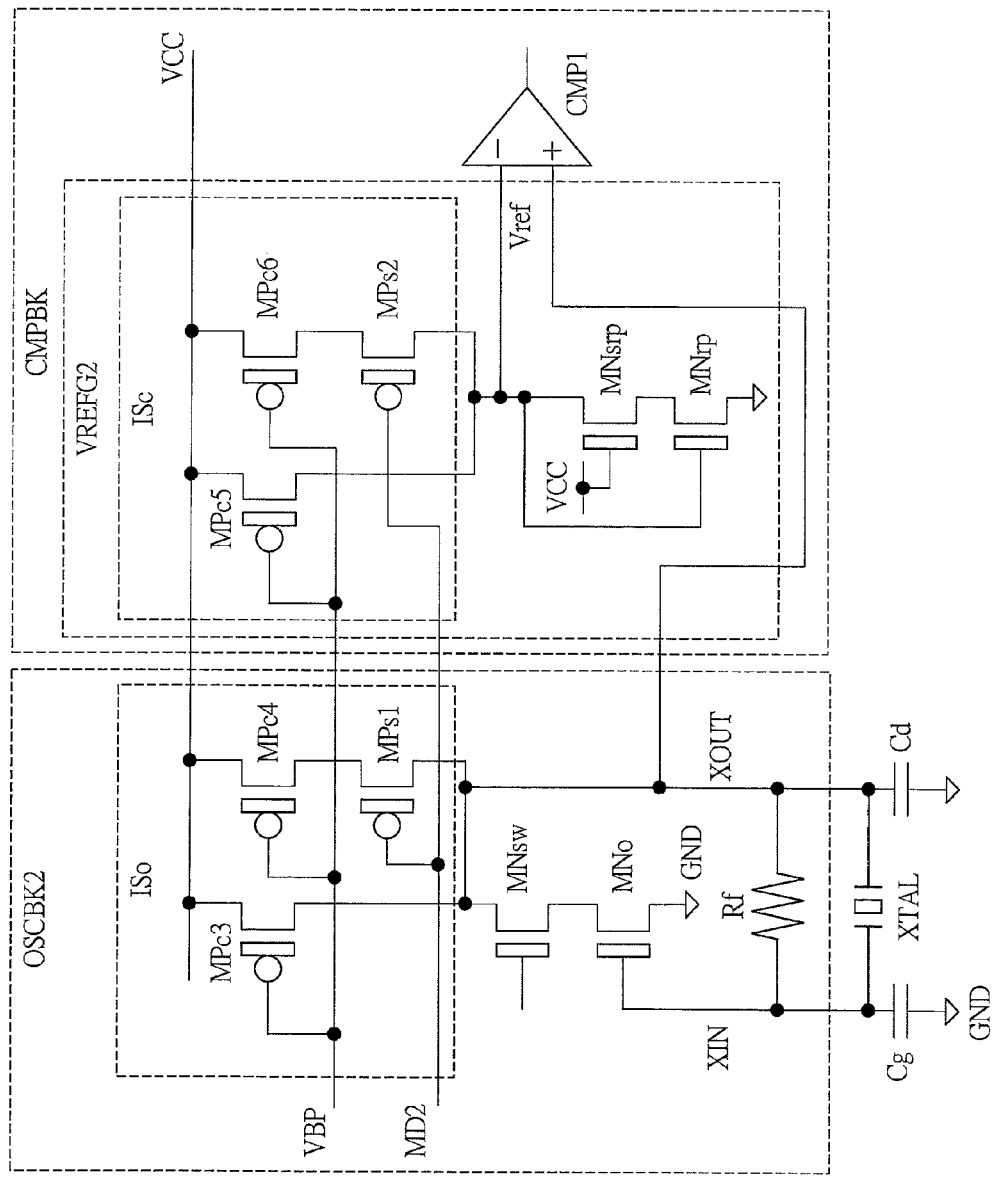
FIG. 43 is a circuit diagram showing a detailed configuration example of a portion of a comparator circuit block in the crystal oscillation device shown in FIG. 36.

FIG. 43 is a circuit diagram showing a detailed configuration example of a portion of a comparator circuit block CMPBK in the crystal oscillation device shown in FIG. 36. Compared with the configuration example shown in FIG. 41, a comparator circuit block CMPBK shown in FIG. 43 is different in that, in accordance with an NMOS transistor MNsw for a switch inserted into the oscillation circuit block OSCBK2, an NMOS transistor MNsrp to be a replica of the NMOS transistor MNsw for a switch is provided. MNsrp has a source-drain path connected between one end (drain of MPc5) of the current source ISc and the drain of MNrp, and is fixed to an ON state by applying VCC to the gate thereof. A comparison voltage Vref is generated from the one end of the current source ISc. By this means, it becomes possible to replicate the configuration of the oscillation circuit block OSCBK2 with a high accuracy.

<<Details of Comparator Circuit [1]>>

Figure 44A:
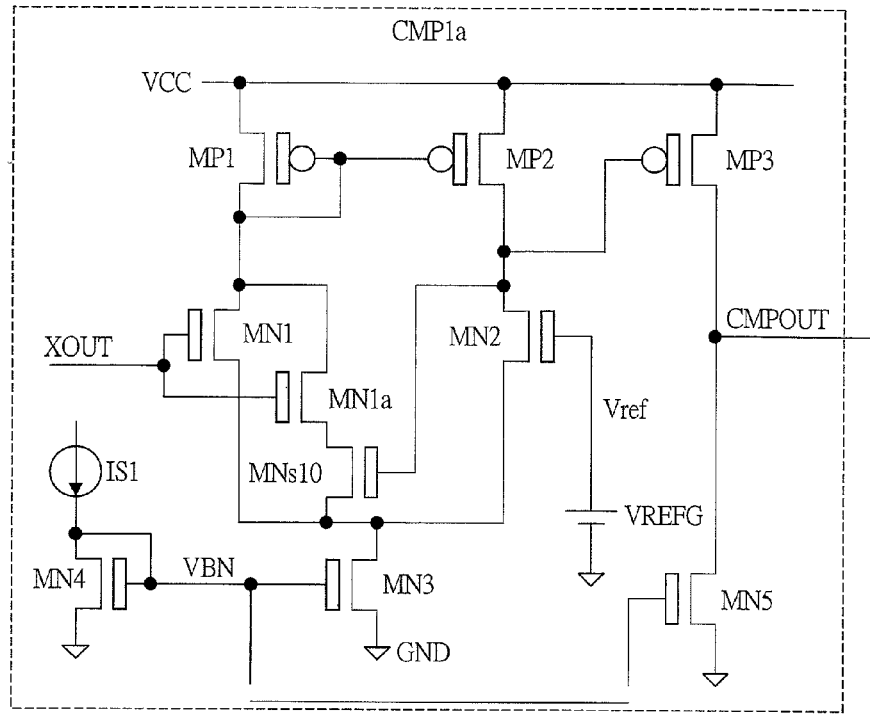
FIG. 44A is a circuit diagram showing a configuration example of the comparator circuit in the crystal oscillation device shown in FIG. 36.
Figure 44B:
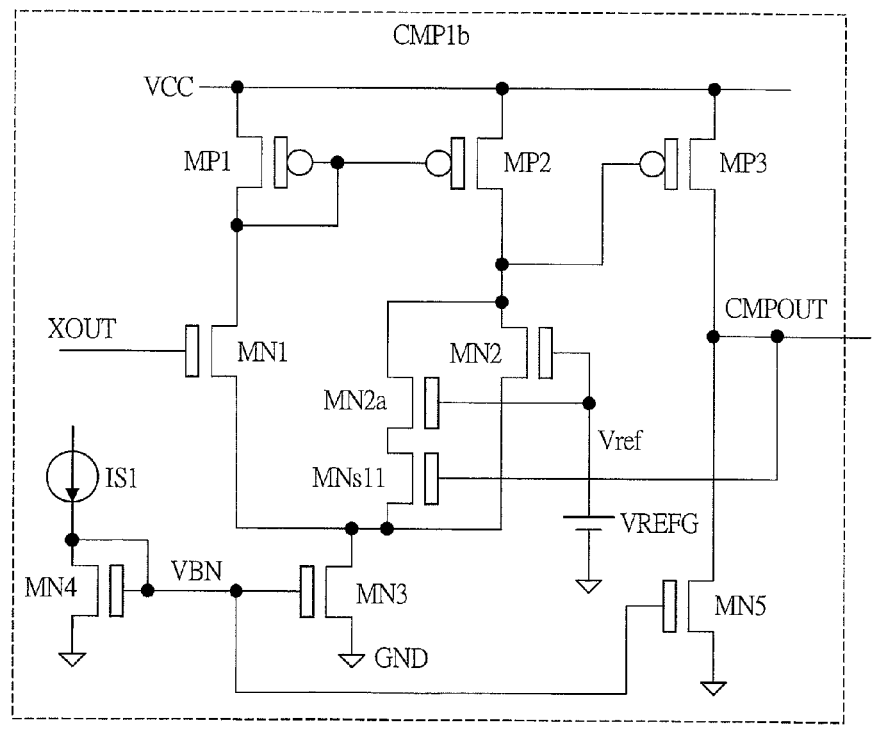
FIG. 44B is a circuit diagram showing another configuration example of the comparator circuit in the crystal oscillation device shown in FIG. 36.

FIGS. 44A and 44B are circuit diagrams showing different configuration examples of a comparator circuit CMP1 in the crystal oscillation device shown in FIG. 36. A comparator circuit CMP1a shown in FIG. 44A is provided with NMOS transistors MN1 to MN5, MN1a, and MNs10, PMOS transistors MP1 to MP3, and a current source IS1. MN1, MN2, MP1, MP2, and MN3 constitute a differential amplifying circuit including a differential pair made up of MN1 and MN2, a load current source for differential amplification made up of MP1 and MP2, and a tail current source made up of MN3. MP3 and MN5 constitute a source ground amplifying circuit having an output of the differential amplifying circuit as an input and including MP3 as an amplifying element and MN5 as a load current source for amplification. MN4 has the source connected to GND and a diode connection (common connection of the gate and the source), and a current from IS1 is supplied thereto from the drain side. Each of MN3 and MN5 constitutes a current mirror circuit together with MN4. MN1 has the source connected to the drain of MN3 and the drain connected to the drain of MP1, and the oscillation output signal XOUT is applied to the gate thereof. MN2 has the source connected to the drain of MN3 and the drain connected to the drain of MP2, and the comparison voltage Vref is applied to the gate thereof from the above-described comparison voltage generating circuit VREFG. The sources of MP1 and MP2 are connected to VCC and the gates thereof are mutually connected to each other. MP1 has a diode connection. MP3 has the source connected to VCC, the drain connected to the drain of MN5, and the gate connected to the drain of MP2 (MN2). With the configuration described above, a determination output signal CMPOUT from the drain of MP3 (MN5) serves as a clock signal having the voltage amplitude of VCC level.

Here, as the ninth feature, the comparator circuit has a hysteresis characteristic, and the characteristic is realized by using MN1a and MNs10 in the case shown in FIG. 44A. MN1a has the gate and drain commonly connected to the gate and the drain of MN1, and the source connected to the drain of MNs10. MNs10 has the source connected to the drain of MN3 and the gate connected to the drain of MP2 (MN2). When XOUT makes transition from 'H' level to 'L' level on the basis of Vref, since the state of MNs10 is in the ON side due to 'H' level of MN2 (MP2) in an initial state, the XOUT side of the differential pair is driven by MN1a in addition to MN1. As a result, it becomes easy for XOUT to make transition to 'L' level. On the contrary, when XOUT makes transition from 'L' level to 'H' level on the basis of Vref, since the state of MNs10 is in the OFF side due to 'L' level of MN2 (MP2) in an initial state, it becomes relatively difficult for XOUT to make transition to 'H' level. By this means, the hysteresis characteristic can be realized.

On the other hand, in the configuration example shown in FIG. 44B, NMOS transistors MN2a and MNs11 are provided instead of MN1a and MNs10 shown in FIG. 44A. MN2a has the gate and the drain commonly connected to the gate and the drain of MN2 and the source connected to the drain of MNs11. MNs11 has the source connected to the drain of MN3 and the gate connected to the drain (CMPOUT) of MP3 (MN5). In this case, when XOUT makes transition from 'L' level to 'H' level on the basis of Vref, since the state of MNs11 is in the ON side due to 'H' level of CMPOUT in an initial state, Vref side of the differential pair is driven by MN2a in addition to MN2. As a result, it becomes difficult for XOUT to make transition to 'H' level, and on the contrary, it becomes easy for XOUT to make transition to 'L' level side.

By making the comparator circuit have the hysteresis characteristic in this manner, fine noise components which may be superimposed on the XOUT can be eliminated and propagation of the noise to latter stages can be prevented. More specifically, improvement in noise tolerance can be realized. Further, in FIGS. 44A and 44B, as the tenth feature, for example, the response speed of the comparator circuit is set to be low by adjusting a current value of MN3 to be the tail current source or the like, thereby realizing a low-pass filter function. For example, the current value is adjusted so as not to respond to XOUT with MHz order. Also by this means, improvement in noise tolerance can be realized.

<<Details of Comparator Circuit Block [3]>>

Figure 45A:
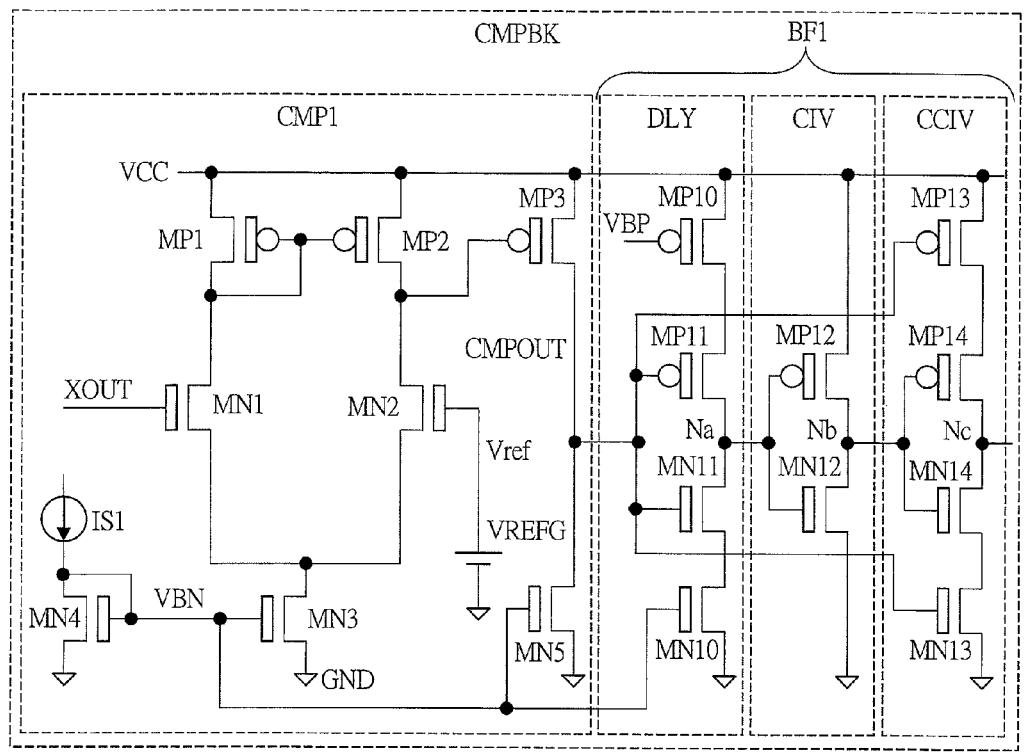
FIG. 45A is a circuit diagram showing a detailed configuration example of another portion of the comparator circuit block in the crystal oscillation device shown in FIG. 36.
Figure 45B:
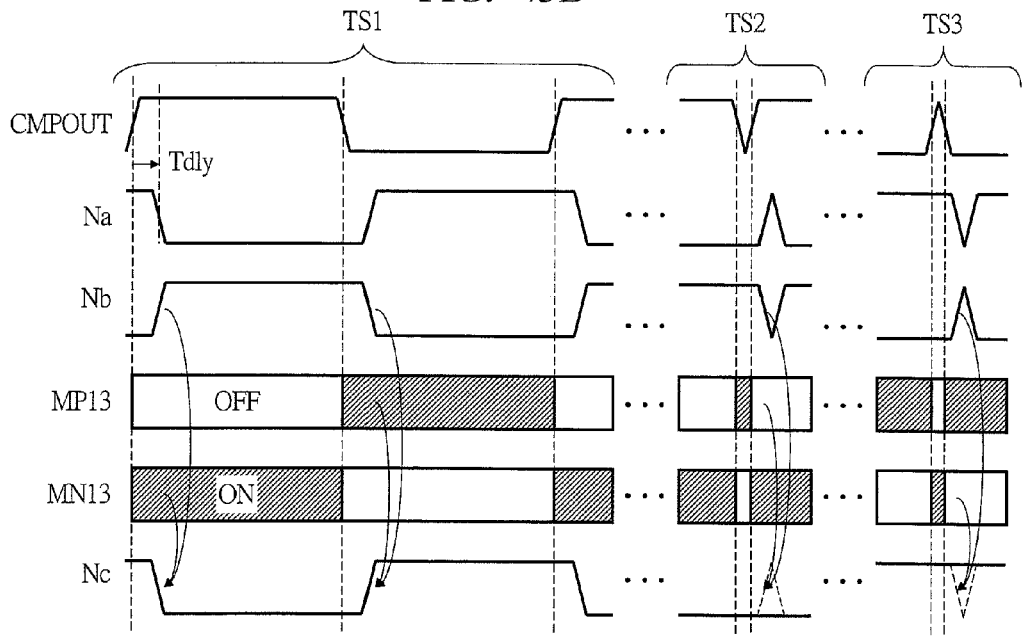
FIG. 45B is an explanatory diagram showing a schematic operation example of the portion shown in FIG. 45A.

FIG. 45A is a circuit diagram showing a detailed configuration example of another portion of the comparator circuit block CMPBK in the crystal oscillation device shown in FIG. 36. FIG. 45B is an explanatory diagram showing a schematic operation example of the comparator circuit block shown in FIG. 45A. A comparator circuit block CMPBK shown in FIG. 45A is provided with a buffer circuit BF1 in a latter stage of the comparator circuit CMP1 shown in FIG. 44 (however, hysteresis portion (MN1a, MNs10, and the like) is omitted). BF1 is provided with a delay circuit DLY which has the determination output signal CMPOUT of CMP1 as an input to perform delay operation, a CMOS inverter circuit CIV which receives an output of the delay circuit to perform inverting operation, and a CMOS inverter circuit CCIV with a control switch which receives an output of the CMOS inverter circuit to perform inverting operation.

DLY is provided with PMOS transistors MP10 and MP11 and NMOS transistors MN10 and MN11. MP11 and MN11 constitute a CMOS inverter circuit which has CMPOUT as an input and a node Na as an output. MP10 has the source connected to VCC and the drain connected to the source of MP11, and a bias voltage VBP is applied to the gate thereof. MN10 has the source connected to GND and the drain connected to the source of MN11, and a bias voltage VBN is applied to the gate thereof. VBP is generated by, for example, MPc1 (MPc2) in the reference current generating circuit shown in FIG. 38A, and VBN is generated by, for example, MN4 in the comparator circuit CMP1. By reducing current values (transistor sizes) of MP10 and MN10 functioning as current sources, the delay circuit can be realized.

CIV is provided with a PMOS transistor MP12 whose source is connected to VCC and an NMOS transistor MN12 whose source is connected to GND. MP12 and MN12 have the gates connected to the node Na and perform inverting output to a drain node Nb. CCIV is provided with PMOS transistors MP13 and MP14 and NMOS transistors MN13 and MN1. MP14 and MN14 constitute a CMOS inverter circuit having the node Nb as an input and a node Nc as an output. MP13 has the source connected to VCC and the drain connected to the source of MP14, and CMPOUT is applied to the gate thereof. MN13 has the source connected to GND and the drain connected to the source of MN14, and CMPOUT is applied to the gate thereof. MP13 and MN13 function as control switches.

In the configuration described above, when an 'L' glitch with a pulse width narrower than that of a delay time (Tdly) of DLY occurs in CMPOUT as shown in a timing cycle TS2 in FIG. 45B, since the control switch (MP13) for causing the glitch to pass in CCIV is not turned ON, the glitch is not propagated to the node Nc. Similarly, when an 'H' glitch with a pulse width narrower than that of Tdly occurs as shown in a timing cycle TS3, since the control switch (MN13) for causing the glitch to pass in CCIV is not turned ON, the glitch is not propagated to the node Nc. On the other hand, as shown in a timing cycle TS1, a normal clock signal outputted to CMPOUT is properly propagated to the node Nc since the control switch in CCIV is appropriately driven to ON.

As described above, as the eleventh feature, the comparator circuit block CMPB shown in FIG. 45A realizes a glitch (noise) removing function by using the buffer circuit BF1. By this means, improvement in noise tolerance can be realized.

Incidentally, since high-frequency noise can be removed by the buffer circuit BF1 here, it is possible to omit the low-pass filter function of the comparator circuit CMP1 described in the tenth feature.

<<Details Around Reference Current Generating Circuit>>

Figure 46A:
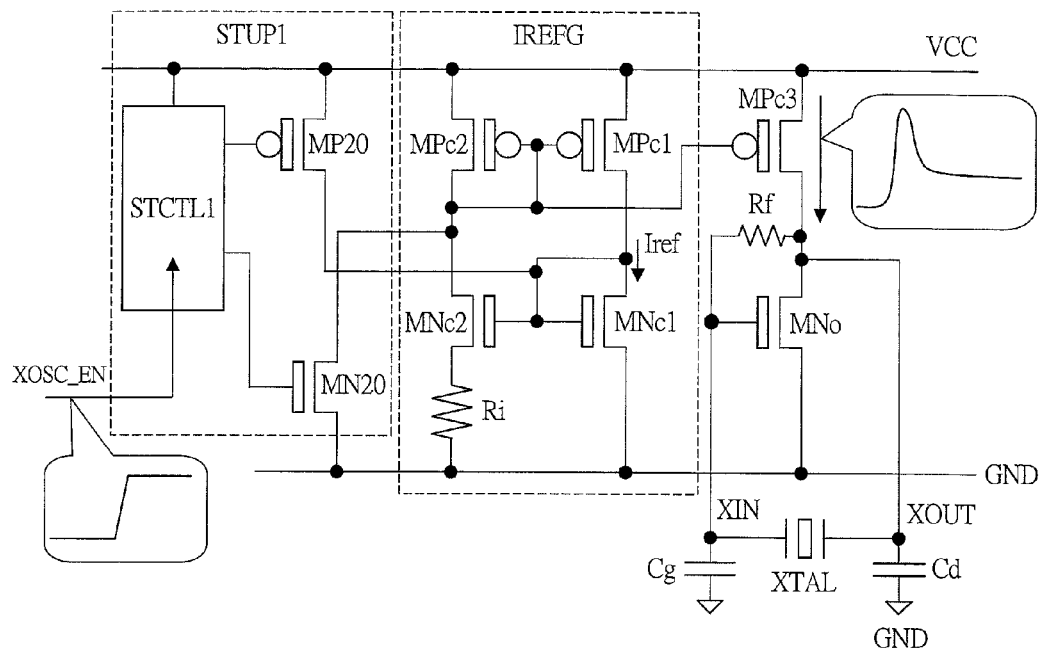
Figure 46B:
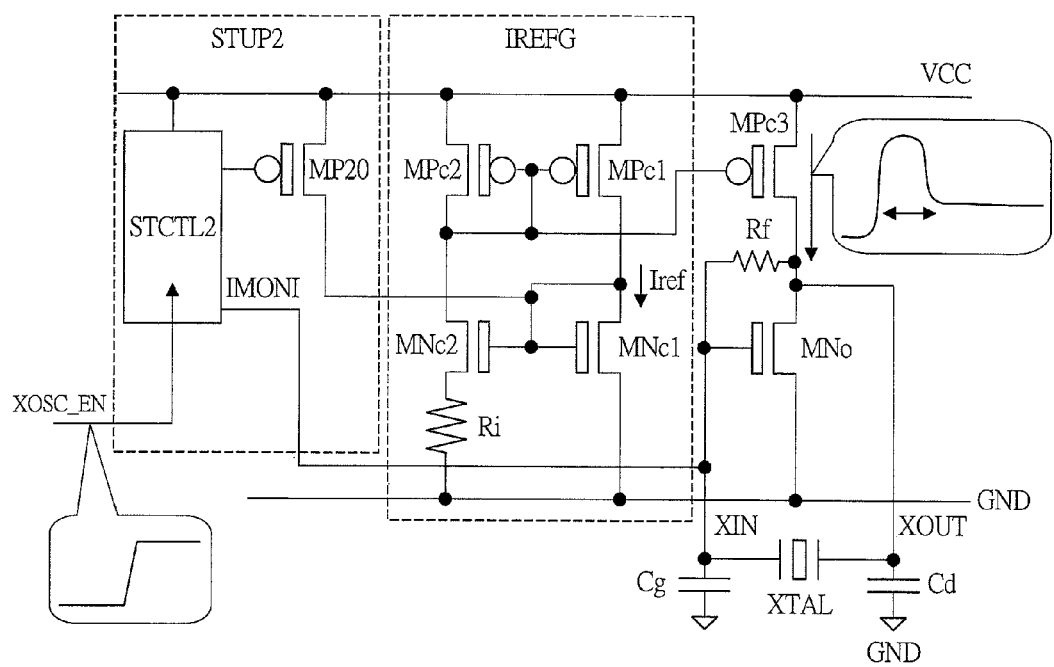

FIGS. 46A and 46B are circuit diagrams showing different detailed configuration examples around a reference current generating circuit IREFG in the control circuit block CTLBK shown in FIG. 34 and others. FIG. 46A shows a configuration example where a startup circuit STUP1 is added to the reference current generating circuit IREFG shown in FIGS. 38A and 38B. STUP1 is provided with an activation control circuit STCTL1, a PMOS transistor MP20, and an NMOS transistor MN20. MP20 has the source connected to VCC and the drain connected to the gates of the NMOS transistors MNc1 and MNc2 in IREFG, and the gate thereof is controlled by STCTL1. MN 20 has the source connected to GND and the drain connected to the gates of the PMOS transistors MPc1 and MPc2 in IREFG, and the gate thereof is controlled by STCTL1.

STCTL1 receives an oscillation enable signal XOSC_EN serving as an activation signal for the crystal oscillation device and outputs an 'L' pulse with a predetermined pulse width to the gate of MP20 and an 'H' pulse with a predetermined pulse width to the gate of MN20, respectively. By this means, gate-source voltages of MNc1, MNc2, MPc1 and MPc2 in IREFG increase, respectively, and a value of the reference current Iref temporarily increases during a period of this pulse width. Though not particularly limited, for example, when it is assumed that Iref at a normal time is 10 nA or the like, Iref at the time of activation has a current value of about 10 times Iref at the normal time. Accordingly, a large bias current is outputted also from the current source (PMOS transistor MPc3) in the oscillation circuit block at the time of activation.

On the other hand, FIG. 46B shows a configuration example where a startup circuit STUP2 is added to IREFG shown in FIGS. 38A and 38B. STUP2 is provided with an activation control circuit STCTL2 and a PMOS transistor MP20. MP20 has the source connected to VCC and the drain connected to the gates of MNc1 and MNc2 in IREFG, and the gate thereof is controlled by STCTL2. STCTL2 receives XOSC_EN and drives the gate of MP20 to an 'L' level. By this means, gate-source voltages of MNc1 and MNc2 in IREFG increase, a value of reference current Iref temporarily increases, and a large bias current is correspondingly outputted also from the current source (MPc3) in the oscillation circuit block. Further, STCTL2 monitors the gate voltage of the oscillation NMOS transistor MNo in the oscillation circuit block, and it drives MP20 to OFF by returning the gate of MP20 from the 'L' level to the 'H' level when the gate voltage reaches a predetermined value.

As described above, as the twelfth feature, in the configuration examples shown in FIGS. 46A and 46B, a large bias current is caused to flow temporarily in the oscillation circuit block by using the startup circuit at the time of oscillation activation. At the time of oscillation activation, the external load capacitors (Cg, Cd) are charged, and after the voltage level of the XIN node reaches an operating point, growth of fine oscillation starts. Therefore, especially when a low CL value-adapted quartz crystal unit XTAL is used (namely, the bias current is small), it takes time to charge the load capacitors (Cg, Cd), and there is a possibility that the oscillation activation time (time required from when XOSC_EN is inputted to when an oscillation operation reaches a stable state) is, for example, 2 seconds or more. Therefore, by using the twelfth feature, a charging rate of the load capacitors (Cg, Cd) at the time of oscillation activation can be made fast and the oscillation activation time can be shortened to, for example, about 1 second.

<<Schematic Layout Around Oscillation Circuit Block>>

Figure 47A:
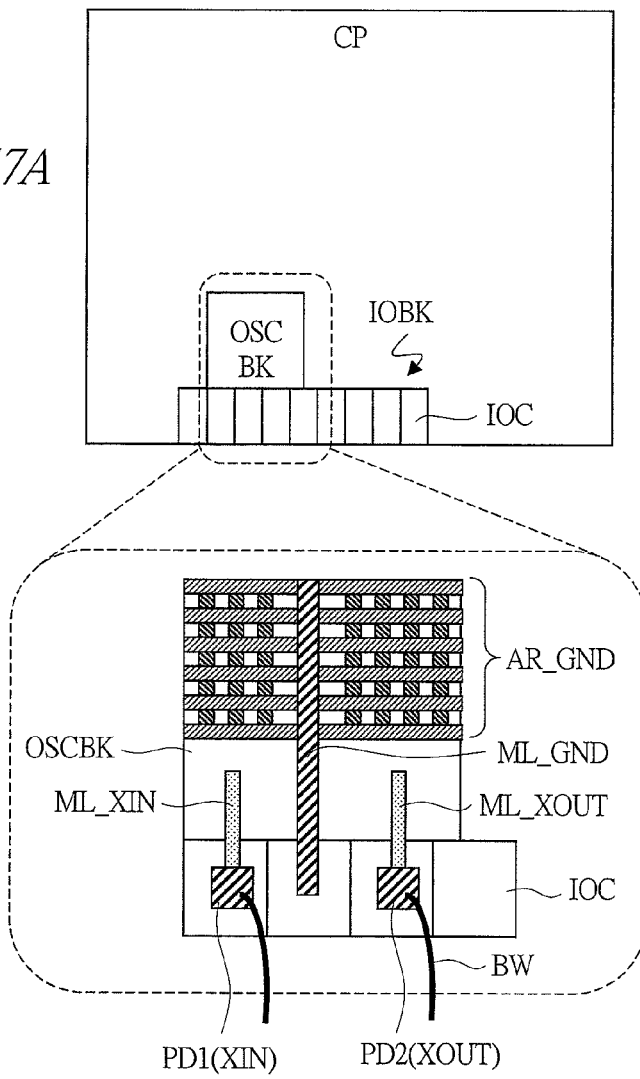
FIG. 47A is a schematic diagram showing a layout configuration example around an oscillation circuit block in the crystal oscillation device shown in FIG. 34.
Figure 47B:
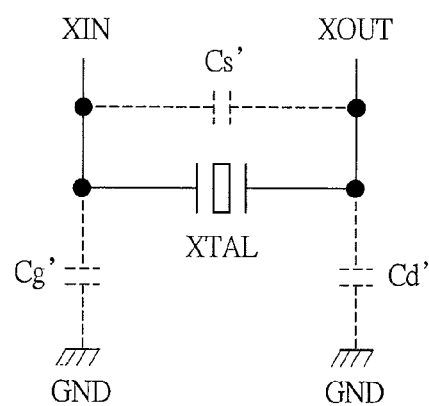
FIG. 47B is a supplemental diagram for describing an effect of the layout configuration example shown in FIG. 47A.

FIG. 47A is a schematic diagram showing a layout configuration example around the oscillation circuit block in the crystal oscillation device shown in FIG. 34. FIG. 47B is a supplementary diagram for describing an effect of the layout configuration example shown in FIG. 47A. In FIG. 47A, an IO cell region IOBK is arranged on one side of a semiconductor chip CP, and an oscillation circuit block OSCBK is arranged near IOBK in an inward direction of the chip. IOBK is provided with a plurality of IO cells IOC sequentially arranged adjacent to one another along one side of CP. In three cells IOC adjacent to one another in the plurality of cells IOC, a pad PD1 for XIN is formed in one of IO cells IOC positioned on both ends, and a pad PD2 for XOUT is formed in the other of IO cells IOC.

The pads PM and PD2 are connected via bonding wires BW to predetermined terminals on a printed circuit board (not shown) on which a semiconductor chip CP, capacitors Cd and Cd, a quartz crystal unit XTAL, and others are mounted. PD1 and PD2 are formed by using, for example, the metal wiring layer in the uppermost layer. PD1 is connected to a metal wiring ML_XIN formed of a first metal wiring layer positioned in a lower layer thereof, and PD2 is similarly connected to a metal wiring ML_XOUT formed of the first metal wiring layer. ML_XIN and ML_XOUT extend toward OSCBK arranged in an inward direction of the chip, respectively.

Further, on the cell IOC positioned at the center of three cells IOC adjacent to one another, a metal wiring ML_GND for GND is formed using, for example, the metal wiring layer in the uppermost layer. In an arrangement region of OSCBK, a ground power source voltage supply region AR_GND made up of a plurality of ground power source voltage wirings formed in, for example, a net-like shape is provided in order to supply a stable ground power source voltage (GND) to OSCBK. The net-like ground power source voltage wiring is formed of, for example, a second metal wiring layer and a third metal wiring layer positioned between the first metal wiring layer and the metal wiring layer in the uppermost layer. ML_GND extends toward the AR_GND and it is connected to the ground power source voltage wire thereat.

As described above, as a thirteenth feature, in the layout configuration example shown in FIG. 47A, the GND node is arranged between the XIN node and the XOUT node. Here, when focusing attention on the parasitic capacitance, a parasitic capacitance Cs' between pins between the XIN node and the XOUT node, a parasitic capacitance Cg' between the XIN node and the GND node, and a parasitic capacitance Cd' between the XOUT node and the GND node exist in the XIN node and in the XOUT node as shown in FIG. 47B. These parasitic capacitances are desirably designed as small as possible because influence on a load capacitance (CL) becomes larger particularly as the CL value becomes smaller.

In such circumstances, as understood from FIG. 47B, the capacitance value of Cs' as it is influences CL (namely, equivalent capacitance value viewed from XTAL), but regarding Cg' and Cd', a combined capacitance value of series connection thereof influences CL. Therefore, relatively, reduction of the capacitance value of Cs' is more beneficial in the reduction of the parasitic capacitance than reduction of the capacitance values of Cg' and Cd'. Therefore, as shown in FIG. 47A, when the GND node is arranged between the XIN node and the XOUT node, although the capacitance values of Cg' and Cd' increase, Cs' can be ideally made zero, so that the parasitic capacitance can be reduced as a whole. As understood from Equation (3) and Equation (4), reduction of the parasitic capacitance leads to improvement in oscillation margin. Further, when the GND node is arranged between the XIN node and the XOUT node, since capacitance coupling between the XIN node and the XOUT node where oscillation signals having phases opposite to each other are generated can be reduced by shield effect, improvement in noise tolerance can be realized.

<<Detailed Circuit Configuration of Whole Crystal Oscillation Device [1]>>

Figure 48:
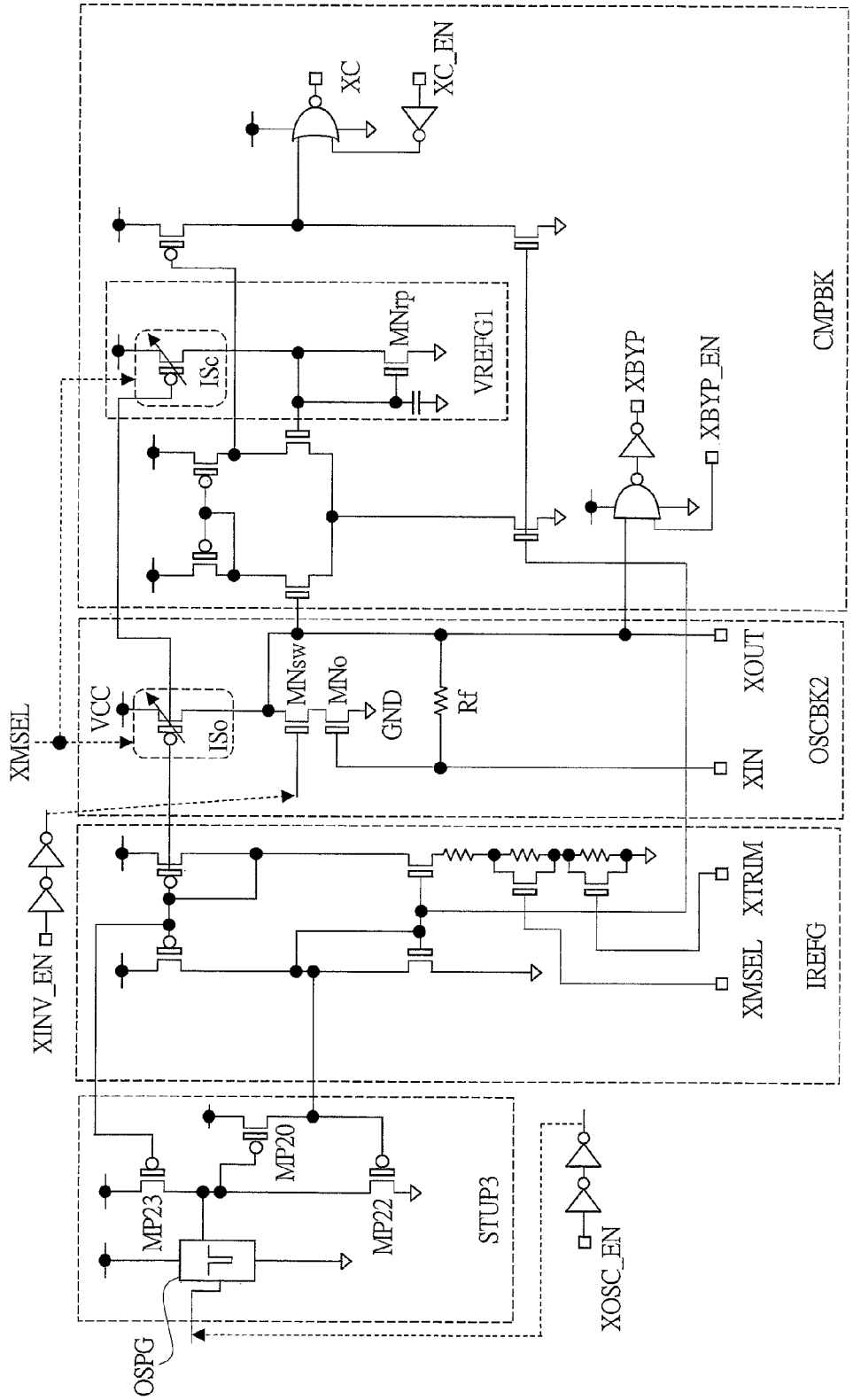
FIG. 48 is a circuit diagram showing a detailed configuration example of a whole crystal oscillation device according to an embodiment of the present invention.

FIG. 48 is a circuit diagram showing a detailed configuration example of a whole crystal oscillation device according to an embodiment of the present invention. A crystal oscillation device shown in FIG. 48 has a configuration example where various features described above are properly combined and some of them are properly modified. The crystal oscillation device shown in FIG. 48 is provided with a startup circuit STUP3 obtained by slightly modifying the configuration example shown in FIG. 46 in addition to the reference current generating circuit IREFG described in FIG. 38 and others, the oscillation circuit block OSCBK2 described in FIG. 36 and others, and a comparator circuit block CMPBK having the comparison voltage generating circuit VREFG1 described in FIG. 41. More specifically, the above-described first to seventh, tenth, and twelfth features are combined in this configuration example. By using the configuration example like this, for example, a crystal oscillation device whose consumption current is 0.5 µA or less (T=25° C., VCC=3.0 V) can be realized.

In the configuration of IREFG here, three resistors for current value setting are connected in series, and validity/invalidity of two resistors thereof is controlled based on the mode-selecting signal XMSEL and the trimming signal XTRIM. Further, the startup circuit STUP3 is here made up of PMOS transistors PM20, MP22 and MP23, and a one-shot pulse generating circuit OSPG. In order to prevent the case where the circuit of IREFG is stabilized in a state where no current flows (deadlocked) at the time of oscillation activation, a current is caused to flow into IREFG by temporarily inputting a pulse signal with an 'L' level into the gate of MP20 by OSPG at the time of inputting an activation signal XOSC_EN to cause MP20 to turn ON, thereby stabilizing the circuit of IREFG in a state where current is flowing. However, when only such a method is adopted, if the current is stopped during operation, the circuit remains in a deadlocked state until the next activation signal comes. Therefore, PMOS for monitoring MP23 and MP22 is used. In a deadlocked state of IREFG, the gate of MP23 should be at 'H' and the gate of MP22 should be at 'L', and since the gate of MP20 is at 'L', a current is applied and starts flowing in IREFG. When the current starts flowing (when a stable operation state is achieved), the gate potential of MP23 lowers and the gate potential of MP22 rises, so that MP20 can be disregarded because it is put in an almost OFF state.

<<Detailed Circuit Configuration of Whole Crystal Oscillation Device [2]>>

Figure 49:
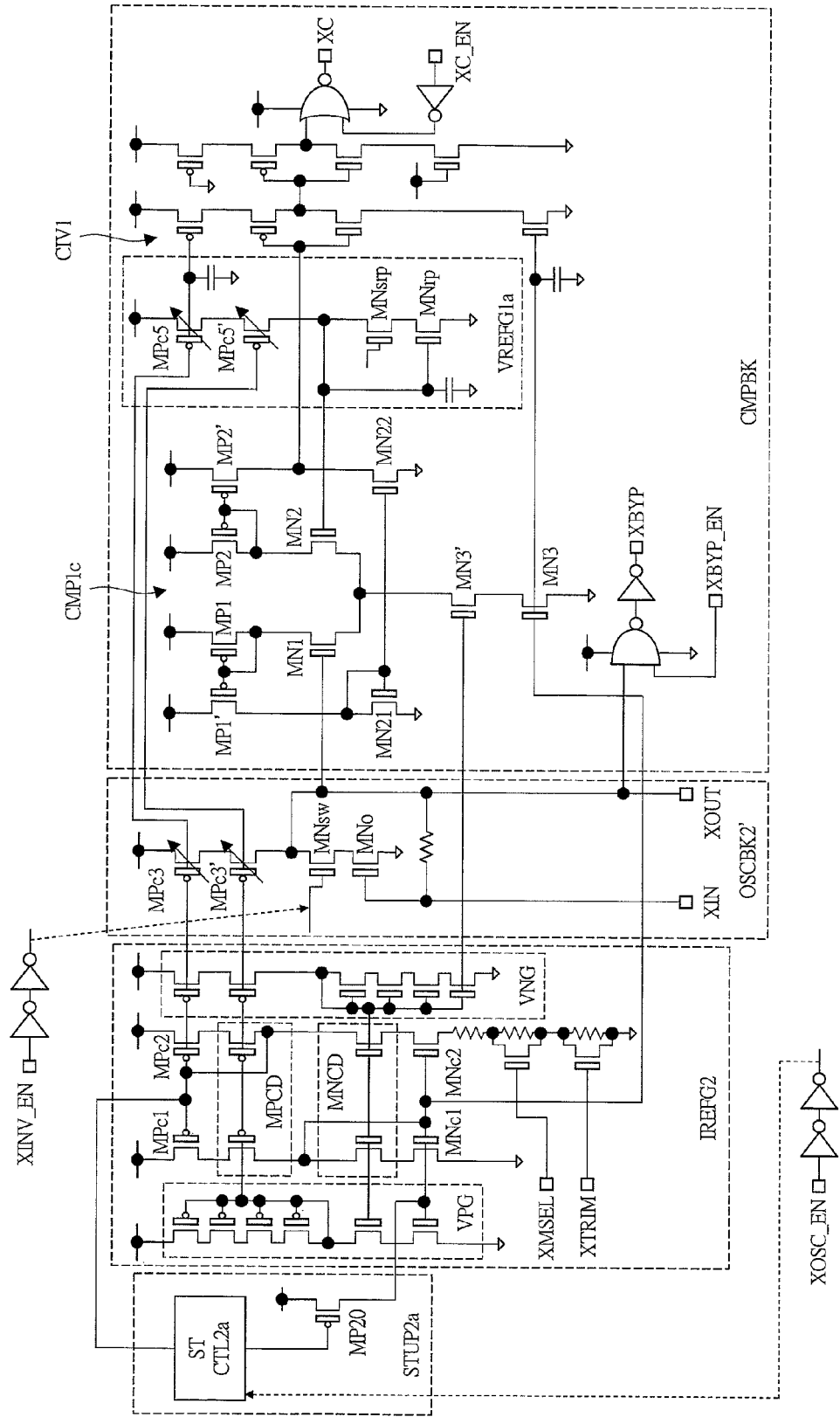
FIG. 49 is a circuit diagram showing a modified example of the configuration example shown in FIG. 48 in a crystal oscillation device according to an embodiment of the present invention.

FIG. 49 is a circuit diagram showing a modified example of the configuration example shown in FIG. 48 in a crystal oscillation device according to an embodiment of the present invention. Compared with the configuration example shown in FIG. 48, a crystal oscillation device shown in FIG. 49 is mainly different in the following points. First of all, in the reference current generating circuit IREFG2, a PMOS cascode stage MPCD is inserted into the side of PMOS transistors MPc1 and MPc2 of the PTAT circuit, and an NMOS cascode stage MNCD is inserted into the side of NMOS transistors MNc1 and MNc2 of the PTAT circuit. A gate voltage slightly lower than the gate voltage of MPc1 and MPc2 is applied to the gates of two PMOS transistors constituting MPCD by using a voltage generating circuit VPG. A gate voltage slightly higher than the gate voltages of MNc1 and MNc2 is applied to the gates of two NMOS transistors constituting MNCD by using a voltage generating circuit VNG.

Similarly, in an oscillation circuit block OSCBK2', a PMOS transistor MPc3' to be a cascode stage is added to a PMOS transistor MPc3 serving as a current source. Correspondingly, a PMOS transistor MPc5' to be a cascode stage is added to a PMOS transistor MPc5 serving as a current source also in the comparison voltage generating circuit VREFG1a in the comparator circuit block CMPBK. Furthermore, an NMOS transistor MN3' to be a cascade stage is added to MN3 serving as a tail current source also in the comparator circuit CMP1c in CMPBK. The gate voltages of MPc3' and MPc5' are applied by above-described VPG, and the gate voltage of MN3' is applied by the above-described VNG. By providing the cascade stages like these, an operation range on the high potential side in the power source voltage VCC can be expanded as compared with the configuration example shown in FIG. 48. Specifically, for example, it becomes possible to adapt to VCC=5.5 V or the like.

Further, in CMPBK, the comparator circuit CMP1c serves as a push-pull type comparator circuit which complementarily feeds each of differential outputs caused from a differential pair to an output stage. A current signal generated on the side of MN1 is fed to a PMOS transistor MP1' constituting a current mirror circuit with MP1 via MP1, and this current is reflexed by a current mirror circuit made up of the NMOS transistors MN21 and MN22 and is then transferred to MN22. On the other hand, a current signal generated on the side of MN2 is fed to a PMOS transistor MP2' constituting a current mirror circuit with MP2 via MP2, and the current signal of MP2' and the current signal of MN22 are combined at a common connection node, so that a determination output signal of CMP1c is obtained. By using the push-pull type comparator circuit like this, a rising time and a falling time of the determination output signal can be made equal to each other.

Further, in CMPBK, a CMOS inverter circuit CIV1 is provided at a latter stage of CMP1c. In CIV1, current sources are respectively inserted on the VCC side of the PMOS transistor and on the GND side of the NMOS transistor in order to suppress a through current and reduce power consumption. Further, in the startup circuit STUP2a, a configuration example similar to the above-described configuration example shown in FIG. 46B is used here. However, the PMOS transistor MP20 is controlled to OFF based on the monitoring result of the gate voltages of MPc1 and MPc2 in IREFG2.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, regarding the above-described various features (first to thirteenth features), it is of course possible to apply one of them or use them in a proper combination as necessary. Even when any of the features is used, it is possible to contribute to reduction of power consumption in the crystal oscillation device directly or indirectly. Further, an oscillation circuit obtained by a quartz crystal unit used generally has been mainly described, but it is also possible to constitute an oscillation circuit according to the present invention from an oscillator, for example, an MEMS oscillator instead of the quartz crystal unit.

The crystal oscillation device according to the present embodiment can be widely applied to various systems provided with a crystal oscillation circuit typified by a microcomputer or the like.

What is claimed is:

1. A crystal oscillation device, comprising:
    a semiconductor package mounted with a semiconductor chip and including first, second and third external terminals;
    a quartz crystal unit; and
    a printed circuit board on which the semiconductor package and the quartz crystal unit are mounted,
    wherein an inverting logic circuit having the first external terminal as an input and the second external terminal as an output is formed on the semiconductor chip,
    wherein the printed circuit board has formed thereon a first wiring pattern which is formed using a first wiring layer, extends from the first external terminal, and is bonded to one end of the quartz crystal unit,
    wherein the printed circuit board has formed thereon a second wiring pattern which is formed using the first wiring layer, extends from the second external terminal approximately in parallel with the first wiring pattern, and is bonded to the other end of the quartz crystal unit,
    wherein the printed circuit board has formed thereon a third wiring pattern which is formed using the first wiring layer, arranged in a region between the first wiring pattern and the second wiring pattern, and electrically connected to a ground power source voltage of the inverting logic circuit, and
    wherein the third external terminal is arranged between the first external terminal and the second external terminal adjacent thereto, serves as a terminal for ground power source voltage of the inverting logic circuit, and is connected to the third wiring pattern.

2. The crystal oscillation device according to claim 1,
    wherein first and second capacitors are further mounted on the printed circuit board,
    the first capacitor has one end connected to the first wiring pattern and the other end connected to the third wiring pattern, and
    the second capacitor has one end connected to the second wiring pattern and the other end connected to the third wiring pattern.

3. The crystal oscillation device according to claim 1,
    wherein the semiconductor package is further provided with a fourth external terminal arranged adjacent to the first external terminal on a side facing the third external terminal and serving as a terminal for power source voltage of the inverting logic circuit.

4. The crystal oscillation device according to claim 1,
    wherein the printed circuit board further has formed thereon a fourth wiring pattern arranged so as to enclose a formation region of the first, second and third wiring patterns and electrically connected to a ground power source voltage of the inverting logic circuit.

5. The crystal oscillation device according to claim 4,
    wherein the printed circuit board further has formed thereon a fifth wiring pattern arranged in a planar shape by using an N-th wiring layer which is a layer different from the first wiring layer and is disposed with interposing single or plural dielectric layers therebetween, the fifth wiring pattern having a portion facing the first, second, third, and fourth wiring patterns with interposing the single or plural dielectric layers therebetween and being electrically connected to a ground power source voltage of the inverting logic circuit.

6. The crystal oscillation device according to claim 1,
    wherein the printed circuit board further has formed thereon a sixth wiring pattern formed using the first wiring layer, arranged in a planar shape in a mounting portion of the semiconductor package, and electrically connected to a ground power source voltage of the inverting logic circuit.

7. The crystal oscillation device according to claim 6,
    wherein the first external terminal and the second external terminal are arranged adjacent to each other, and
    the third wiring pattern is connected to the sixth wiring pattern via a space between the first external terminal and the second external terminal.

8. The crystal oscillation device according to claim 6,
    wherein the printed circuit board further has formed thereon a fourth wiring pattern arranged so as to enclose a formation region of the first, second and third wiring patterns and electrically connected to a ground power source voltage of the inverting logic circuit, and
    a fifth wiring pattern arranged in a planar shape by using an N-th wiring layer which is a layer different from the first wiring layer and is disposed with interposing single or plural dielectric layers therebetween, the fifth wiring pattern having a portion facing the first, second, third, and fourth wiring patterns with interposing the single or plural dielectric layers therebetween and being electrically connected to a ground power source voltage of the inverting logic circuit, and
    the fourth wiring pattern is arranged so as to configure a loop in the first wiring layer between the same and the sixth wiring pattern.

9. The crystal oscillation device according to claim 1,
    wherein the quartz crystal unit is adapted to an oscillation frequency of less than 1 MHz.

10. A crystal oscillation device, comprising:
    a semiconductor package mounted with a semiconductor chip and including first and second external terminals;
    a quartz crystal unit; and
    a printed circuit board on which the semiconductor package and the quartz crystal unit are mounted,
    wherein an inverting logic circuit having the first external terminal as an input and the second external terminal as an output is formed on the semiconductor chip,
    wherein the printed circuit board has formed thereon a first wiring pattern which is formed using a first wiring layer, extends from the first external terminal, and is bonded to one end of the quartz crystal unit,
    wherein the printed circuit board has formed thereon a second wiring pattern which is formed using the first wiring layer, extends from the second external terminal approximately in parallel with the first wiring pattern, and is bonded to the other end of the quartz crystal unit,
    wherein the printed circuit board has formed thereon a third wiring pattern which is formed using the first wiring layer and electrically connected to a ground power source voltage of the inverting logic circuit,
    wherein the first wiring pattern comprises first, second, third and fourth rectangular portions,
    wherein the second wiring pattern comprises fifth, sixth, seventh and eighth rectangular portions,
    wherein the third wiring pattern comprises a ninth rectangular portion and a tenth rectangular portion having a width that is larger than a width of the ninth rectangular portion, wherein the ninth rectangular portion is arranged in a region between the first rectangular portion and the fifth rectangular portion, and wherein the tenth rectangular portion is surrounded by the second, third, fourth, sixth, seventh, and eighth rectangular portions.

11. The crystal oscillation device according to claim 10, wherein first and second capacitors are mounted on the printed circuit board, the first capacitor has one end connected to the third rectangular portion and the other end connected to the tenth rectangular portion, and the second capacitor has one end connected to the seventh rectangular portion and the other end connected to the tenth rectangular portion.

12. A system provided with the crystal oscillation device according to claim 1.

13. A system provided with the crystal oscillation device according to claim 9.

14. A system provided with the crystal oscillation device according to claim 10.

\* \* \* \* \*